US010424591B2

(12) United States Patent
Ogata

(10) Patent No.: US 10,424,591 B2
(45) Date of Patent: Sep. 24, 2019

(54) SEMICONDUCTOR DEVICE AND MANUFACTURING METHOD THEREOF

(71) Applicant: Renesas Electronics Corporation, Tokyo (JP)

(72) Inventor: Tamotsu Ogata, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/032,388

(22) Filed: Jul. 11, 2018

(65) Prior Publication Data
US 2019/0088670 A1 Mar. 21, 2019

(30) Foreign Application Priority Data

Sep. 19, 2017 (JP) .................... 2017-179011

(51) Int. Cl.
| H01L 21/762 | (2006.01) |
|---|---|
| H01L 27/11573 | (2017.01) |
| H01L 27/11526 | (2017.01) |
| H01L 29/423 | (2006.01) |
| H01L 21/02 | (2006.01) |
| H01L 23/532 | (2006.01) |
| H01L 21/768 | (2006.01) |
| H01L 27/118 | (2006.01) |
| H01L 21/8234 | (2006.01) |

(52) U.S. Cl.
CPC .... H01L 27/11573 (2013.01); H01L 21/0217 (2013.01); H01L 21/76832 (2013.01); H01L 23/5329 (2013.01); H01L 27/11526 (2013.01);
*H01L 29/42372* (2013.01); *H01L 21/76224* (2013.01); *H01L 21/823481* (2013.01); *H01L 2027/11831* (2013.01)

(58) Field of Classification Search
CPC ....... H01L 21/76224; H01L 21/823481; H01L 2027/11831
See application file for complete search history.

(56) References Cited

U.S. PATENT DOCUMENTS

| 6,255,218 B1 | 7/2001 | Kasai |
|---|---|---|
| 7,504,689 B2 | 3/2009 | Hisamoto et al. |
| 7,906,396 B1 * | 3/2011 | Chiang ............ H01L 27/11536 257/E21.209 |
| 8,951,869 B2 | 2/2015 | Tsukamoto et al. |
| 9,318,500 B2 | 4/2016 | Shinohara |

(Continued)

FOREIGN PATENT DOCUMENTS

| JP | 08-274166 A | 10/1996 |
|---|---|---|
| JP | 2000-100928 A | 4/2000 |

(Continued)

*Primary Examiner* — George R Fourson, III
(74) *Attorney, Agent, or Firm* — Mattingly & Malur, PC

(57) ABSTRACT

In a memory cell region of a semiconductor device, a memory active region is defined by an element isolation insulating film. In the memory cell region, the position of the upper surface of the element isolation insulating film is set to be lower than the position of the main surface of a semiconductor substrate. A buried silicon nitride film and an etching stopper film are formed over the element isolation insulating film. The position of the upper surface of the etching stopper film is higher than that of the upper surface of the element isolation insulating film defining a peripheral active region.

12 Claims, 96 Drawing Sheets

(56) References Cited

U.S. PATENT DOCUMENTS

| | | | |
|---|---|---|---|
| 9,349,654 B2* | 5/2016 | Li | H01L 21/823481 |
| 2007/0102731 A1* | 5/2007 | Sakagami | H01L 27/105 |
| | | | 257/207 |
| 2008/0048243 A1* | 2/2008 | Morikado | H01L 27/115 |
| | | | 257/316 |
| 2009/0102010 A1* | 4/2009 | Ema | H01L 21/76232 |
| | | | 257/506 |
| 2010/0006946 A1* | 1/2010 | Endo | H01L 21/76229 |
| | | | 257/368 |
| 2016/0099181 A1* | 4/2016 | Tung | H01L 21/823821 |
| | | | 257/369 |
| 2016/0148878 A1* | 5/2016 | Chen | H01L 21/76224 |
| | | | 257/368 |
| 2017/0330882 A1* | 11/2017 | Wang | H01L 27/10855 |
| 2018/0005870 A1* | 1/2018 | Hsu | H01L 21/823431 |
| 2018/0090508 A1* | 3/2018 | Ogata | H01L 27/11568 |

FOREIGN PATENT DOCUMENTS

| | | |
|---|---|---|
| JP | 2003-332424 A | 11/2003 |
| JP | 2006-041354 A | 2/2006 |
| JP | 2014-154789 A | 8/2014 |
| JP | 2014-154790 A | 8/2014 |

\* cited by examiner

SEMICONDUCTOR DEVICE AND MANUFACTURING METHOD THEREOF

CROSS-REFERENCE TO RELATED APPLICATIONS

The disclosure of Japanese Patent Application No. 2017-179011 filed on Sep. 19, 2017 including the specification, drawings and abstract is incorporated herein by reference in its entirety.

BACKGROUND

The present invention relates to a semiconductor device and a manufacturing method thereof, and can be suitably applied to a semiconductor device including, for example, a split gate type nonvolatile memory cell.

In a semiconductor device in which a nonvolatile memory is mounted, a memory cell region and a peripheral circuit region are defined in a semiconductor substrate. In the memory cell region, a memory cell is formed. In the peripheral circuit region, a predetermined semiconductor element including, for example, a MIS transistor (MISFET: Metal Insulator Semiconductor Field Effect Transistor) is formed.

A nonvolatile memory cell includes a split gate type memory cell to which a MONOS (Metal Oxide Nitride Oxide Semiconductor) film is applied. The memory cell is formed by two MIS transistors including a control transistor and a memory transistor. The control transistor has a control gate electrode. The memory transistor has a memory gate electrode. The memory gate electrode is formed over the side surface of the control gate electrode via an insulating film. The memory gate electrode is formed by leaving a conductive film in the form of a sidewall spacer.

The patent documents disclosing such a nonvolatile memory include, for example, Patent Documents 1 and 2. Patent Document 1 proposes a technique in which after a control gate electrode and a memory gate electrode are formed in a memory cell region, the gate electrode of a MIS transistor is formed in a peripheral circuit region. Patent Document 2 proposes a technique in which after a control gate electrode and a memory gate electrode are formed in a memory cell region and after the dummy gate electrode of a MIS transistor is formed in a peripheral circuit region, an original gate electrode is formed by removing the dummy gate electrode.

Semiconductor devices are generally shrunk according to the scaling thereof. In particular, in an MIS transistor, current driving force decreases when a channel width becomes small. In order to secure a channel width, Patent Document 3 proposes a technique in which an active region where a memory cell is to be formed is allowed to have a convex shape such that the side surface of the convex active region is used as a channel.

In particular, in a semiconductor device including a memory cell region and a peripheral circuit region, the effective channel width of each of a control transistor and a memory transistor is secured by lowering the height of an element isolation insulating film defining the memory cell region (memory active region) than that of an element isolation insulating film defining the peripheral circuit region (peripheral active region).

RELATED ART DOCUMENT

Patent Document

[Patent Document 1] Japanese Unexamined Patent Application Publication No. 2014-154789
[Patent Document 2] Japanese Unexamined Patent Application Publication No. 2014-154790
[Patent Document 3] Japanese Unexamined Patent Application Publication No. 2006-41354
[Patent Document 4] Japanese Unexamined Patent Application Publication No. 2003-332424
[Patent Document 5] Japanese Unexamined Patent Application Publication No. Hei 8(1996)-274166
[Patent Document 6] Japanese Unexamined Patent Application Publication No. 2000-100928

SUMMARY

In a semiconductor device, if a channel width is small, a margin for misalignment of a contact hole, for exposing an active region, with respect to the active region becomes small when the contact hole is formed, and hence the contact hole may be formed to straddle the active region and an element isolation insulating film. When the height of the element isolation insulating film is low, the portion of the contact hole formed over the element isolation insulating film is likely to be formed to a deeper position than the portion of the contact hole formed over the active region.

In this case, if the bottom of the portion of the contact hole formed over the element isolation insulating film is too close to a well region (region of a semiconductor substrate) formed in the active region, a plug formed in the contact hole and the well region (region of a semiconductor substrate) may be electrically short-circuited to each other, which may cause leakage current. In order to solve such a problem, various countermeasures have been proposed until now (Patent Documents 4, 5, and 6).

Other problems and new characteristics will become clear from the description and accompanying drawings of the present specification.

A semiconductor device according to one embodiment includes a semiconductor substrate having a main surface, a first active region, a second active region, a first transistor, a second transistor, a first etching stopper film, a second etching stopper film, an interlayer insulating film, a first plug, and a second plug. The first active region is formed in the semiconductor substrate and defined by a first element isolation insulating film. The second active region is formed in the semiconductor substrate and defined by a second element isolation insulating film. The first transistor is formed in the first active region. The second transistor is formed in the second active region. The first etching stopper film is formed to cover the first element isolation insulating film. The second etching stopper film is formed to cover the second element isolation insulating film. The interlayer insulating film is formed to cover the first and second etching stopper films. The first plug is formed to reach the first active region by penetrating the interlayer insulating film. The second plug is formed to reach the second active region by penetrating the interlayer insulating film. The first element isolation insulating film has a first upper surface. The second element isolation insulating film has a second upper surface. The first etching stopper film has a third upper surface. The first upper surface is lower than the main surface. The second upper surface is higher than the first upper surface. The third upper surface is higher than the second upper surface.

A manufacturing method of a semiconductor device according to another embodiment includes the following steps. A semiconductor substrate having a main surface is provided. A first active region is defined by forming a first element isolation insulating film having a first upper surface over the semiconductor substrate. A second active region is defined by forming a second element isolation insulating film having a second upper surface over the semiconductor substrate. The first upper surface of the first element isolation insulating film is retreated to a position lower than the main surface of the semiconductor substrate. A first transistor is formed in the first active region. A second transistor is formed in the second active region. A first etching stopper film, having a third upper surface located at a position higher than the second upper surface of the second element isolation insulating film, is formed to cover the first element isolation insulating film. A second etching stopper film is formed to cover the second element isolation insulating film. An interlayer insulating film is formed to cover the first and second etching stopper films. A first contact hole for exposing the first active region is formed in the interlayer insulating film, and a second contact hole for exposing the second active region is formed therein. A first plug is formed in the first contact hole, and a second plug is formed in the second contact hole.

According to the semiconductor device of the one embodiment, leakage current flowing from the first plug to the semiconductor substrate can be suppressed.

According to the manufacturing method of a semiconductor device of the another embodiment, a semiconductor device, in which leakage current flowing from the first plug to the semiconductor substrate is suppressed, can be manufactured.

DETAILED DESCRIPTION

Figure 1:
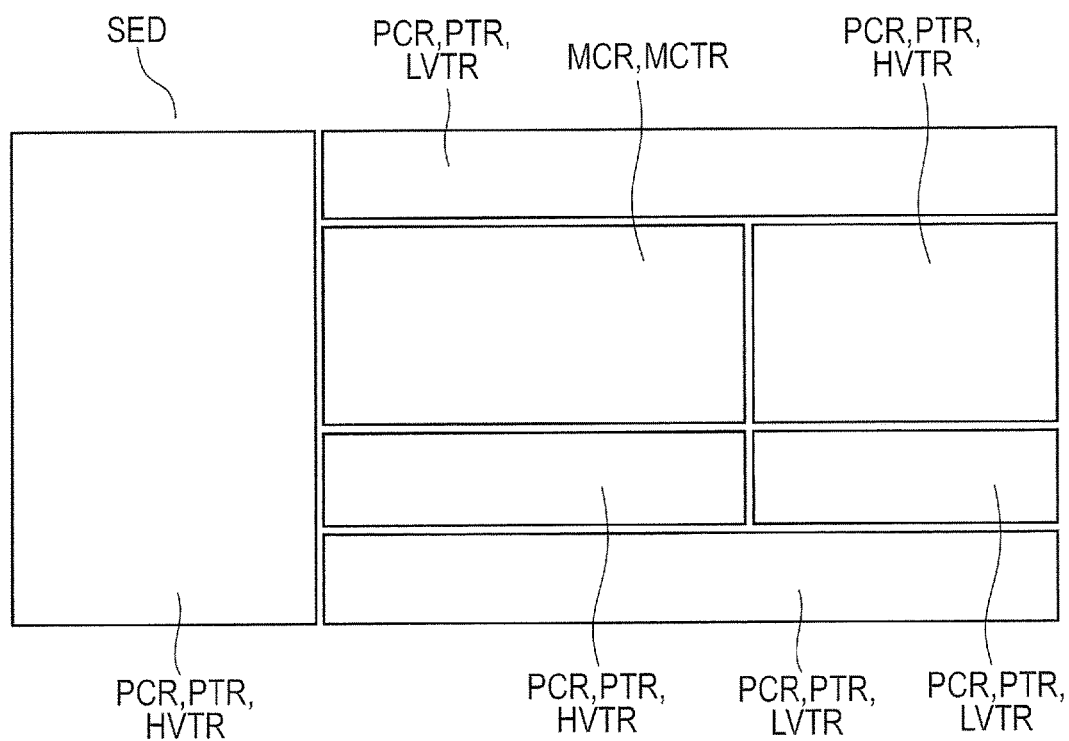
FIG. 1 is a view illustrating one example of a layout configuration of a semiconductor device according to each embodiment.

First, a layout configuration of a semiconductor device according to each embodiment will be described. A memory cell region MCR and peripheral circuit regions PCR are arranged in a semiconductor device SED, as illustrated in FIG. 1. A nonvolatile memory cell is formed in the memory cell region MCR. For example, a processor such as a CPU (Central Processing Unit), a control circuit, a sense amplifier, a column decoder, a row decoder, an input/output circuit, and the like are formed in the peripheral circuit regions PCR.

Figure 3:
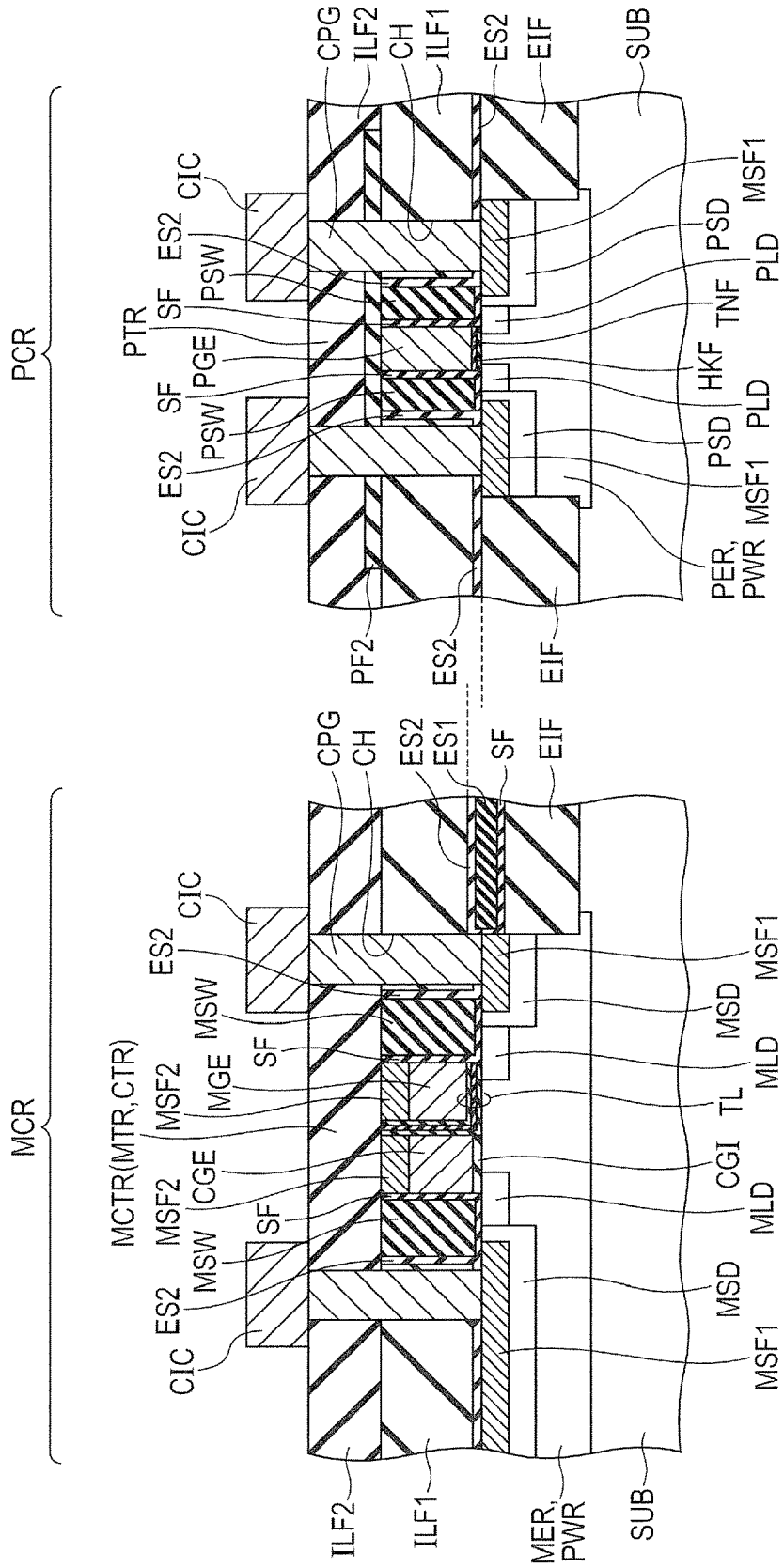
FIG. 3 is sectional views of the memory cell region and the peripheral circuit region in the same embodiment, each taken along the section line III-III illustrated in FIG. 2.
Figure 4:
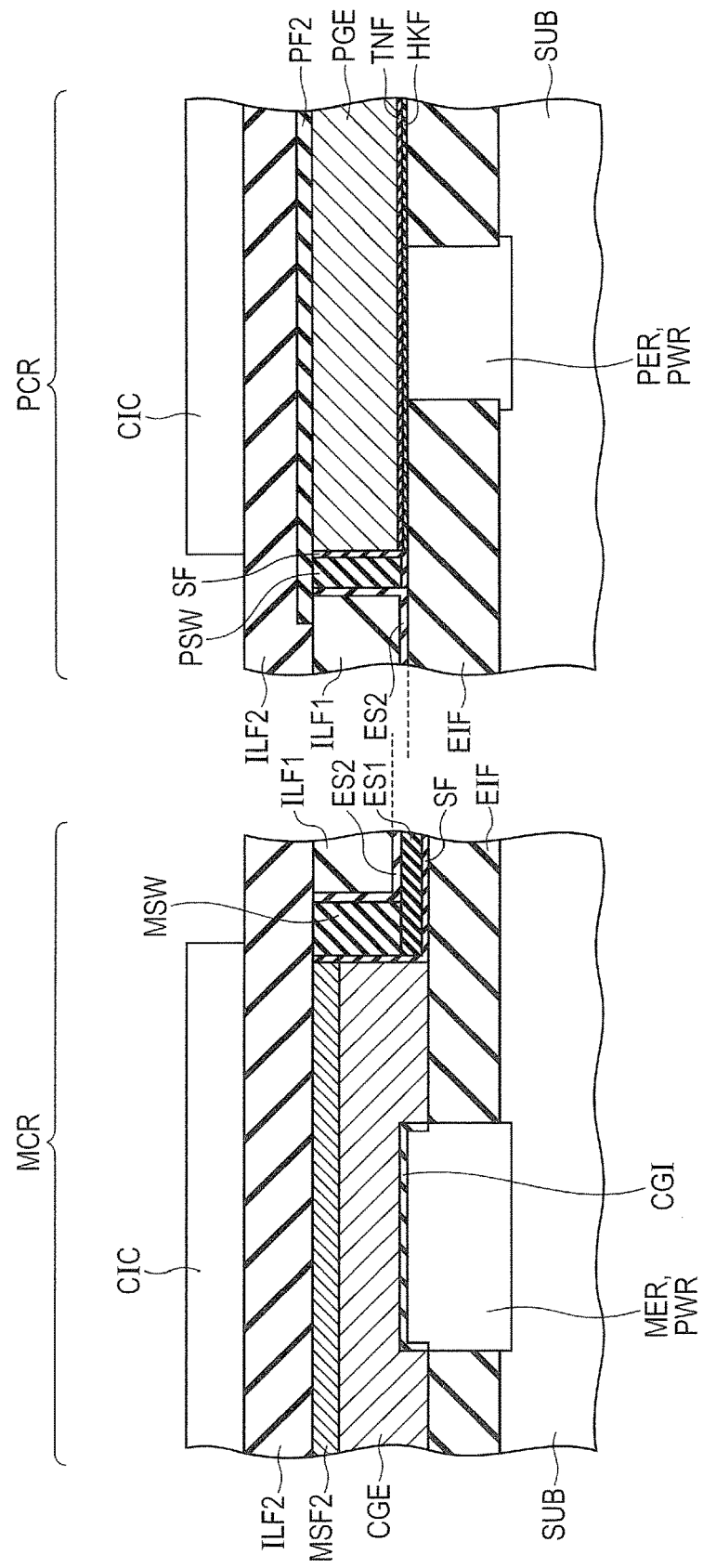
FIG. 4 is sectional views of the memory cell region and the peripheral circuit region in the same embodiment, each taken along the section line IV-IV illustrated in FIG. 2.
Figure 5:
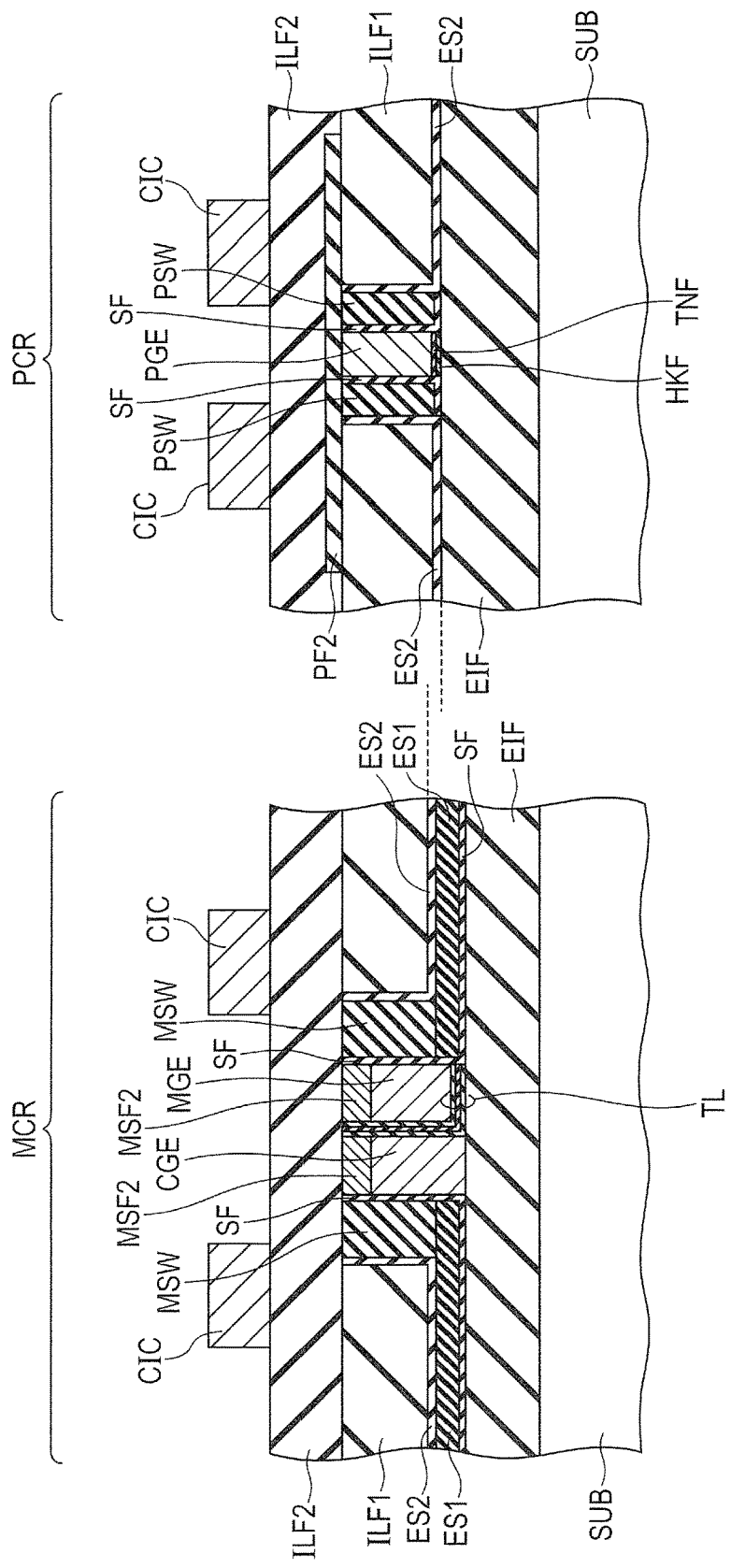
FIG. 5 is sectional views of the memory cell region and the peripheral circuit region in the same embodiment, each taken along the section line V-V illustrated in FIG. 2.

In the peripheral circuit region PCR, a peripheral MIS transistor PTR is arranged and a high breakdown voltage MIS transistor HVTR or a low breakdown voltage MIS transistor LVTR is formed. The high breakdown voltage MIS transistor HVTR is driven by a relatively high voltage. The low breakdown voltage MIS transistor LVTR is driven by a relatively low voltage. A semiconductor substrate SUB, in which the memory cell region MCR and the peripheral circuit regions PCR are arranged, is a semiconductor wafer including p-type single crystal silicon or the like having a specific resistance of, for example, approximately 1 to 10 $\Omega$cm (see FIG. 3).

The memory cell region MCR and the peripheral circuit region PCR may or may not be adjacent to each other. The peripheral circuit region PCR in which the high breakdown voltage MIS transistor HVTR is formed and the peripheral circuit region PCR in which the low breakdown voltage MIS transistor LVTR is formed may or may not be adjacent to each other.

Figure 2:
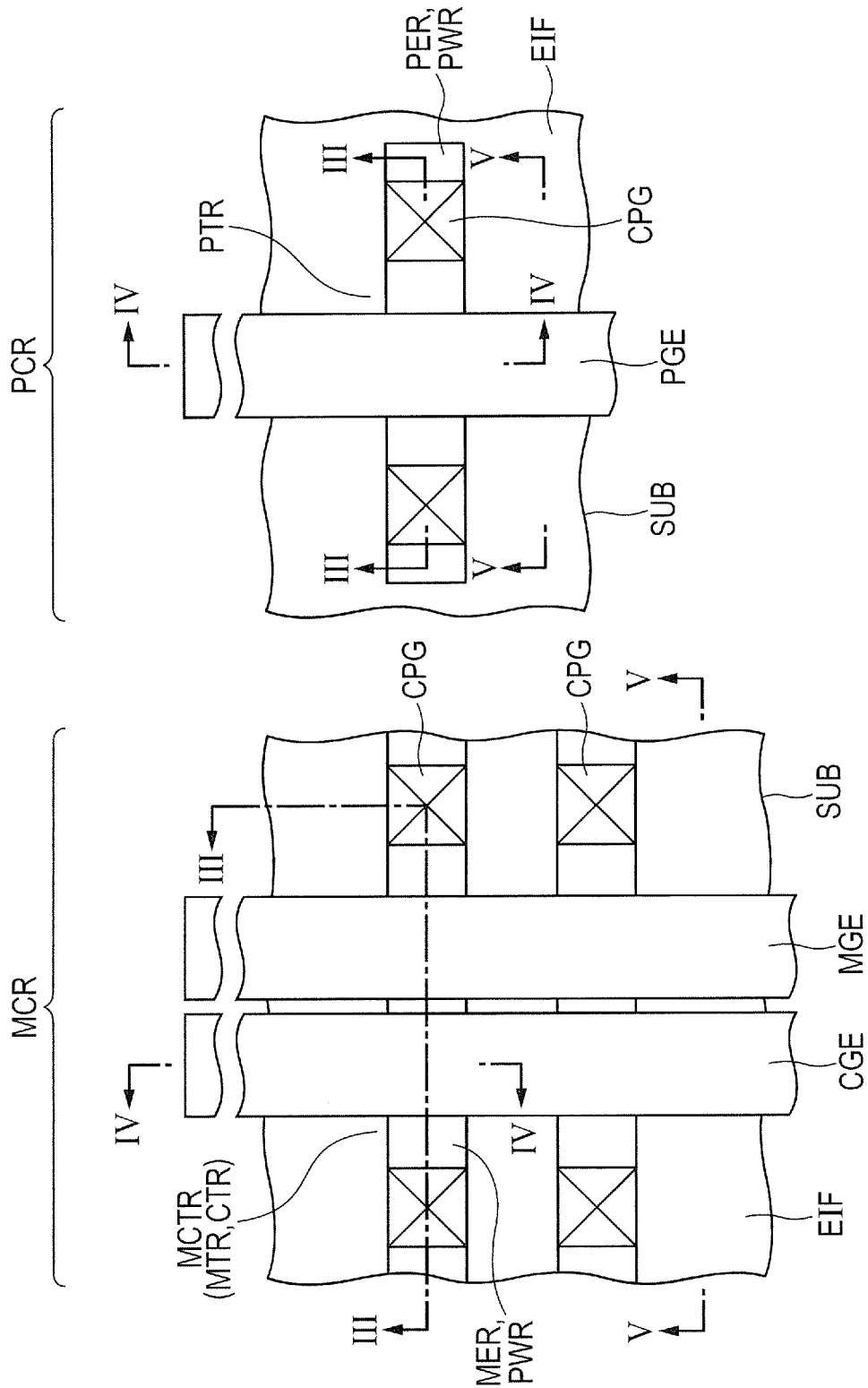
FIG. 2 is plan views respectively illustrating one example of a structure of a memory cell region and that of a structure of a peripheral circuit region in a semiconductor device according to First Embodiment.

The nonvolatile memory cell includes a split gate type memory cell transistor MCTR to which a MONOS film has been applied, as will be described later. The memory cell transistor MCTR includes two MIS transistors, a control transistor CTR and a memory transistor MTR (see FIG. 2). In the memory cell transistor MCTR of this type, information is written by source side injection. On the other hand, information is erased by band-to-band tunneling. Hereinafter, a semiconductor device, in which the memory cell region MCR and the peripheral circuit region PCR are arranged, will be specifically described.

First Embodiment

A semiconductor device according to First Embodiment will be described. In the following description, the case where each of the memory cell transistor MCTR, the high breakdown voltage MIS transistor, and the low breakdown voltage MIS transistor is an n-channel type is taken as an example to avoid complications of description and drawings. Also, only the low breakdown voltage MIS transistor is illustrated in the peripheral circuit region PCR.

(Memory Cell Region)

In the memory cell region MCR, a memory active region MER (first active region) is defined by an element isolation insulating film EIF (first element isolation insulating film), as illustrated in FIGS. 2, 3, 4, and 5. In the memory cell region MCR, the position (height) of the upper surface of the element isolation insulating film EIF is set to be lower than the position (height) of the main surface of the semiconductor substrate SUB. Because the position of the upper surface of the element isolation insulating film EIF is lower than that of the main surface of the semiconductor substrate SUB, an upper surface corresponding to the main surface and a side surface extending from the upper surface to the upper surface of the element isolation insulating film EIF are formed in the region of the semiconductor substrate SUB. The gate width of the later-described memory cell transistor MCTR can be increased by forming a control gate insulating film CGI, an ONO film TL, and the like in a region extending from the upper surface to the side surface.

A p-type well region PWR is formed in the memory active region MER. The memory cell transistor MCTR (first transistor) is formed in the well region PWR. The memory cell transistor MCTR is formed in an array shape in the memory cell region MCR. The memory cell transistor MCTR is a split gate type memory cell transistor and includes the memory transistor MTR and the control transistor CTR. The memory transistor MTR has a memory gate electrode MGE. The control transistor CTR has a control gate electrode CGE.

The control gate electrode CGE is formed over the surface (upper surface and side surface) of the well region PWR (semiconductor substrate SUB) via the control gate insulating film CGI. The control gate insulating film CGI is formed to extend from the upper surface to the side surface of the well region (region of the semiconductor substrate SUB). The control gate insulating film CGI includes an insulating film. As the insulating film, a high dielectric constant film having a relative dielectric constant (e.g., approximately 7.0 to 8.0) higher than that of a silicon oxide film, a silicon nitride film, a silicon oxynitride film, or a silicon nitride film can be adopted. The high dielectric constant film is referred to as a high-k film. Examples of the material of the high-k film include metal oxides such as, for example, hafnium oxide ($HfO_2$), zirconium oxide ($ZrO_2$), aluminum oxide ($Al_2O_3$), tantalum oxide ($Ta_2O_3$), and lanthanum oxide ($LaO_3$).

The memory gate electrode MGE is formed over the surface (upper surface and side surface) of the well region PWR (semiconductor substrate SUB) via the ONO film TL. The ONO film TL is a laminated film in which a silicon oxide film, a silicon nitride film, and a silicon oxide film are laminated. The ONO film TL is also interposed, as a trap film, between the control gate electrode CGE and the memory gate electrode MGE. Of the ONO film TL, the silicon nitride film is an insulating film for storing charges and has a function as a charge storage part. The silicon nitride film is a trapping insulating film having a trap level in the silicon nitride film. As the trapping insulating film, a high dielectric constant film having a relative dielectric constant higher than that of a silicon nitride film can be used besides the silicon nitride film, and, for example, an aluminum oxide film, a hafnium oxide film, a tantalum oxide film, or the like can be used.

The control gate electrode CGE and the memory gate electrode MGE extend across the memory active region MER with the ONO film TL interposed between the control gate electrode CGE and the memory gate electrode MGE. The memory gate electrode MGE is formed in a sidewall spacer shape over the side surface of the control gate electrode CGE via the ONO film TL.

The control gate electrode CGE includes a conductive film. As the conductive film, a conductive film containing silicon can be adopted, and, for example, an n-type polysilicon film including a polycrystalline silicon film into which n-type impurities have been introduced, or the like can be adopted. As the memory gate electrode MGE, a conductive film containing silicon can be adopted, and, for example, an n-type polysilicon film including a polycrystalline silicon film into which n-type impurities have been introduced, or the like can be adopted.

In the well region PWR, one N− diffusion layer MLD and one N+ diffusion layer MSD are formed in a region (drain side) extending from a portion located directly under one side surface of the control gate electrode CGE, the one side surface being opposite to the side on which the memory gate electrode MGE is arranged, toward a side opposite to the side on which the memory gate electrode MGE is arranged. Also, in the well region PWR, the other N− diffusion layer MLD and the other N+ diffusion layer MSD are formed in a region (source side) extending from a portion located directly under one side surface of the memory gate electrode MGE, the one side surface being opposite to the side on which the control gate electrode CGE is arranged, toward a side opposite to the side on which the control gate electrode CGE is arranged.

The impurity concentration of the N+ diffusion layer MSD is higher than that of the semiconductor substrate SUB. The impurity concentration of the N+ diffusion layer MSD is higher than that of the N− diffusion layer MLD. The junction depth of the N+ diffusion layer MSD is larger than that of the N− diffusion layer MLD. The N− diffusion layer MLD functions as an LDD (Lightly Doped Drain) region. Herein, a p-type p-pocket region or a p-type halo region (neither is illustrated) may be formed to surround the N− diffusion layer MLD in order to suppress a short channel effect.

A sidewall spacer film MSW is formed, for example, via a silicon oxide film SF, over one side surface of the control gate electrode CGE, the one side surface being opposite to the side on which the memory gate electrode MGE is arranged. The sidewall spacer film MSW is formed, for, example, via the silicon oxide film SF, over one side surface of the memory gate electrode MGE, the one side surface being opposite to the side on which the control gate electrode CGE is arranged. As the sidewall spacer film MSW, for example, a silicon oxide film, a silicon nitride film, or a laminated film of a silicon oxide film and a silicon nitride film is adopted.

A metal silicide layer MSF1 is formed over the surface of the N+ diffusion layer MSD. A metal silicide layer MSF2 is formed over the upper surface of the control gate electrode CGE and the upper surface of the memory gate electrode MGE. As the metal silicide layers MSF1 and MSF2, for example, a cobalt silicide layer, a nickel silicide layer, a platinum-added nickel silicide layer, or the like can be adopted. The contact resistance of the N+ diffusion layer MSD can be reduced by the metal silicide layer MSF1. The contact resistance of each of the control gate electrode CGE and the memory gate electrode MGE can be reduced by the metal silicide layer MSF2.

Regarding the element isolation insulating film EIF defining the memory active region MER, the silicon oxide film SF is formed to cover the upper surface of the element isolation insulating film EIF, and a buried silicon nitride film ES1 (first film of the first etching stopper film) is formed to cover the silicon oxide film SF. Further, an etching stopper film ES2 (second film of the first etching stopper film) is formed to cover the buried silicon nitride film ES1, the sidewall spacer film MSW, and the like. The position (height) of the upper surface of the etching stopper film ES2 is higher than the position (height) of the upper surface of the element isolation insulating film EIF defining a peripheral active region PER, as illustrated by the dotted lines in each of FIGS. 3, 4 and 5. The etching stopper film ES2 includes the same film as the etching stopper film ES2 formed in the later-described peripheral circuit region PCR, and is formed of the same material and with the same thickness. Herein, the material and thickness include variations in a manufacturing process.

An interlayer insulating film ILF1 is formed to cover the etching stopper film ES2. The position (height) of the upper surface of the interlayer insulating film ILF1 is substantially the same as the positions (heights) of the upper surfaces of the metal silicide layer MSF2 and the like. An interlayer insulating film ILF2 is formed to cover the interlayer insulating film ILF1. A contact plug CPG (first plug) is formed, via a barrier film (not illustrated), in a contact hole CH penetrating the interlayer insulating films ILF2 and ILF1 to reach the N+ diffusion layer MSD. As the barrier metal film, a titanium film, a titanium nitride film, or a laminated film of a titanium film and a titanium nitride film can be adopted. As the contact plug CPG, a tungsten film can be adopted.

First layer wiring CIC is formed over the interlayer insulating film ILF2. As the wiring CIC, a copper film is adopted. Besides a copper film, a tungsten film or an aluminum film can be adopted as the wiring CIC. An upper wiring layer (not illustrated) may be formed over the first layer wiring CIC, if necessary.

(Peripheral Circuit Region)

A peripheral circuit region PCR in which a low breakdown voltage MIS transistor is formed will be described as one example of the peripheral circuit region PCR. The peripheral active region PER (second active region) is defined by the element isolation insulating film EIF (second element isolation insulating film) in the peripheral circuit region PCR, as illustrated in FIGS. 2, 3, 4, and 5. In the peripheral circuit region PCR, the position (height) of the upper surface of the element isolation insulating film EIF is substantially the same as the position (height) of the main surface of the semiconductor substrate SUB.

The p-type well region PWR is formed in the peripheral active region PER. The peripheral MIS transistor PTR (second transistor) is formed in the well region PWR. A plurality of the peripheral MIS transistors PTR are formed in the peripheral active region PER. The peripheral MIS transistor PTR has a gate electrode PGE. The gate electrode PGE is formed over the surface of the well region PWR (semiconductor substrate SUB) via both a silicon oxide film (not illustrated) as an interface layer and a high dielectric constant film HKF.

The gate electrode PGE includes a metal film and a conductive film. As the metal film, for example, a titanium nitride film TNF can be adopted. As the metal film, a metal film including a metal nitride film, a metal carbide film, a tungsten film, or the like can be adopted besides the titanium nitride film TNF. Examples of the metal nitride film include a tantalum nitride film, a tungsten nitride film, and the like. Examples of the metal carbide film include a titanium carbide film, a tantalum carbide film, a tungsten carbide film, and the like. As the conductive film, for example, an aluminum film can be adopted.

In the well region PWR, one N− diffusion layer PLD and one N+ diffusion layer PSD are formed in a region extending from a portion located directly under one side surface of the gate electrode PGE toward one side spaced apart from the gate electrode PGE. Also, in the well region PWR, the other N− diffusion layer PLD and the other N+ diffusion layer PSD are formed in a region extending from a portion located directly under the other side surface of the gate electrode PGE toward the other side spaced apart from the gate electrode PGE.

The impurity concentration of the N+ diffusion layer PSD is higher than that of the semiconductor substrate SUB. The impurity concentration of the N+ diffusion layer PSD is higher than that of the N− diffusion layer PLD. The junction depth of the N+ diffusion layer PSD is larger than that of the N− diffusion layer PLD. The N− diffusion layer PLD functions as an LDD region. Herein, a p-type p-pocket region or a p-type halo region (neither is illustrated) may be formed to surround the N− diffusion layer PLD in order to suppress a short channel effect.

A sidewall spacer film PSW is formed, via the silicon oxide film SF, over each of the one side surface and the other side surface of the gate electrode PGE. A metal silicide layer PSF1 is formed over the surface of the N+ diffusion layer PSD. A metal silicide layer PSF2 is formed over the upper surface of the gate electrode PGE. The contact resistance of the N+ diffusion layer PSD can be reduced by the metal silicide layer PSF1. The contact resistance of the gate electrode PGE can be reduced by the metal silicide layer PSF2.

In the element isolation insulating film EIF defining the peripheral active region PER, the etching stopper film ES2 (second etching stopper film) is formed to cover the element isolation insulating film EIF and the sidewall spacer film PSW. The interlayer insulating film ILF1 is formed to cover the etching stopper film ES2. The position (height) of the upper surface of the interlayer insulating film ILF1 is substantially the same as the positions (heights) of the upper surfaces of the metal silicide layer PSF2 and the like.

The interlayer insulating film ILF2 is formed to cover the interlayer insulating film ILF1. A contact plug CPG (second plug) is formed, via a barrier film (not illustrated), in a contact hole CH penetrating the interlayer insulating films ILF2 and ILF1 to reach the N+ diffusion layer PSD. The first layer wiring CIC is formed over the interlayer insulating film ILF2. An upper wiring layer (not illustrated) may be formed over the first layer wiring CIC, if necessary.

(Operation of Memory Cell Transistor)

Next, one example of the operation of the memory cell transistor MCTR will be described. First, injection of electrons into the silicon nitride film of the ONO film TL in the memory cell transistor MCTR is defined as "writing." On the other hand, injection of holes into the silicon nitride film is defined as "erasing."

A source side injection method is adopted for writing information to the memory cell transistor MCTR. Hot electrons are injected in the source side injection. A voltage Vd to be applied to the N+ diffusion layer MSD (drain side) is set, for example, to approximately 0.8 V. A voltage Vcg to be applied to the control gate electrode CGE is set, for example, to approximately 1 V. A voltage Vmg to be applied to the memory gate electrode MGE is set, for example, to approximately 12 V. A voltage Vs to be applied to the N+ diffusion layer MSD (source side) is set, for example, to approximately 6 V. A voltage Vb to be applied to the p-type well region PWR is set, for example, to approximately 0 V. A power supply voltage Vdd is set, for example, to 1.5 V. Electrons are injected into the silicon nitride film of the ONO film TL by applying each voltage to a memory cell to which information is to be written.

Hot electrons are generated mainly in a channel region formed in the well region PWR located directly under the memory gate electrode MGE. The generated hot electrons are injected into the silicon nitride film. The injected hot electrons are trapped at a trap level in the silicon nitride film. As a result, the threshold voltage (Vth) of the memory cell transistor MCTR is increased.

A hot hole injection erasing method using BTBT (Band-To-Band Tunneling) is adopted for erasing the information of the memory cell transistor MCTR. In the hot hole injection erasing method, the holes generated by BTBT are injected into the silicon nitride film. The voltage Vd is set, for example, to approximately 0 V. The voltage Vcg is set, for example, to approximately 0 V. The voltage Vmg is set, for example, to approximately −6 V. The voltage Vs is set, for example, to approximately 6 V. The voltage Vb is set, for example, to approximately 0 V. Holes are generated due to BTBT by applying each voltage to a memory cell in which information is to be erased. The generated holes are accelerated in an electric field such that they are injected into the silicon nitride film of the ONO film TL. As a result, the threshold voltage of the memory transistor is decreased.

Besides BTBT, an erasing method using FN (Fowler-Nordheim) type tunneling may be adopted for erasing the information of the memory cell transistor MCTR. In this erasing method, the holes generated by the FN tunneling are injected into the silicon nitride film. The voltage Vmg is set, for example, to approximately 12 V. The voltage Vb is set, for example, to approximately 0 V. Holes are injected from the memory gate electrode MGE into the silicon nitride film via the silicon oxide film by applying each voltage to a memory cell in which information is to be erased. The holes injected into the silicon nitride film and the electrons therein are cancelled out by each other, so that information is erased. Alternatively, the holes injected into the silicon nitride film are trapped at a trap level in the silicon nitride film, so that information is erased.

When information is read out, the voltage Vd is set, for example, to approximately the power supply voltage (approximately 1.5 V). The voltage Vcg is set, for example, to approximately the power supply voltage (approximately 1.5 V). The voltage Vmg is set, for example, to approximately 0 V. The voltage Vs is set, for example, to approximately 0 V. The voltage Vb is set, for example, to approximately 0 V. Each voltage is applied to a memory cell in which information is read out. By setting the voltage Vmg to be applied to the memory gate electrode MGE to a voltage value between the threshold voltage of the memory transistor MTR in a write state and the threshold voltage of the memory transistor MTR in an erasing state, the write state and the erasing state can be discriminated from each other by whether current flows.

(Manufacturing Method of Semiconductor Device)

Figure 6:
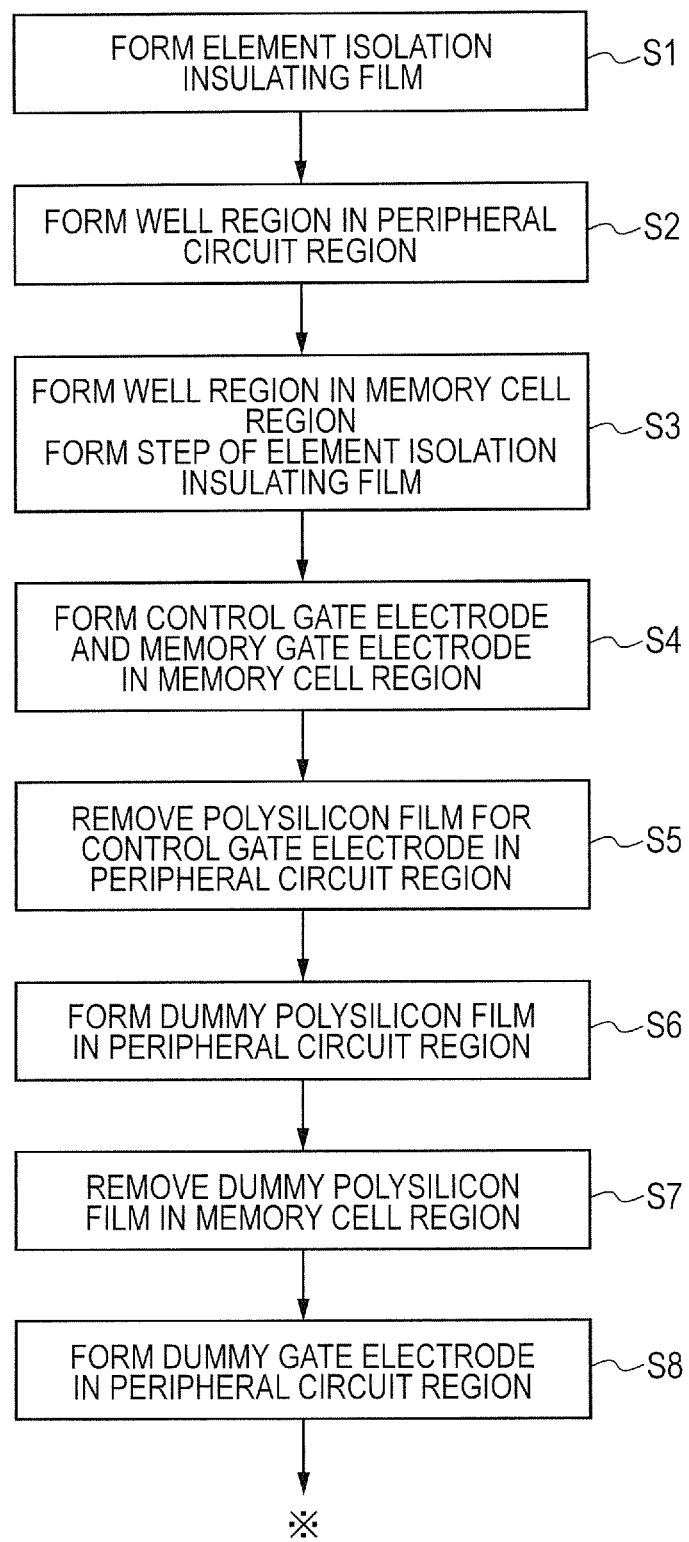
FIG. 6 is a first flowchart showing a main manufacturing flow of a semiconductor device in the same embodiment.

Next, one example of a manufacturing method of the semiconductor device will be described. First, main manufacturing steps will be described by a flowchart. As illustrated in FIG. 6, an element isolation insulating film that will define a memory cell region (memory active region) and a peripheral circuit region (peripheral active region) is formed in Step S1. In Step S2, a well region is formed in the peripheral circuit region. In Step S3, a well region is formed in the memory cell region. A step is formed by retreating the surface of the element isolation insulating film defining the memory cell region (memory active region). In Step S4, a control gate electrode and a memory gate electrode are formed in the memory cell region. In Step S5, a polysilicon film for a control gate electrode in the peripheral circuit region is removed. In Step S6, a dummy polysilicon film is formed in the peripheral circuit region. In Step S7, the dummy polysilicon film in the memory cell region is removed. In Step S8, a dummy gate electrode is formed in the peripheral circuit region.

Figure 7:
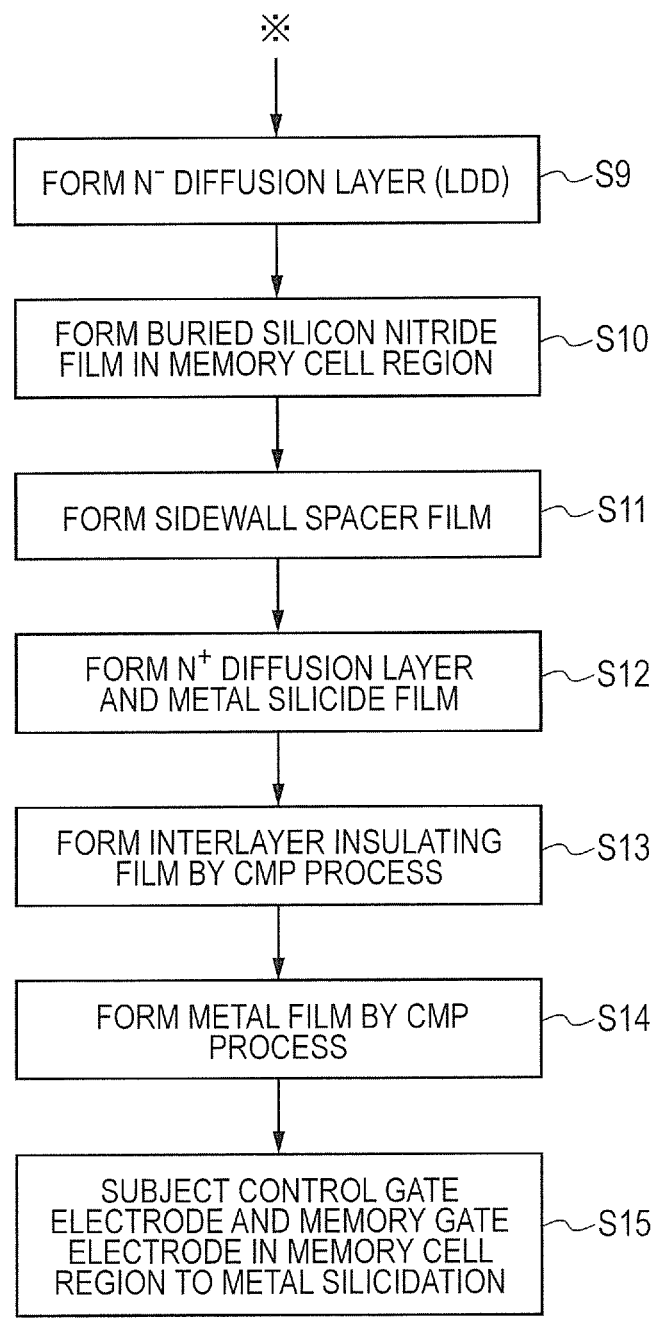
FIG. 7 is a second flowchart showing a main manufacturing flow of the semiconductor device in the same embodiment.

Next, as illustrated in FIG. 7, an N− diffusion layer (LDD region) is formed in Step S9. In Step S10, a buried silicon nitride film is formed in the memory cell region. In Step S11, a sidewall spacer film is formed. In Step S12, an N+ diffusion layer is formed. Next, a metal silicide layer is formed. In Step S13, an interlayer insulating film is formed, and flattened by a CMP (Chemical Mechanical Polishing) process. In Step S14, the dummy gate electrode is removed, and an original metal film to serve as a gate electrode is formed. Next, the original metal film is flattened by a CMP process. In Step S15, the control gate electrode and the memory gate electrode in the memory cell region are subjected to metal silicidation. The main flow has been described above.

Figure 8:
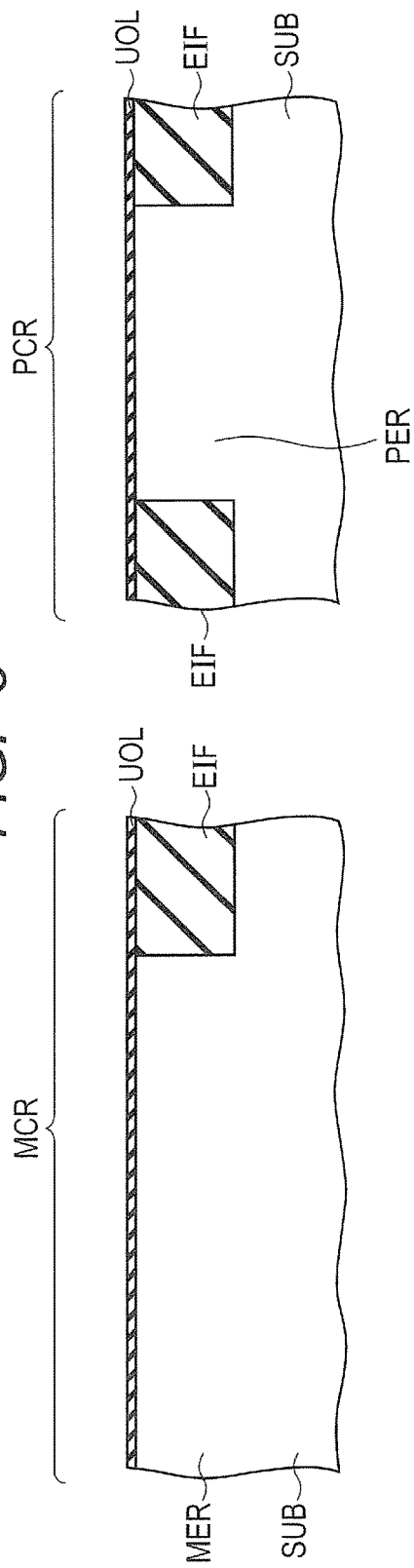
FIG. 8 is sectional views illustrating one step of a manufacturing method of the semiconductor device in the same embodiment, each taken along a section line corresponding to the section line III-III.
Figure 9:
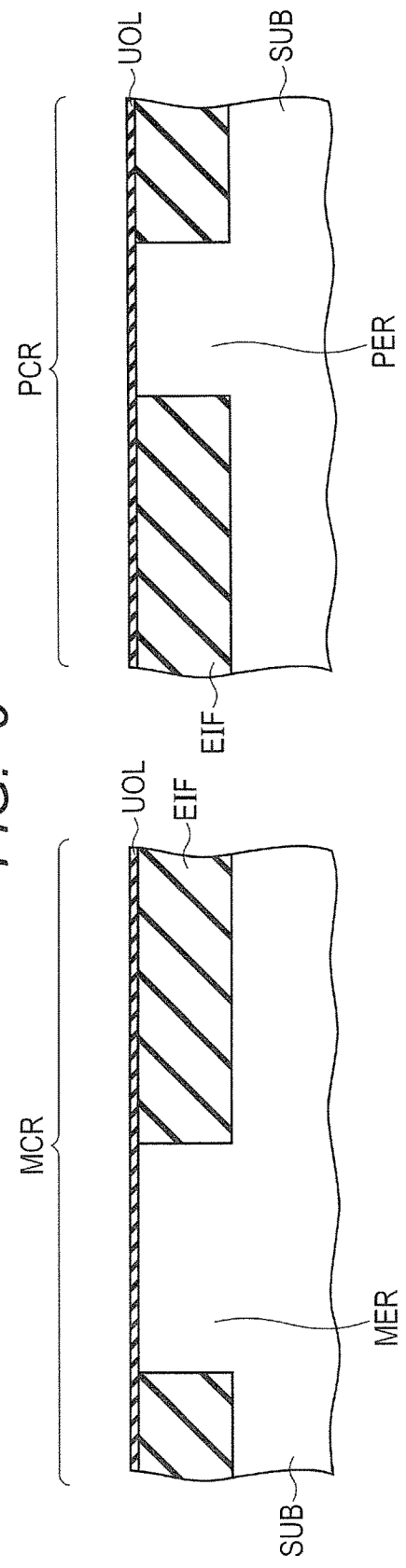
FIG. 9 is sectional views illustrating the one step of the manufacturing method of the semiconductor device in the same embodiment, each taken along a section line corresponding to the section line IV-IV.

Next, the manufacturing method of the semiconductor device will be described in more detail. The memory cell region MCR (memory active region MER) and the peripheral circuit region PCR (peripheral active region PER) are defined by forming the element isolation insulating film EIF over the semiconductor substrate SUB, as illustrated in FIGS. 8 and 9. The element isolation insulating film EIF is formed, for example, by an STI (Shallow Trench Isolation) process. Besides this, the element isolation insulating film EIF may be formed by a LOCOS (Local Oxidation of Silicon) process. Next, an underlying oxide film UOL having a thickness of approximately several nm is formed by a thermal oxidation process.

Figure 10:
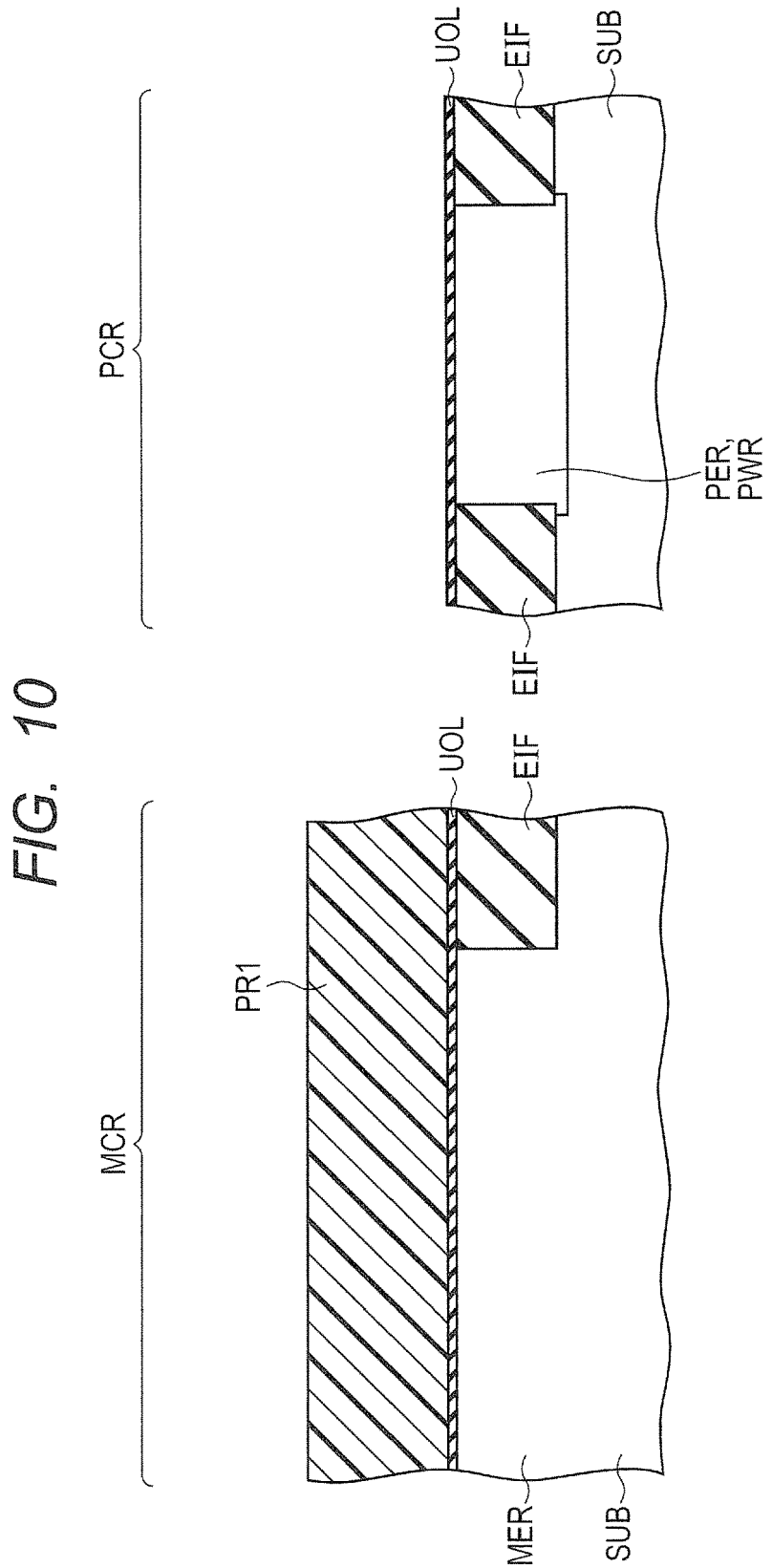
FIG. 10 is sectional views illustrating a step performed after the step illustrated in FIGS. 8 and 9 in the same embodiment, each taken along the section line corresponding to the section line III-III.
Figure 11:
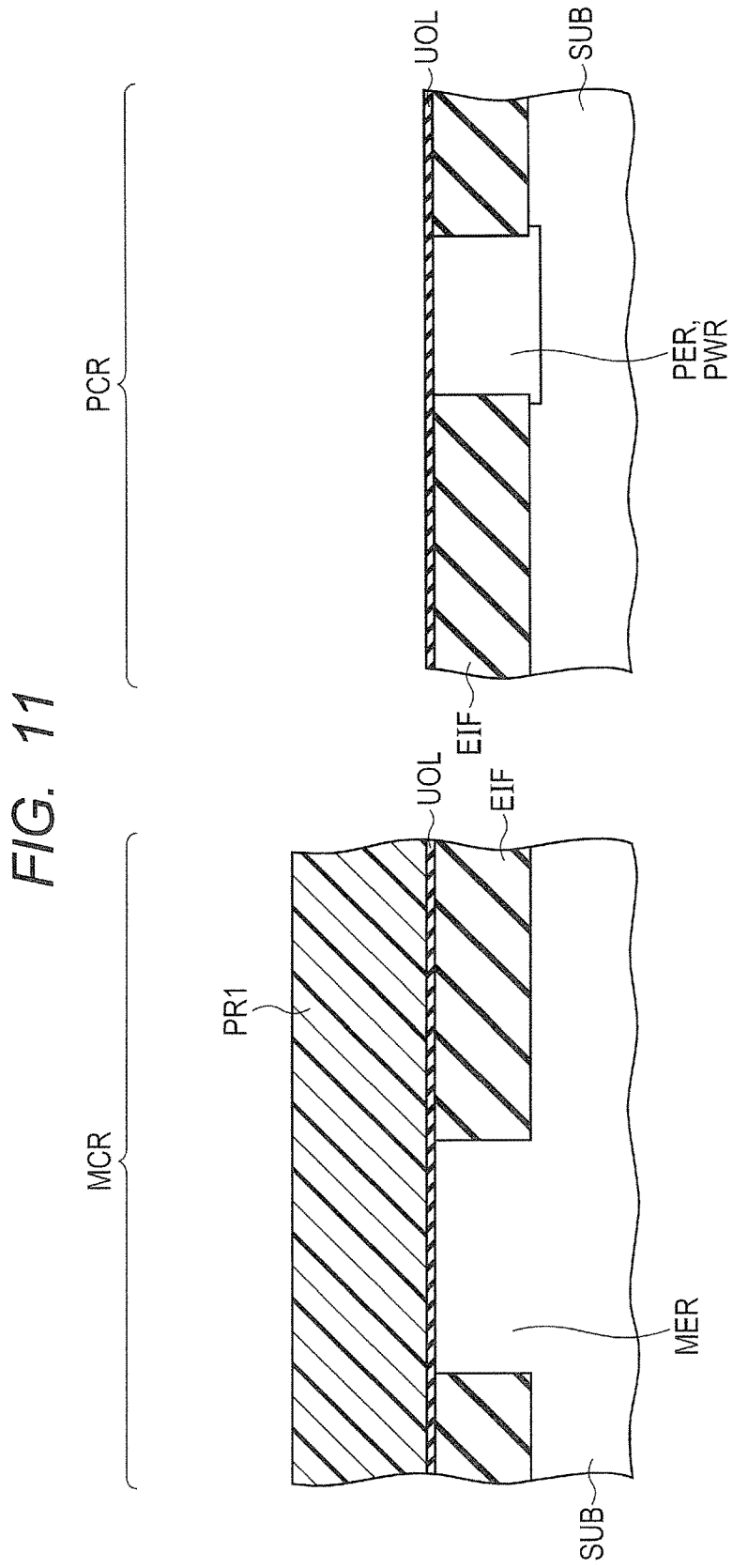
FIG. 11 is sectional views illustrating the step performed after the step illustrated in FIGS. 8 and 9 in the same embodiment, each taken along the section line corresponding to the section line IV-IV.

Next, a photoresist pattern PR1, for exposing the peripheral circuit region PCR and covering the memory cell region MCR, is formed by performing a predetermined photoengraving process, as illustrated in FIGS. 10 and 11. Next, the p-type well region PWR is formed in the peripheral active region PER by implanting p-type impurities such as, for example, boron with the use of the photoresist pattern PR1 as an implantation mask. Herein, channel doping, for adjusting the threshold voltage of the low breakdown voltage MIS transistor or the like, is performed if necessary. Thereafter, the photoresist pattern PR1 is removed.

Figure 12:
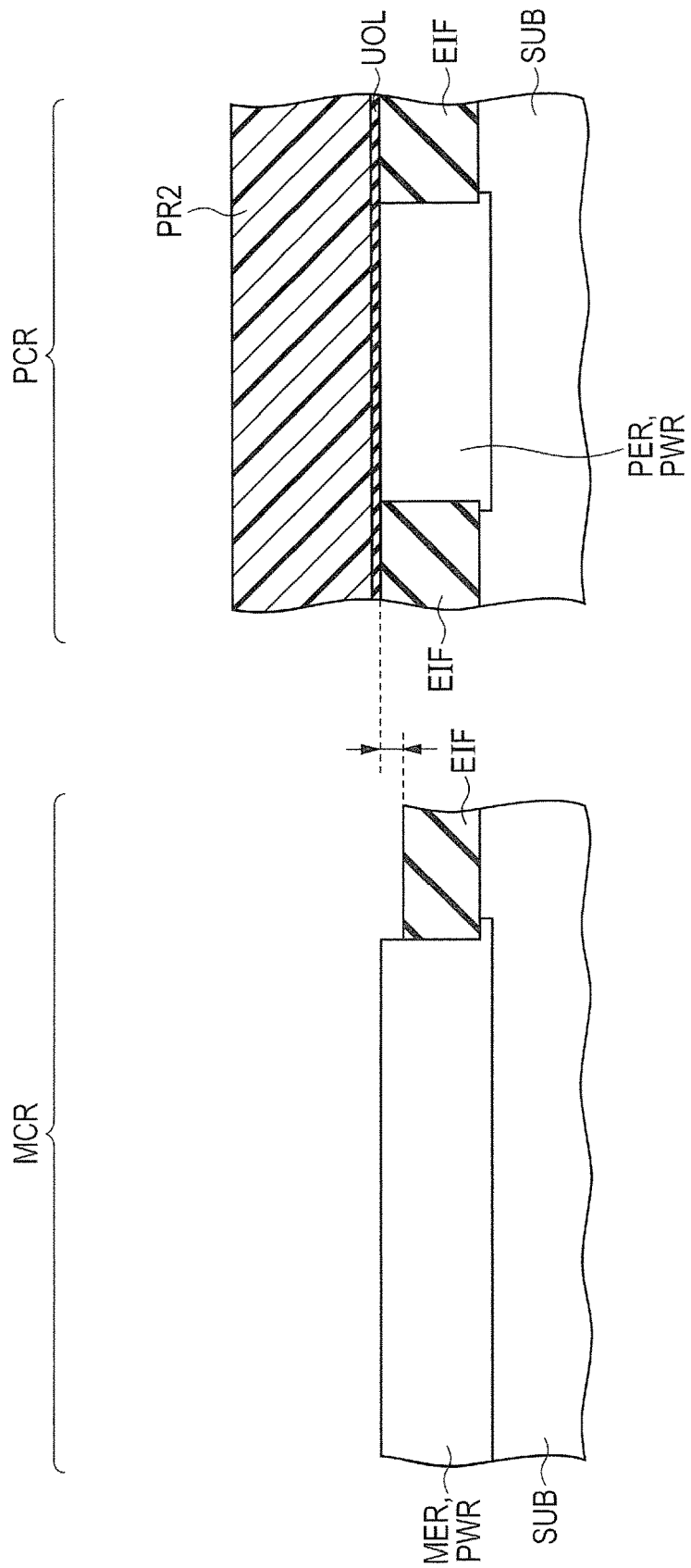
FIG. 12 is sectional views illustrating a step performed after the step illustrated in FIGS. 10 and 11 in the same embodiment, each taken along the section line corresponding to the section line III-III.
Figure 13:
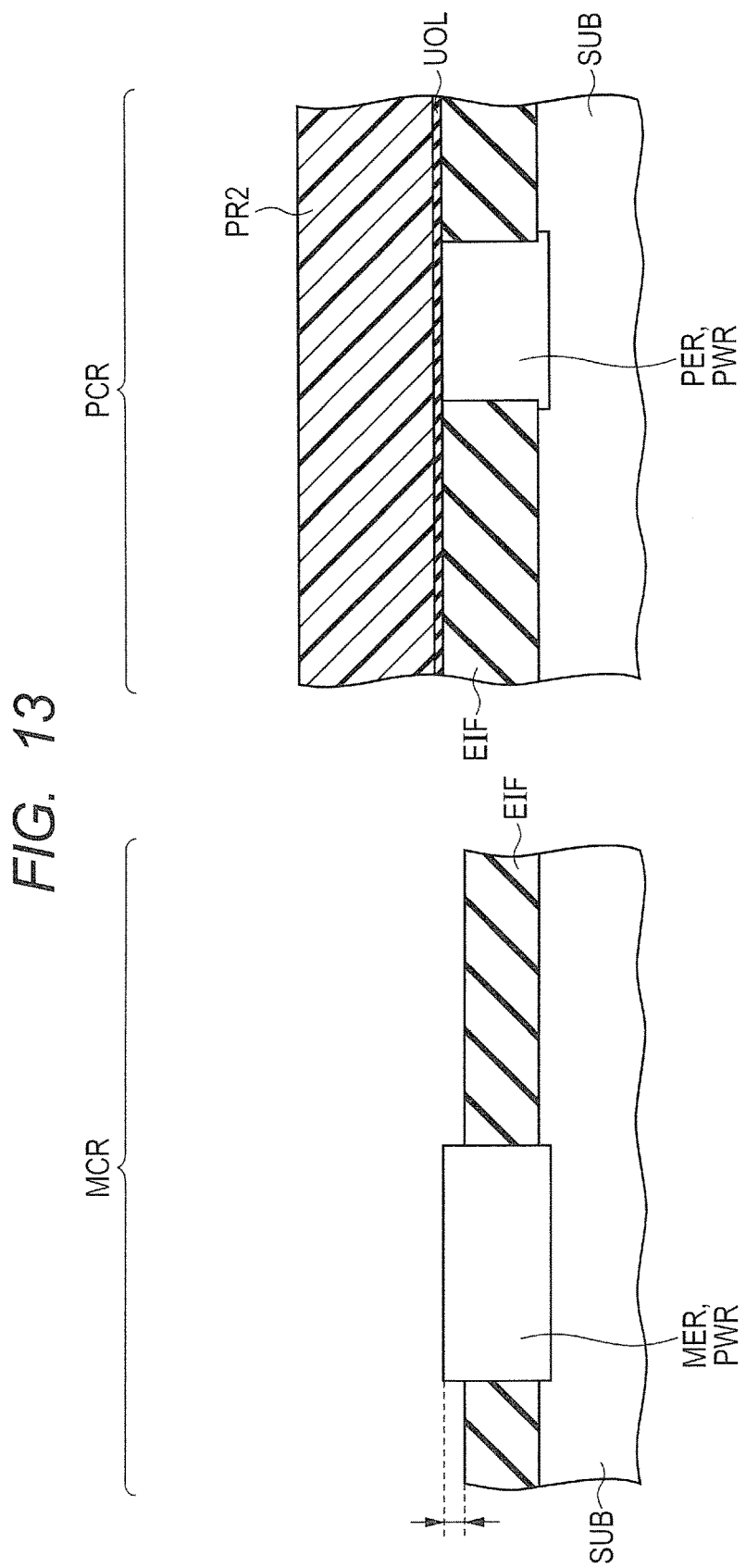
FIG. 13 is sectional views illustrating the step performed after the step illustrated in FIGS. 10 and 11 in the same embodiment, each taken along the section line corresponding to the section line IV-IV.

Next, a photoresist pattern PR2, for exposing the memory cell region MCR and covering the peripheral circuit region PCR, is formed by performing a predetermined photoengraving process, as illustrated in FIGS. 12 and 13. Next, the p-type well region PWR is formed in the memory active region MER by implanting p-type impurities such as, for example, boron with the use of the photoresist pattern PR2 as an implantation mask. Next, channel doping for adjusting the threshold voltage of the control transistor or the like is performed. Next, the position of the upper surface of the element isolation insulating film EIF is retreated and made lower than that of the main surface of the semiconductor substrate SUB by performing a wet etching process using, for example, a hydrofluoric acid (HF) aqueous solution with the use of the photoresist pattern PR2 as an etching mask. This retreat amount is, for example, approximately 10 to 30 nm. Thereafter, the photoresist pattern PR2 is removed.

Next, an insulating film CIF (see FIG. 14) to serve as a control gate insulating film is formed over the main surface of the semiconductor substrate SUB. As the insulating film CIF, for example, a silicon oxide film, a silicon nitride film, a silicon oxynitride film, a high dielectric constant film, or the like can be adopted. For forming the insulating film CIF, a thermal oxidation process, a sputtering process, an ALD (Atomic Layer Deposition) process, a CVD (Chemical Vapor Deposition) process, or the like can be adopted.

Next, a conductive film PS1 (see FIG. 14) to serve as the control gate electrode is formed to cover the insulating film CIF. The thickness of the conductive film PS1 is, for example, approximately 50 to 100 nm. As the conductive film PS1, an n-type polysilicon film is preferable. For forming the conductive film PS1, for example, a CVD process can be adopted. Next, a cap insulating film HM1 (see FIG. 14) is formed to cover the conductive film PS1. The thickness of the cap insulating film HM1 is, for example, approximately 20 to 100 nm. As the cap insulating film HM1, for example, a silicon nitride film is preferable. For forming the cap insulating film HM1, for example, a CVD process can be adopted.

Figure 14:
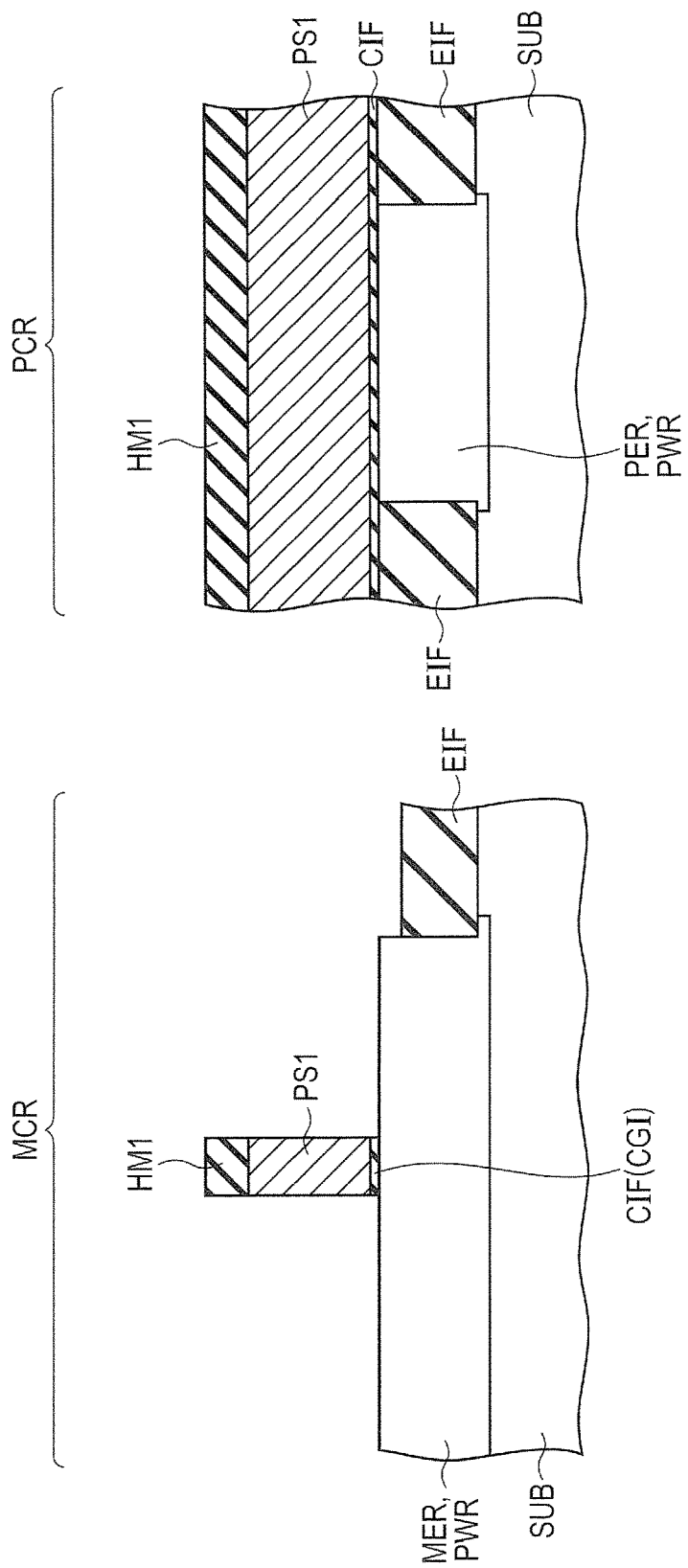
FIG. 14 is sectional views illustrating a step performed after the step illustrated in FIGS. 12 and 13 in the same embodiment, each taken along the section line corresponding to the section line III-III.
Figure 15:
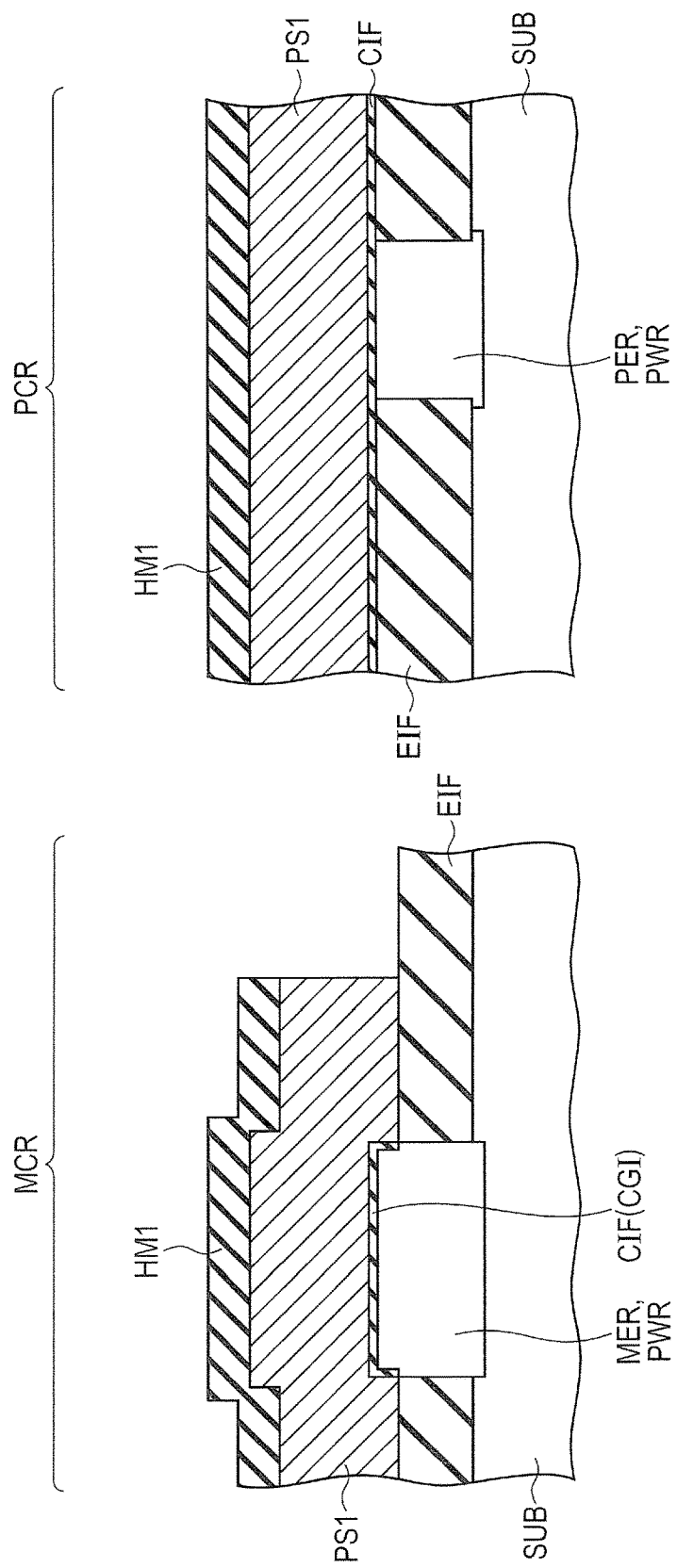
FIG. 15 is sectional views illustrating the step performed after the step illustrated in FIGS. 12 and 13 in the same embodiment, each taken along the section line corresponding to the section line IV-IV.

Next, a photoresist pattern (not illustrated) for patterning the control gate electrode is formed by performing a predetermined photoengraving process. Next, the cap insulating film HM1 and the conductive film PS1 are etched by using the photoresist pattern as an etching mask. Thus, the pattern of the conductive film PS1 to serve as the control gate electrode is formed as illustrated in FIGS. 14 and 15. Thereafter, channel doping for adjusting the threshold voltage of the memory transistor is performed if necessary.

Next, the ONO film TL (see FIG. 16, etc.) is formed by sequentially laminating a silicon oxide film, a silicon nitride film, and a silicon oxide film. The thickness of the silicon oxide film, the first layer, is, for example, approximately 2 to 10 nm. The thickness of the silicon nitride film is, for example, approximately 5 to 15 nm. The thickness of the silicon oxide film, the second layer, is, for example, approximately 5 to 20 nm. For forming the silicon oxide film, the first layer, a thermal oxidation process or an ISSG oxidation process is adopted. For forming the silicon nitride film, a CVD process is adopted. For forming the silicon oxide film, the second layer, a CVD process is adopted.

Next, a conductive film PS2 (see FIG. 16, etc.) to serve as the memory gate electrode is formed to cover the ONO film TL. The thickness of the conductive film PS2 is, for example, approximately 30 to 100 nm. As the conductive film PS2, an n-type polysilicon film is preferable. For forming the conductive film PS2, for example, a CVD process can be adopted. Next, anisotropic etching is performed on the entire surface of the conductive film PS2. Thereby, the pattern of the sidewall-shaped conductive film PS2 is formed, in the memory cell region MCR, over both side surfaces of the pattern of the conductive film PS1 to serve as the control gate electrode. The conductive film PS2 is removed in the peripheral circuit region PCR.

Next, a photoresist pattern (not illustrated), for exposing the pattern of one of the sidewall-shaped conductive films PS2 that are respectively formed over both side surfaces of the pattern of the conductive film PS1 to serve as the control gate electrode and exposing the pattern of the other of the sidewall-shaped conductive films PS2, is formed by performing a predetermined photolithography process. Next, the pattern of the other of the conductive films PS2, which is exposed, is removed by performing a dry etching process using the photoresist pattern as an etching mask.

Figure 16:
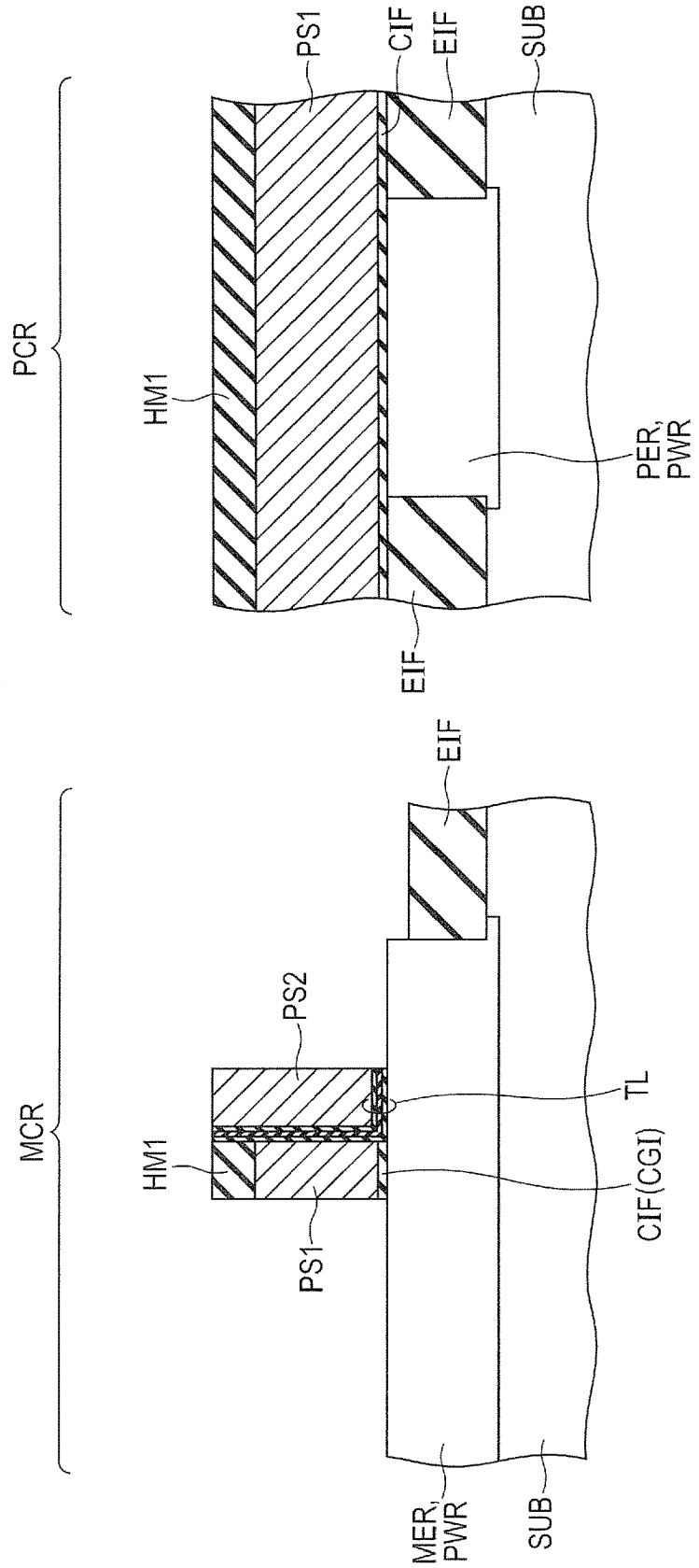
FIG. 16 is sectional views illustrating a step performed after the step illustrated in FIGS. 14 and 15 in the same embodiment, each taken along the section line corresponding to the section line III-III.
Figure 17:
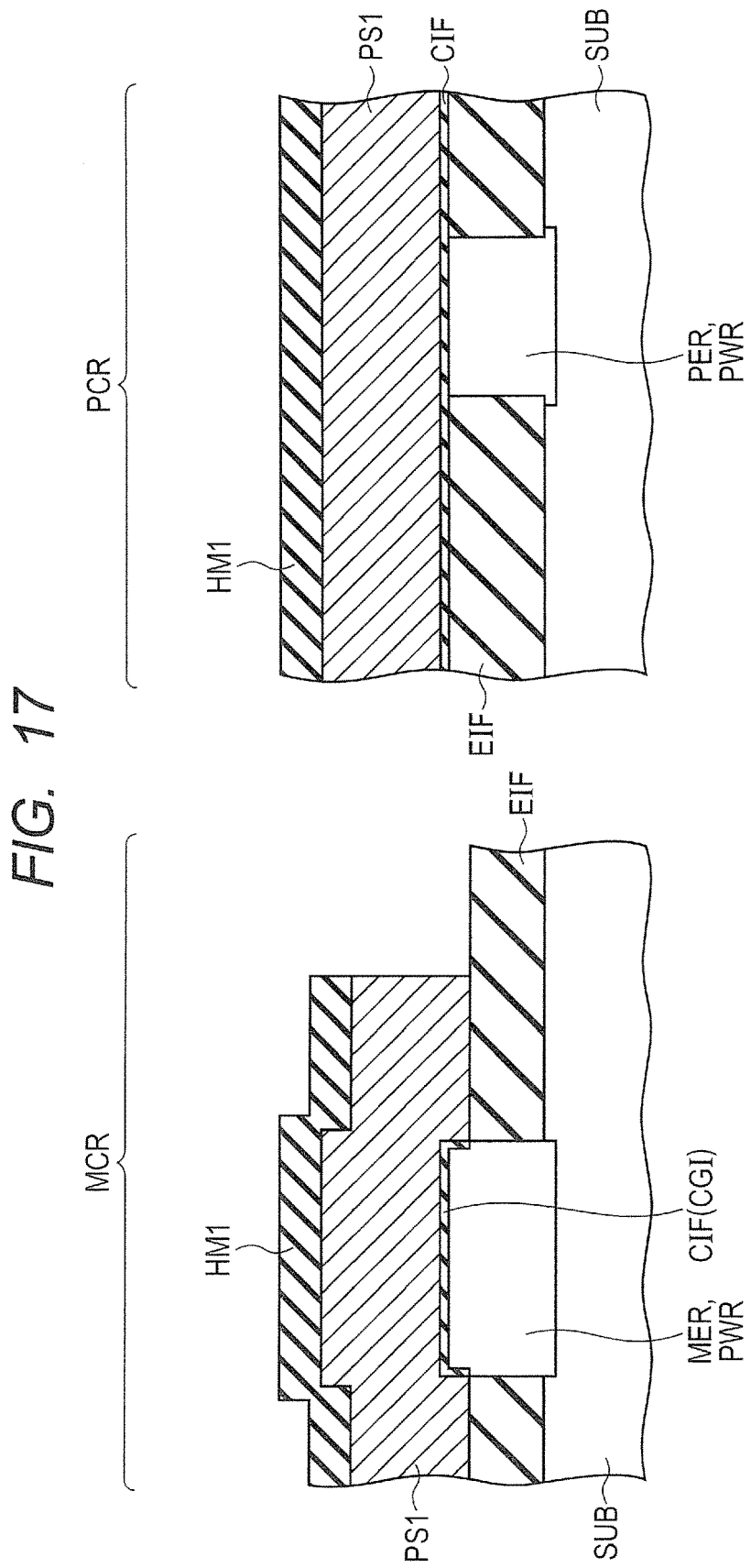
FIG. 17 is sectional views illustrating the step performed after the step illustrated in FIGS. 14 and 15 in the same embodiment, each taken along the section line corresponding to the section line IV-IV.

Next, the portion of the ONO film TL exposed by removing the pattern of the conductive film PS2 is removed by performing a wet etching process. At this time, the portion of the remaining ONO film TL is removed in the peripheral circuit region PCR. Thus, the sidewall-shaped pattern of the conductive film PS2 to serve as the memory gate electrode is left, via the ONO film TL, over one side surface of the pattern of the conductive film PS1 to serve as the control gate electrode, as illustrated in FIGS. 16 and 17.

Figure 18:
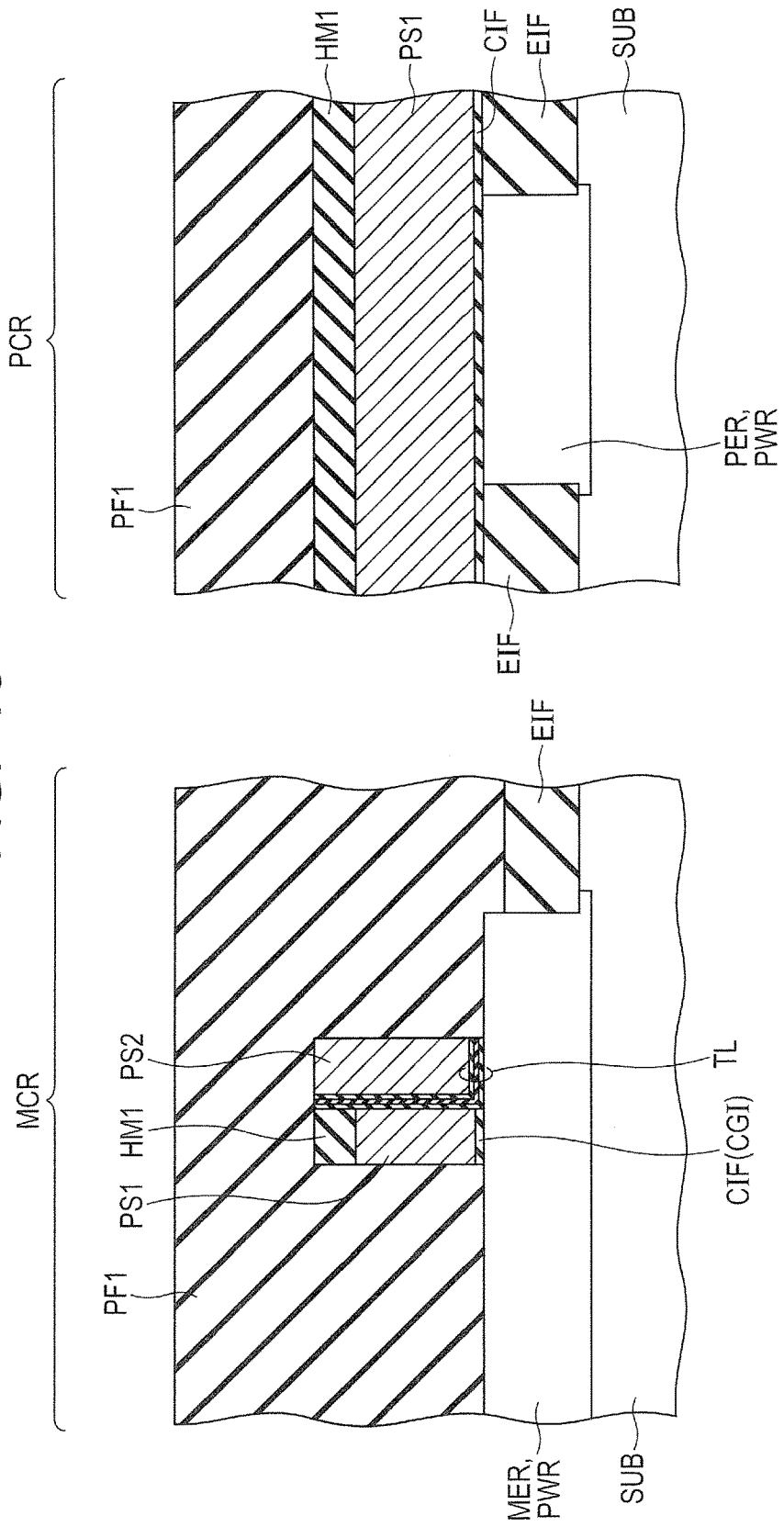
FIG. 18 is sectional views illustrating a step performed after the step illustrated in FIGS. 16 and 17 in the same embodiment, each taken along the section line corresponding to the section line III-III.
Figure 19:
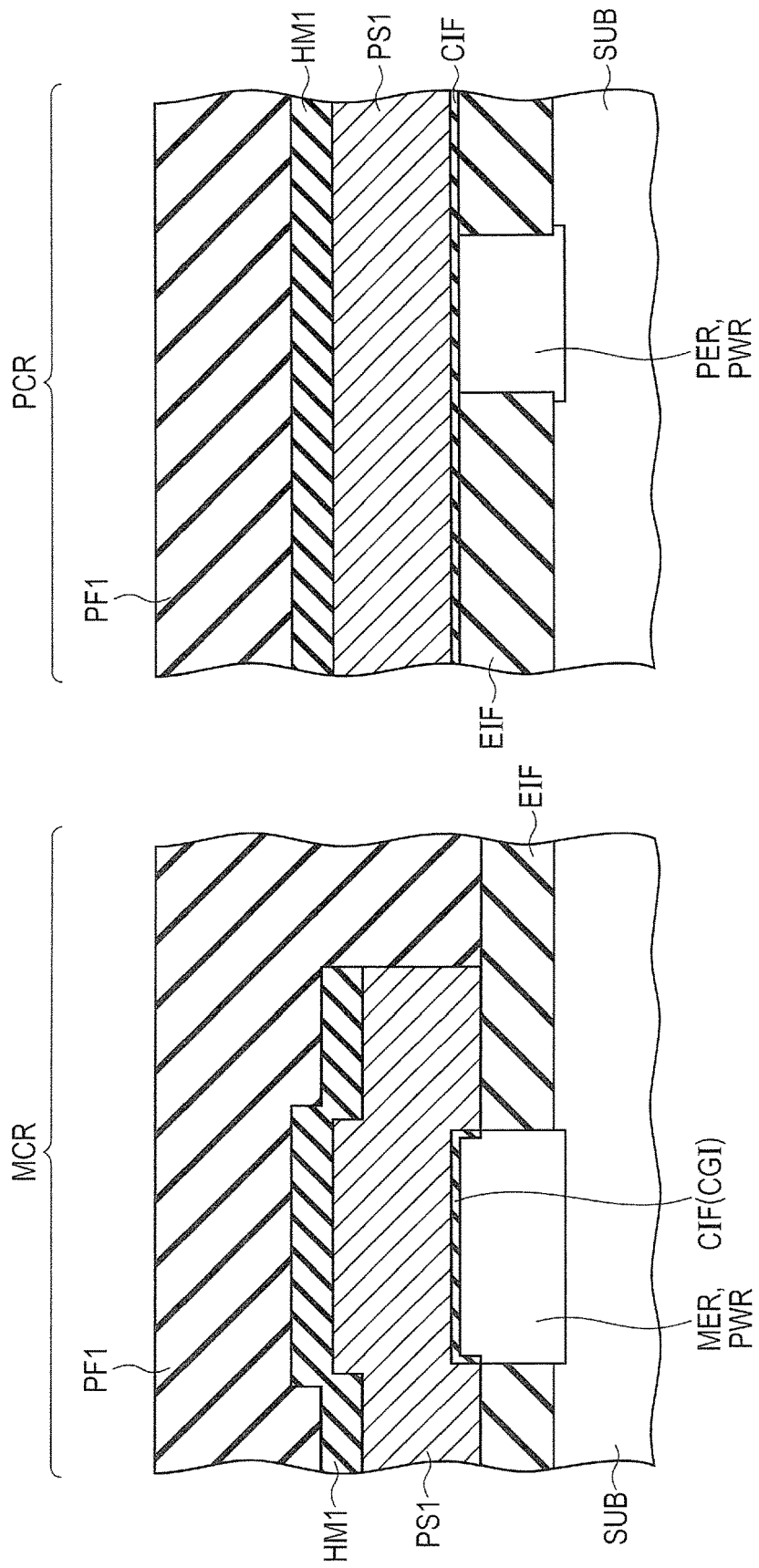
FIG. 19 is sectional views illustrating the step performed after the step illustrated in FIGS. 16 and 17 in the same embodiment, each taken along the section line corresponding to the section line IV-IV.
Figure 20:
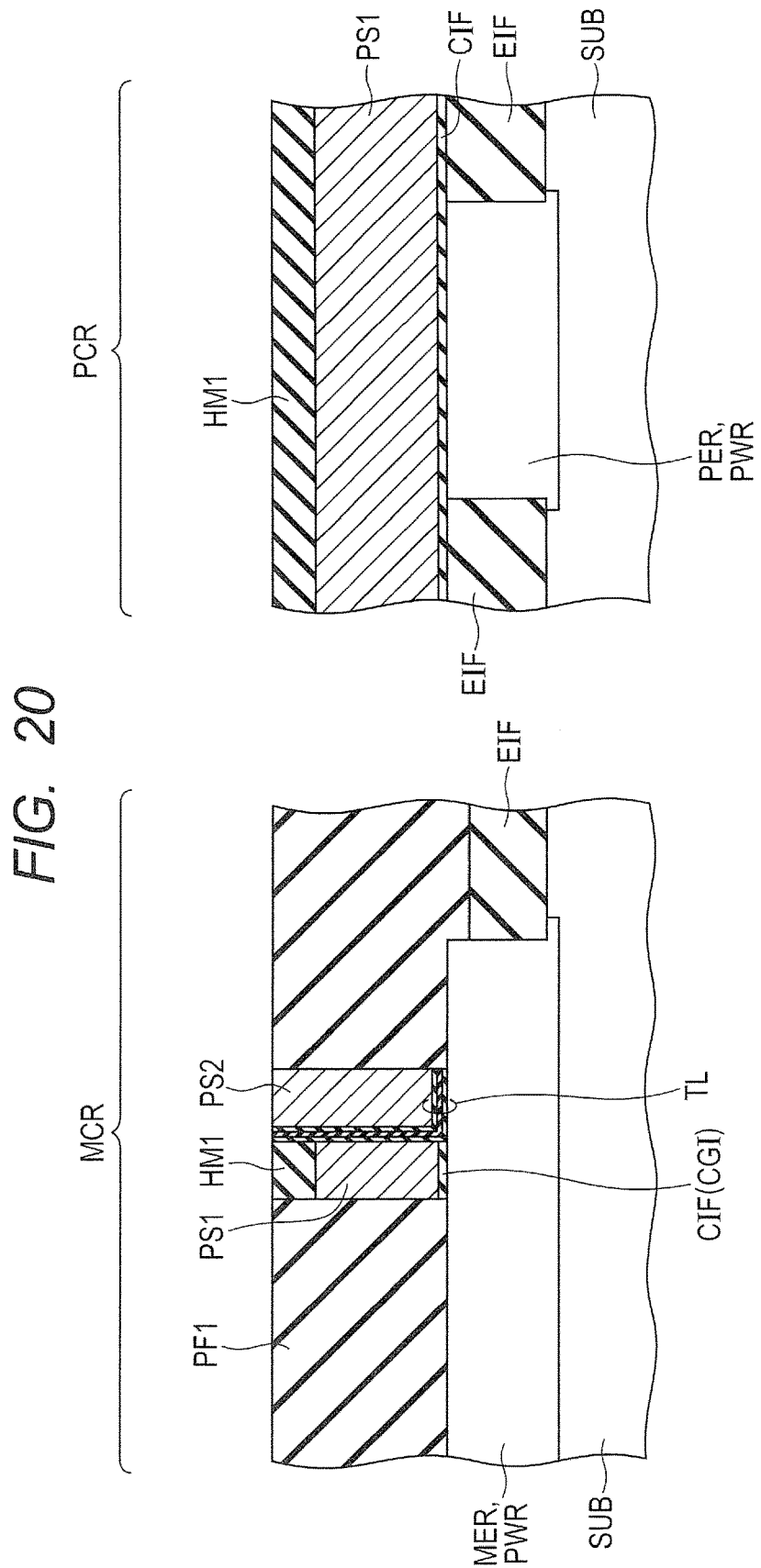
FIG. 20 is sectional views illustrating a step performed after the step illustrated in FIGS. 18 and 19 in the same embodiment, each taken along the section line corresponding to the section line III-III.
Figure 21:
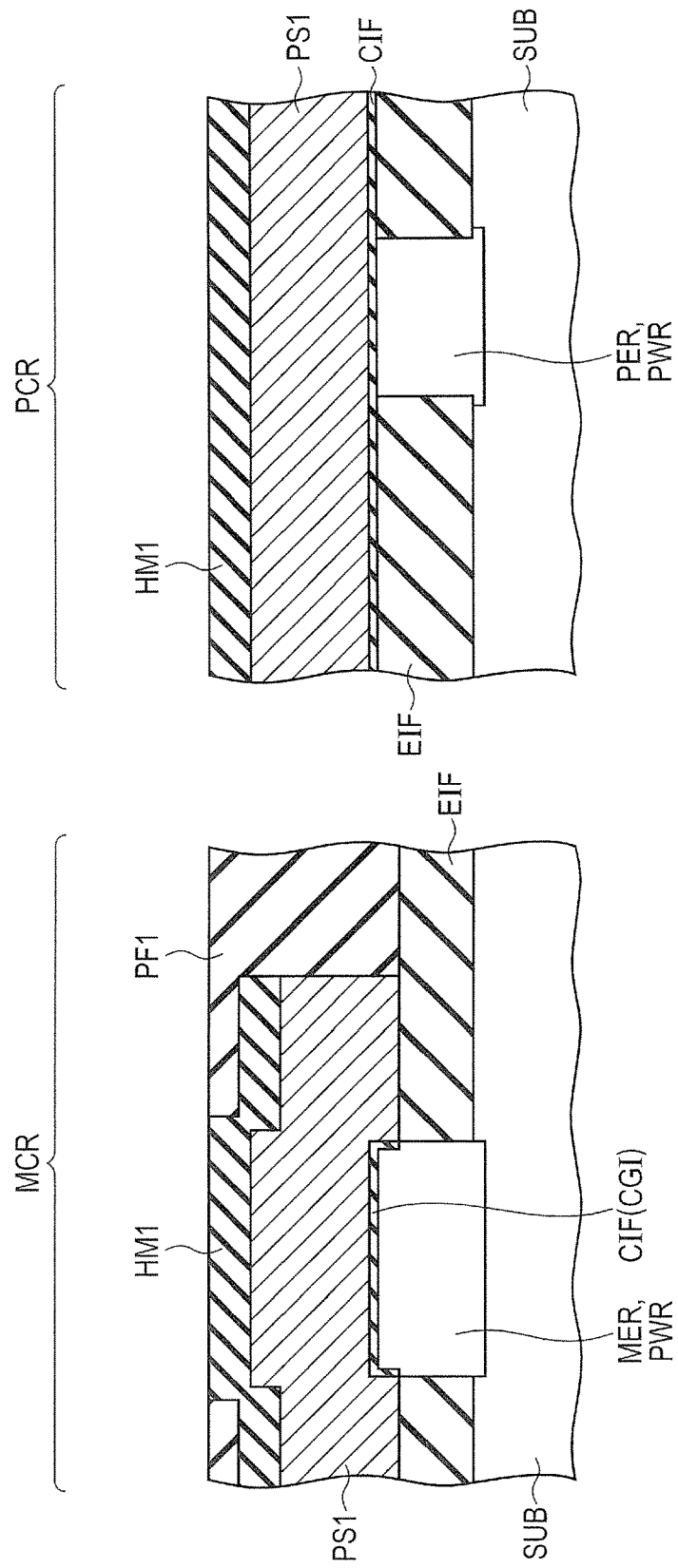
FIG. 21 is sectional views illustrating the step performed after the step illustrated in FIGS. 18 and 19 in the same embodiment, each taken along the section line corresponding to the section line IV-IV.

Next, an insulating film PF1 is formed to cover the semiconductor substrate SUB, as illustrated in FIGS. 18 and 19. The thickness of the insulating film PF1 is set such that the insulating film PF1 covers the upper surface of the cap insulating film HM1 covering the pattern of the conductive film PS1 to serve as the control gate electrode. Next, the insulating film PF1 is flattened by performing a chemical mechanical polishing process on the insulating film PF1, as illustrated in FIGS. 20 and 21. At this time, the cap insulating film HM1 is allowed to function as a stopper film for the chemical mechanical polishing process.

Figure 22:
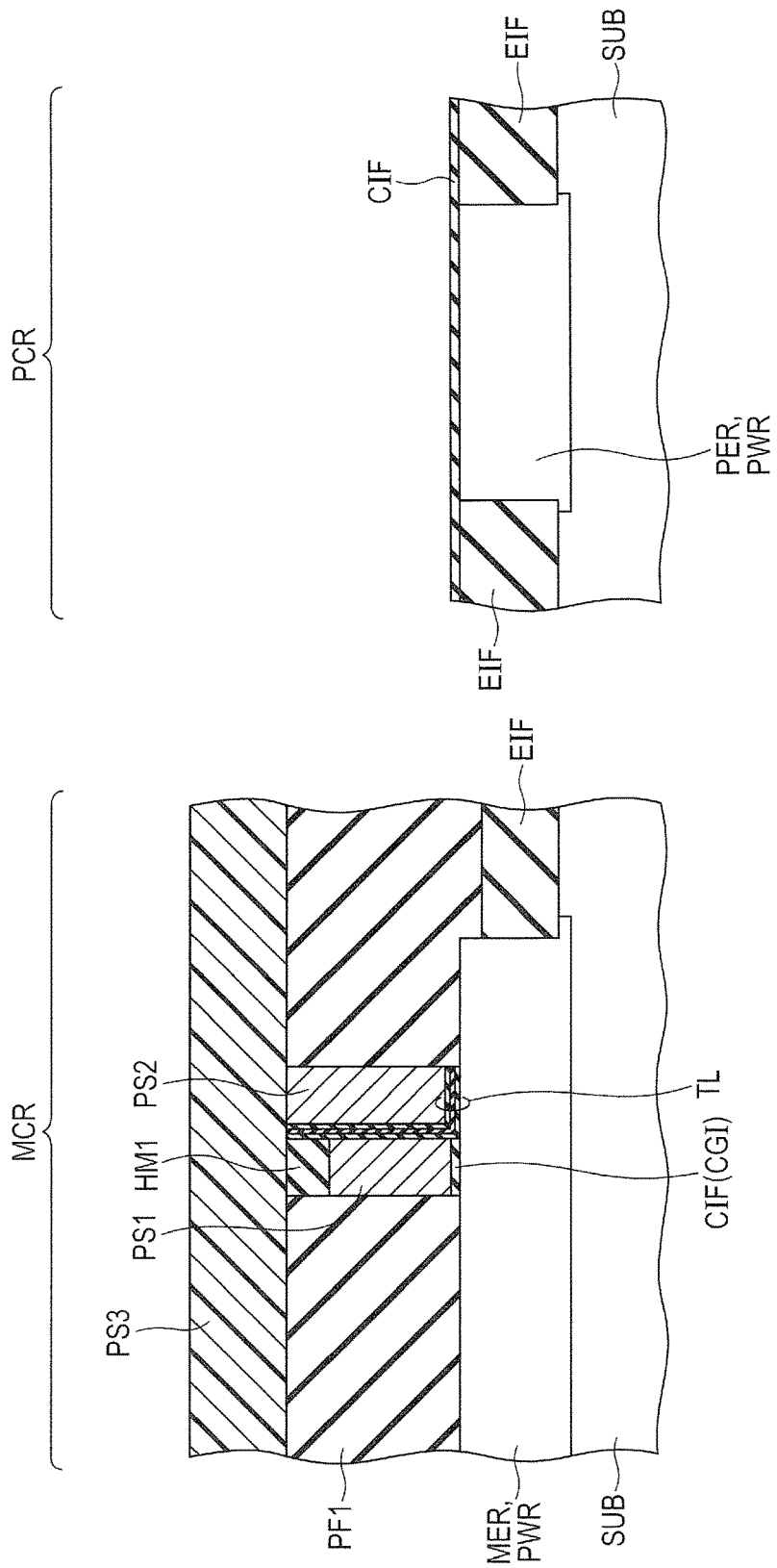
FIG. 22 is sectional views illustrating a step performed after the step illustrated in FIGS. 20 and 21 in the same embodiment, each taken along the section line corresponding to the section line III-III.
Figure 23:
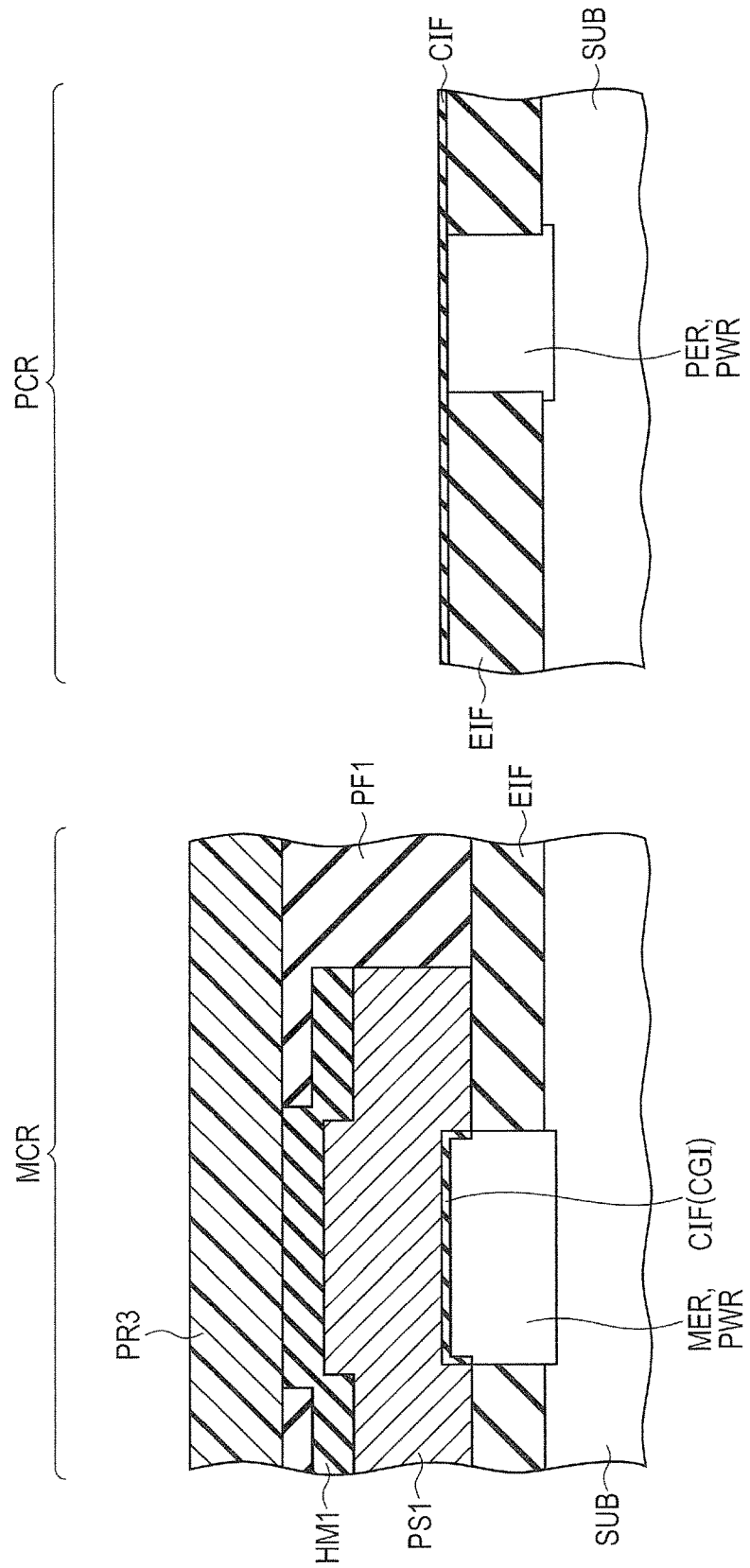
FIG. 23 is sectional views illustrating the step performed after the step illustrated in FIGS. 20 and 21 in the same embodiment, each taken along the section line corresponding to the section line IV-IV.

Next, a photoresist pattern PR3, for covering the memory cell region MCR and exposing the peripheral circuit region PCR, is formed by performing a predetermined photoengraving process, as illustrated in FIGS. 22 and 23. Next, the portions of the exposed cap insulating film HM1 and the conductive film PS1 are removed by using the photoresist pattern PR3 as an etching mask. Further, the insulating film CIF is removed. Thereafter, the photoresist pattern PR3 is removed.

Figure 24:
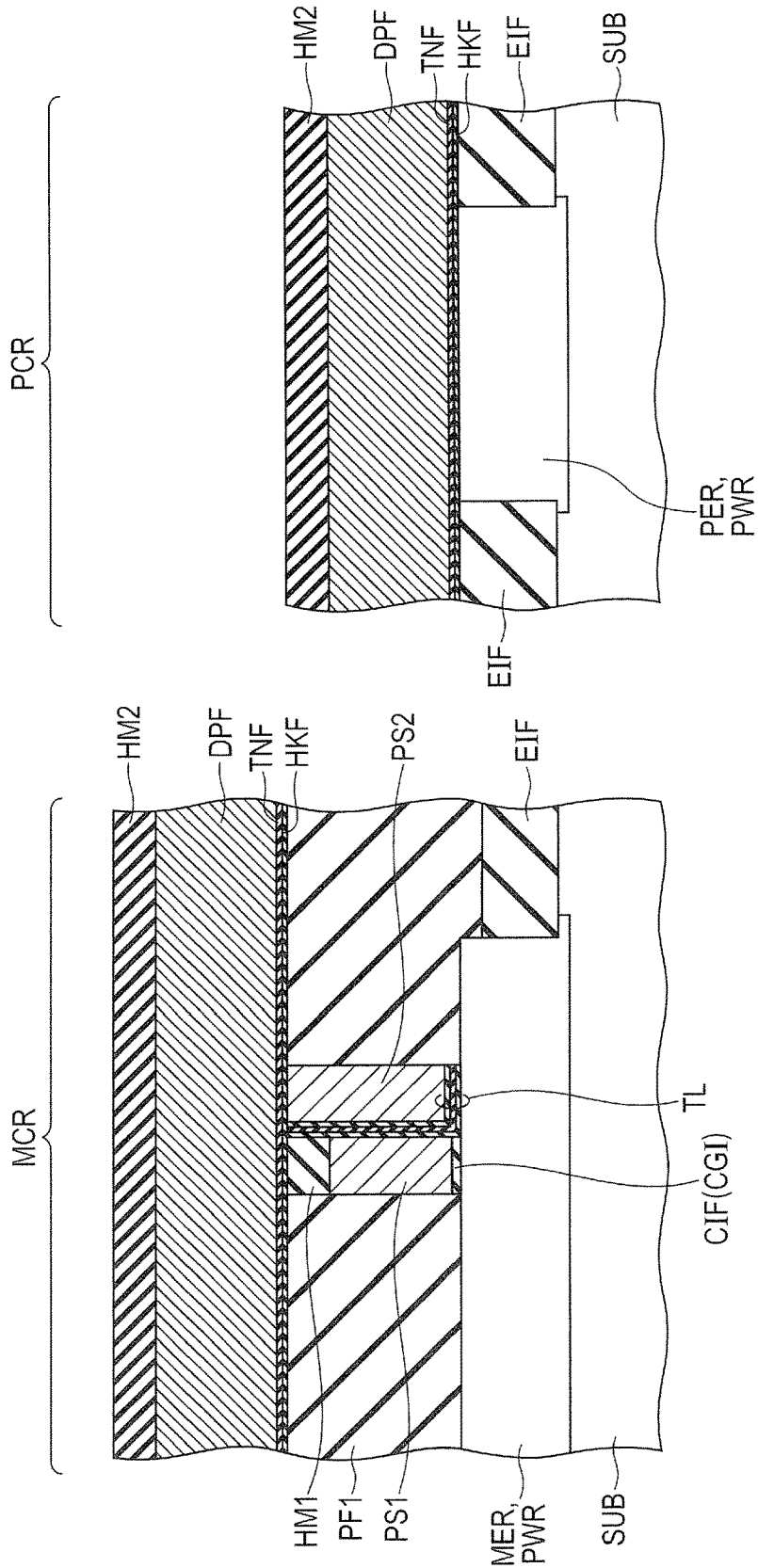
FIG. 24 is sectional views illustrating a step performed after the step illustrated in FIGS. 22 and 23 in the same embodiment, each taken along the section line corresponding to the section line III-III.
Figure 25:
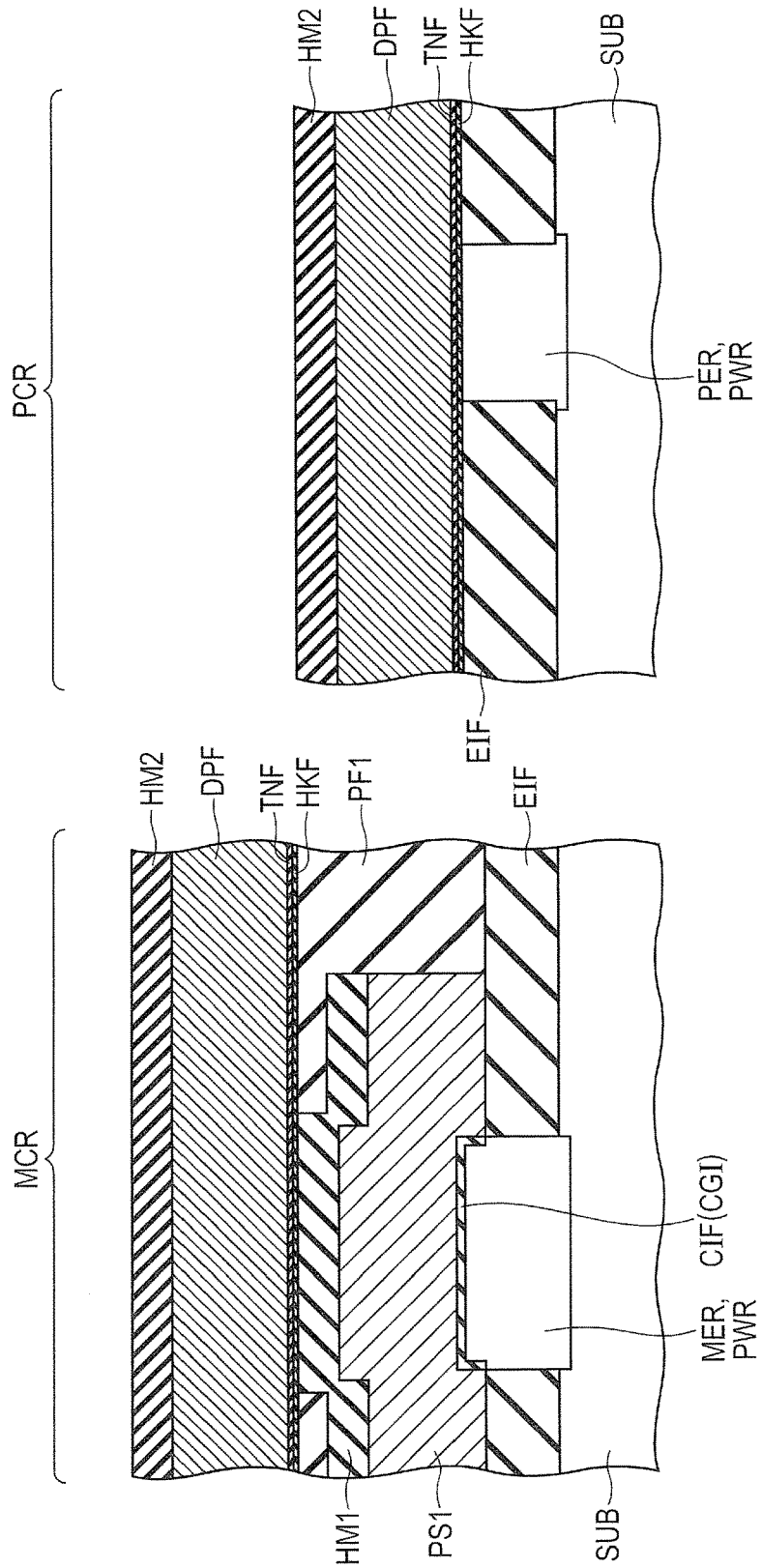
FIG. 25 is sectional views illustrating the step performed after the step illustrated in FIGS. 22 and 23 in the same embodiment, each taken along the section line corresponding to the section line IV-IV.

Next, an insulating film (not illustrated) such as a silicon oxide film having a thickness of approximately 1 nm is formed over the surface of the peripheral active region PER in the exposed peripheral circuit region PCR by, for example, a thermal oxidation process. Next, the high dielectric constant film HKF is formed as illustrated in FIGS. 24 and 25. As the high dielectric constant film HKF, a metal oxide film such as a hafnium oxide film, a zirconium oxide film, an aluminum oxide film, a tantalum oxide film, or a lanthanum oxide film can be adopted. The thickness of the high dielectric constant film HKF is, for example, approximately 1 to 3 nm. For forming the high dielectric constant film HKF, a sputtering process, an ALD process, a CVD process, or the like can be adopted.

Next, a metal film is formed over the high dielectric constant film HKF. As the metal film, the titanium nitride film TNF is formed. As the metal film, a metal film, including a metal nitride film, a metal carbide film, a tungsten film, or the like, can be adopted besides the titanium nitride film TNF. Examples of the metal nitride film include a tantalum nitride film, a tungsten nitride film, and the like. Examples of the metal carbide film include a titanium carbide film, a tantalum carbide film, a tungsten carbide film, and the like. For forming the metal film, for example, a sputtering process or the like can be adopted.

Next, a polysilicon film DPF to serve as a dummy gate electrode is formed over the titanium nitride film TNF. An insulating film HM2 to serve as a hard mask is formed over the polysilicon film DPF. The thickness of the insulating film HM2 is, for example, approximately 20 to 50 nm. For forming the insulating film HM2, for example, a CVD process can be adopted.

Figure 26:
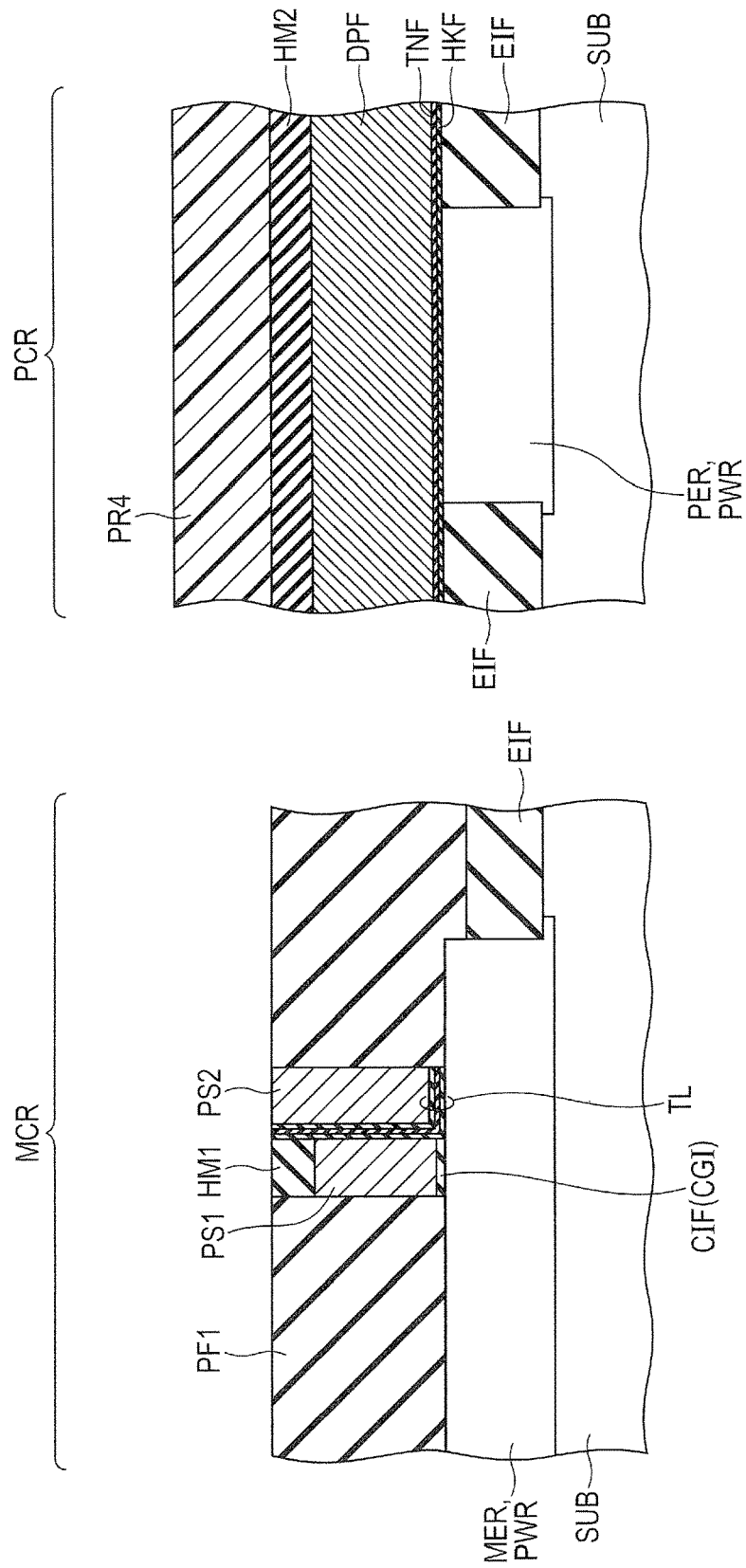
FIG. 26 is sectional views illustrating a step performed after the step illustrated in FIGS. 24 and 25 in the same embodiment, each taken along the section line corresponding to the section line III-III.
Figure 27:
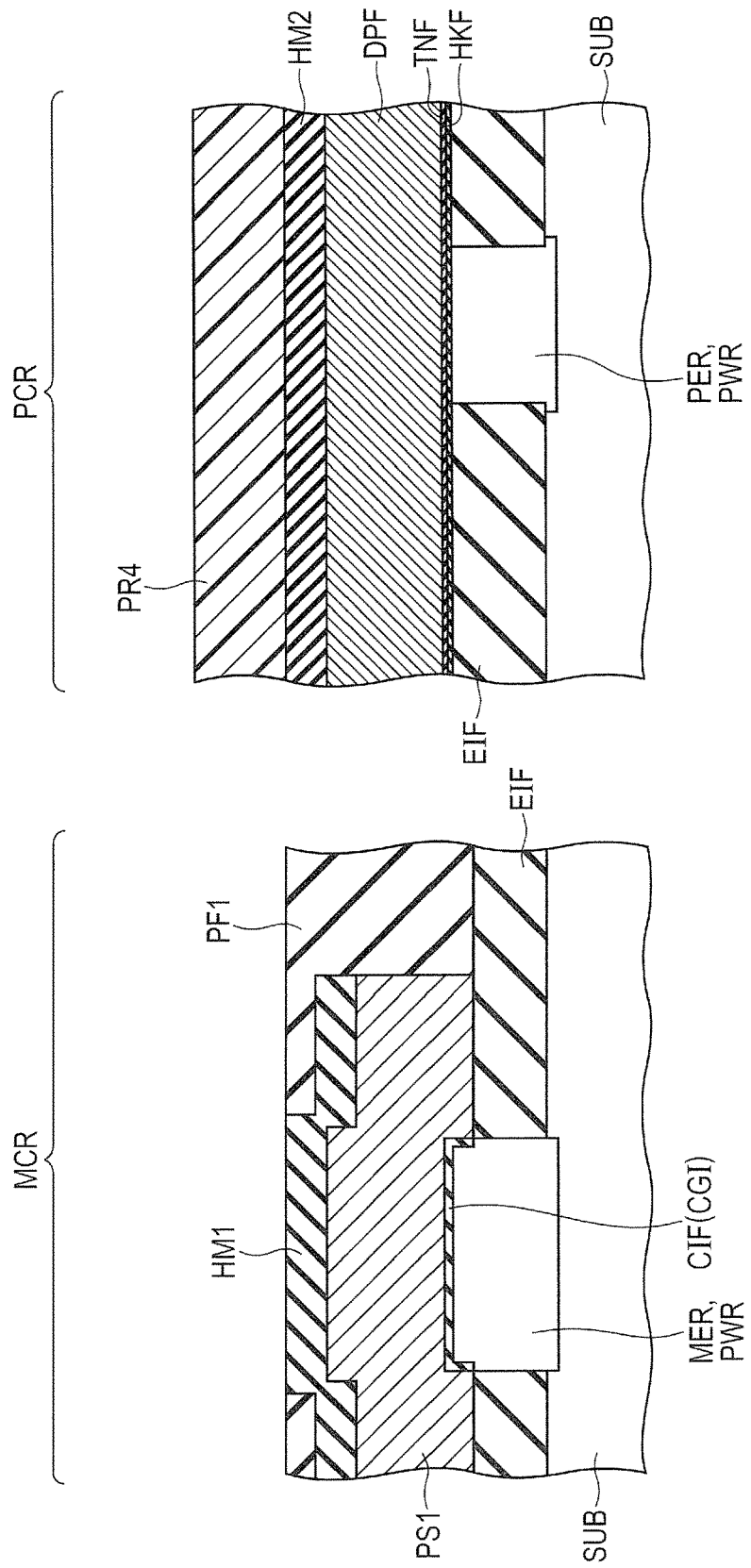
FIG. 27 is sectional views illustrating the step performed after the step illustrated in FIGS. 24 and 25 in the same embodiment, each taken along the section line corresponding to the section line IV-IV.

Next, a photoresist pattern PR4, for covering the peripheral circuit region PCR and exposing the memory cell region MCR, is formed by performing a predetermined photoengraving process, as illustrated in FIGS. 26 and 27. Next, the insulating film HM2, the polysilicon film DPF, the titanium nitride film TNF, the high dielectric constant film HKF, and the like, which are located in the memory cell region MCR, are removed by performing a dry etching process using the photoresist pattern PR4 as an etching mask. Thereafter, the photoresist pattern PR 4 is removed.

Figure 28:
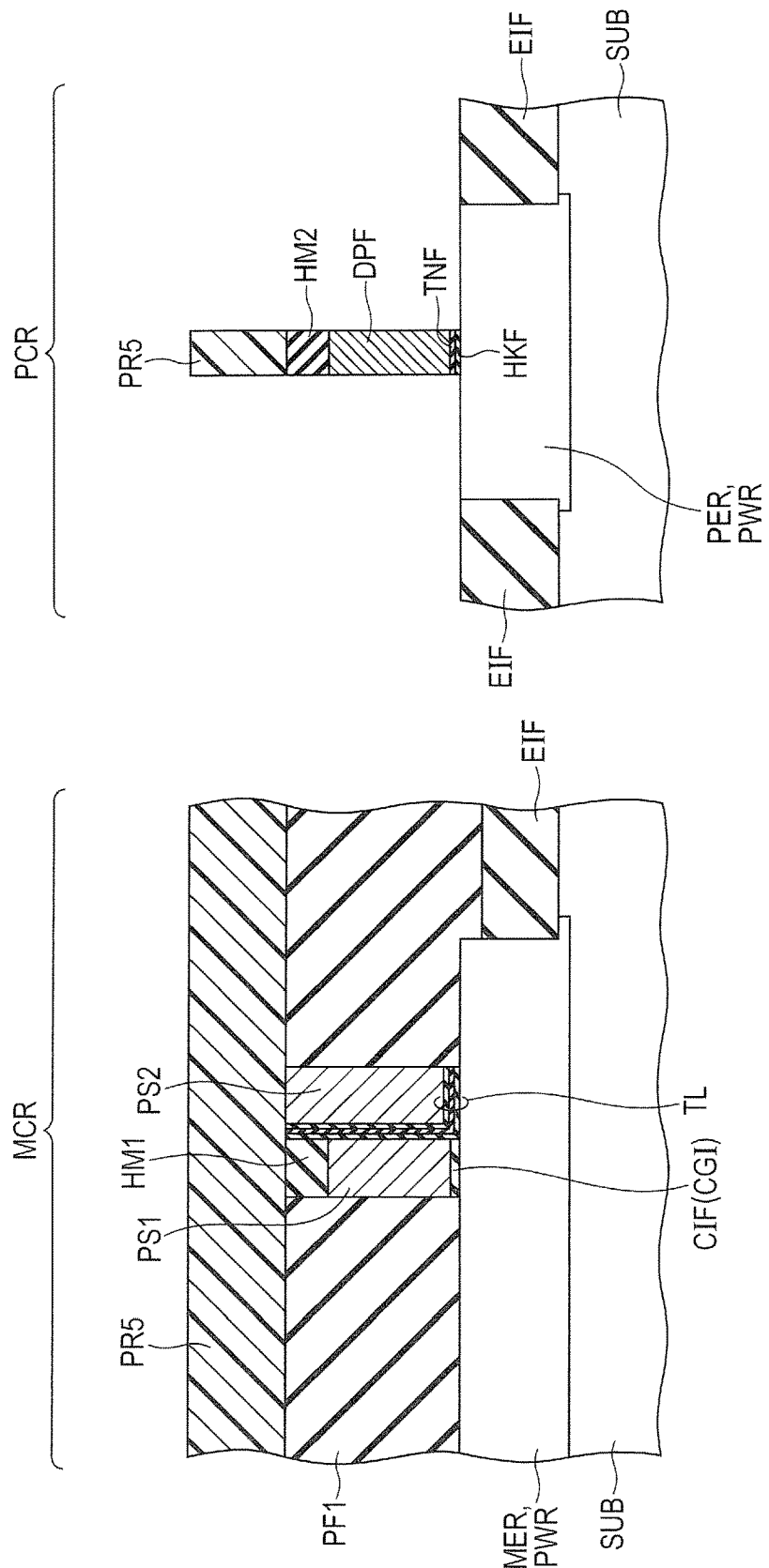
FIG. 28 is sectional views illustrating a step performed after the step illustrated in FIGS. 26 and 27 in the same embodiment, each taken along the section line corresponding to the section line III-III.
Figure 29:
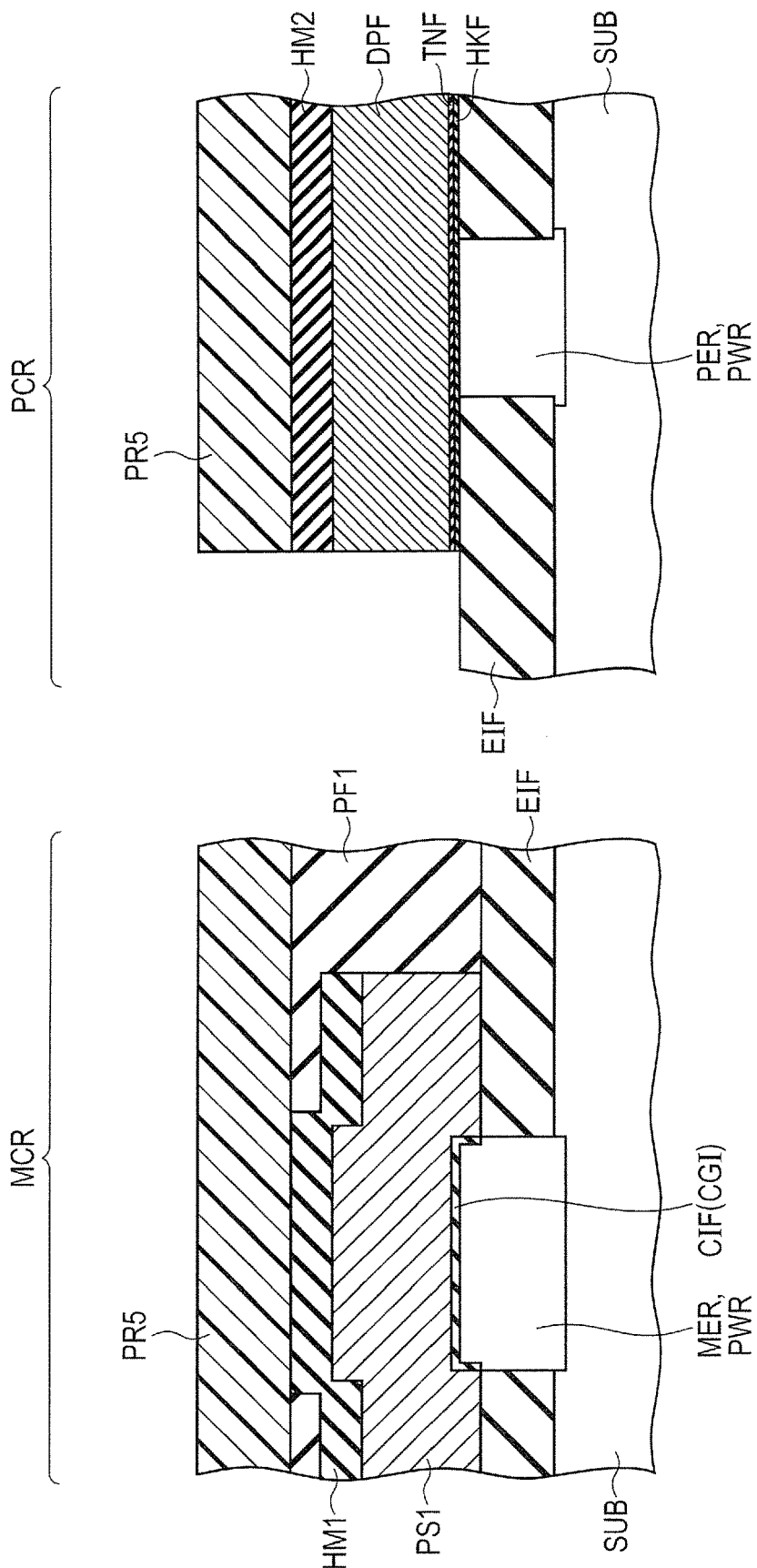
FIG. 29 is sectional views illustrating the step performed after the step illustrated in FIGS. 26 and 27 in the same embodiment, each taken along the section line corresponding to the section line IV-IV.

Next, a photoresist pattern PR5 for patterning the dummy gate is formed by performing a predetermined photoengraving process, as illustrated in FIGS. 28 and 29. Next, an etching process is performed by using the photoresist pattern PR5 as an etching mask. Thereby, the pattern of the dummy gate electrode including the polysilicon film DPF and the like is formed in the peripheral circuit region PCR. Thereafter, the photoresist pattern PR 5 is removed.

Figure 30:
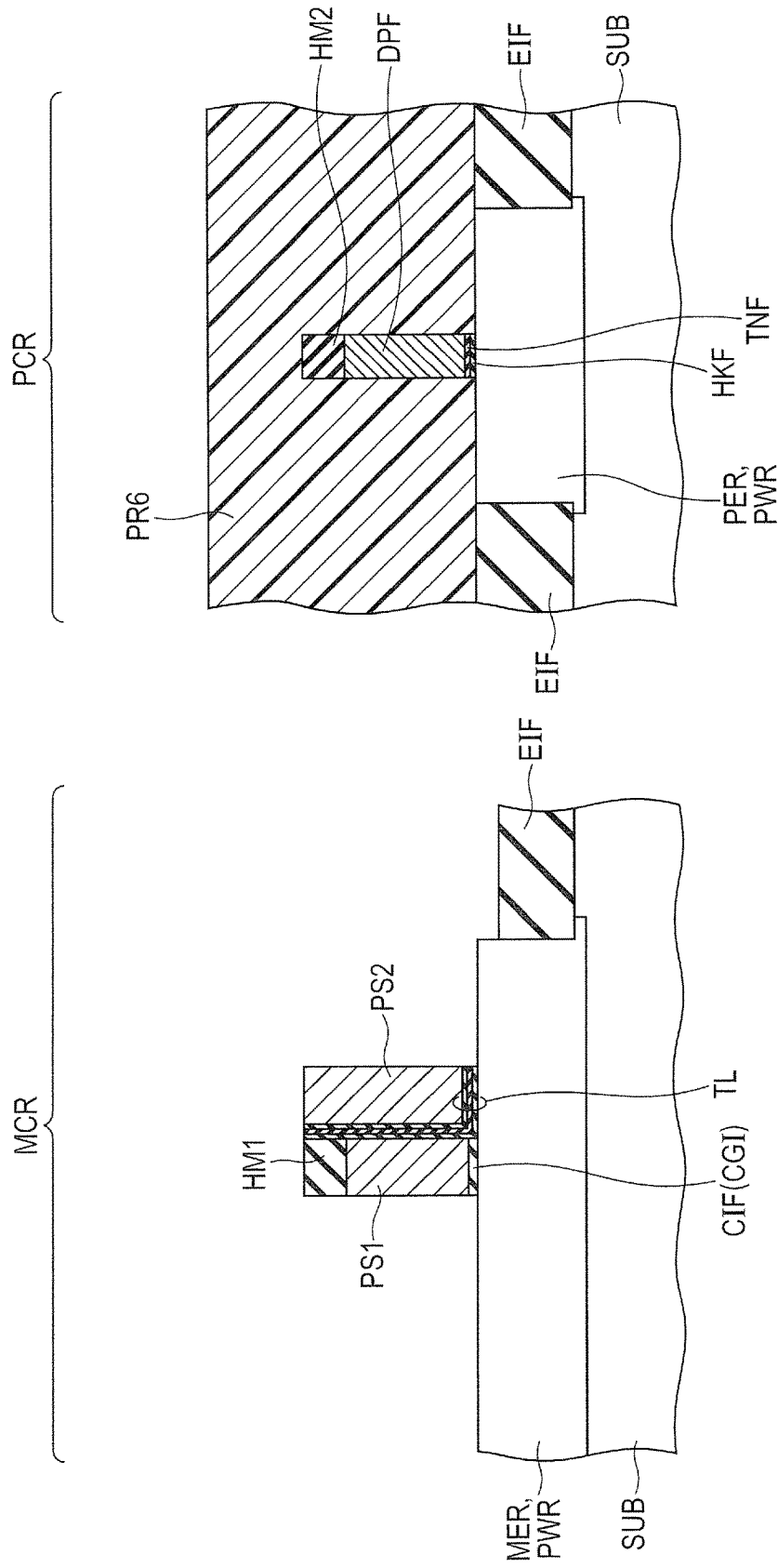
FIG. 30 is sectional views illustrating a step performed after the step illustrated in FIGS. 28 and 29 in the same embodiment, each taken along the section line corresponding to the section line III-III.
Figure 31:
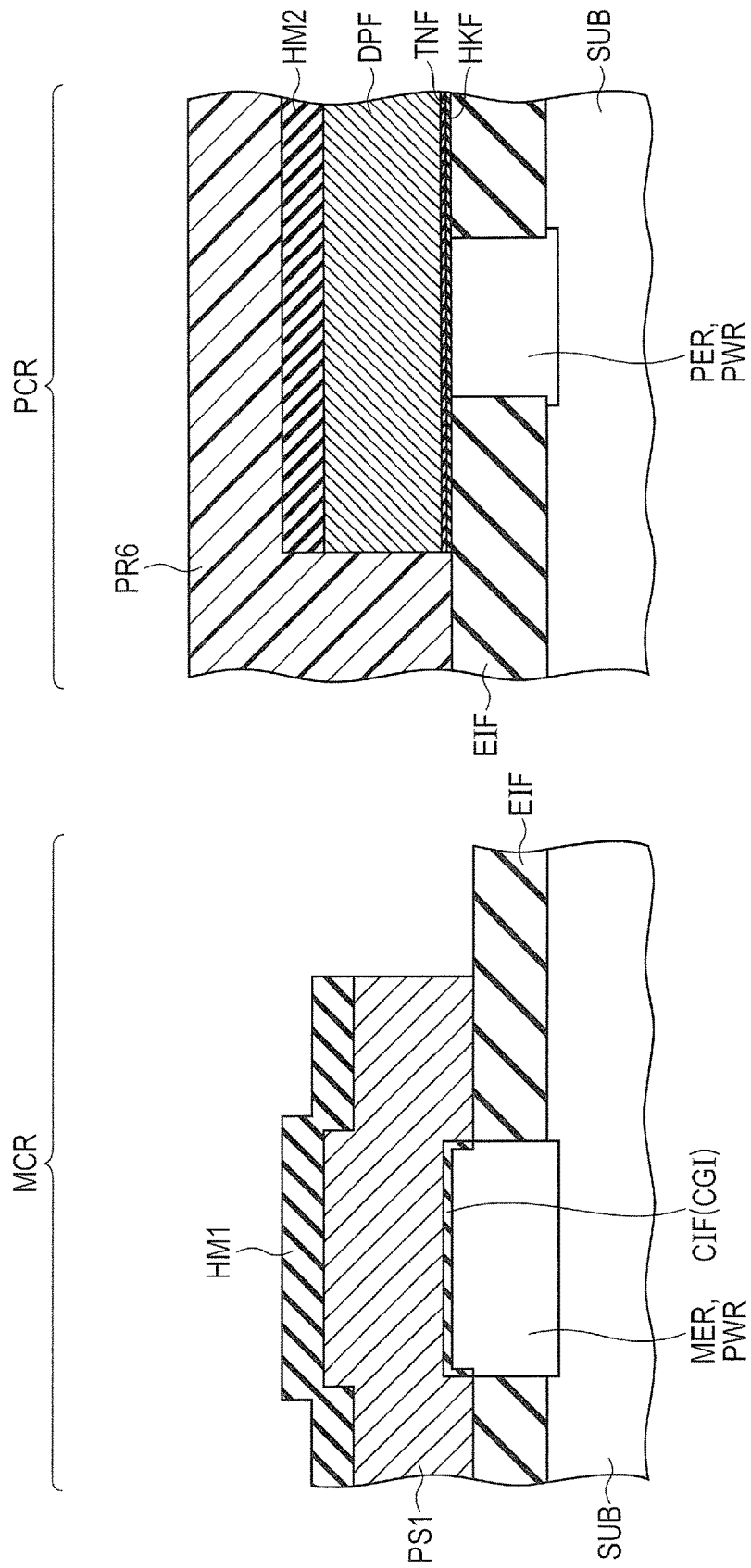
FIG. 31 is sectional views illustrating the step performed after the step illustrated in FIGS. 28 and 29 in the same embodiment, each taken along the section line corresponding to the section line IV-IV.

Next, a photoresist pattern PR6, for covering the peripheral circuit region PCR and exposing the memory cell region MCR, is formed by performing a predetermined photoengraving process, as illustrated in FIGS. 30 and 31. Next, the insulating film PF1 located in the memory cell region MCR is removed by performing an etching process using the photoresist pattern PR6 as an etching mask. Thereafter, the photoresist pattern PR6 is removed.

Figure 32:
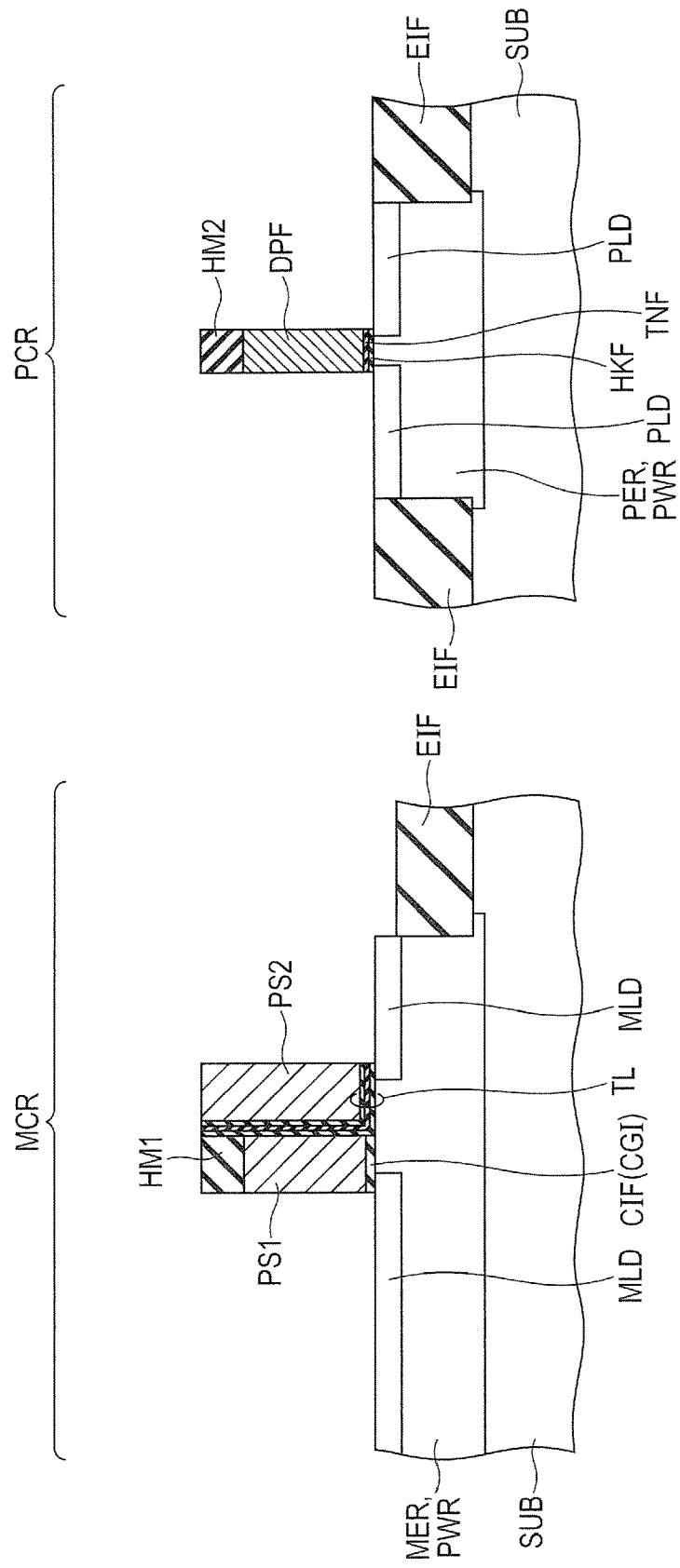
FIG. 32 is sectional views illustrating a step performed after the step illustrated in FIGS. 30 and 31 in the same embodiment, each taken along the section line corresponding to the section line III-III.
Figure 33:
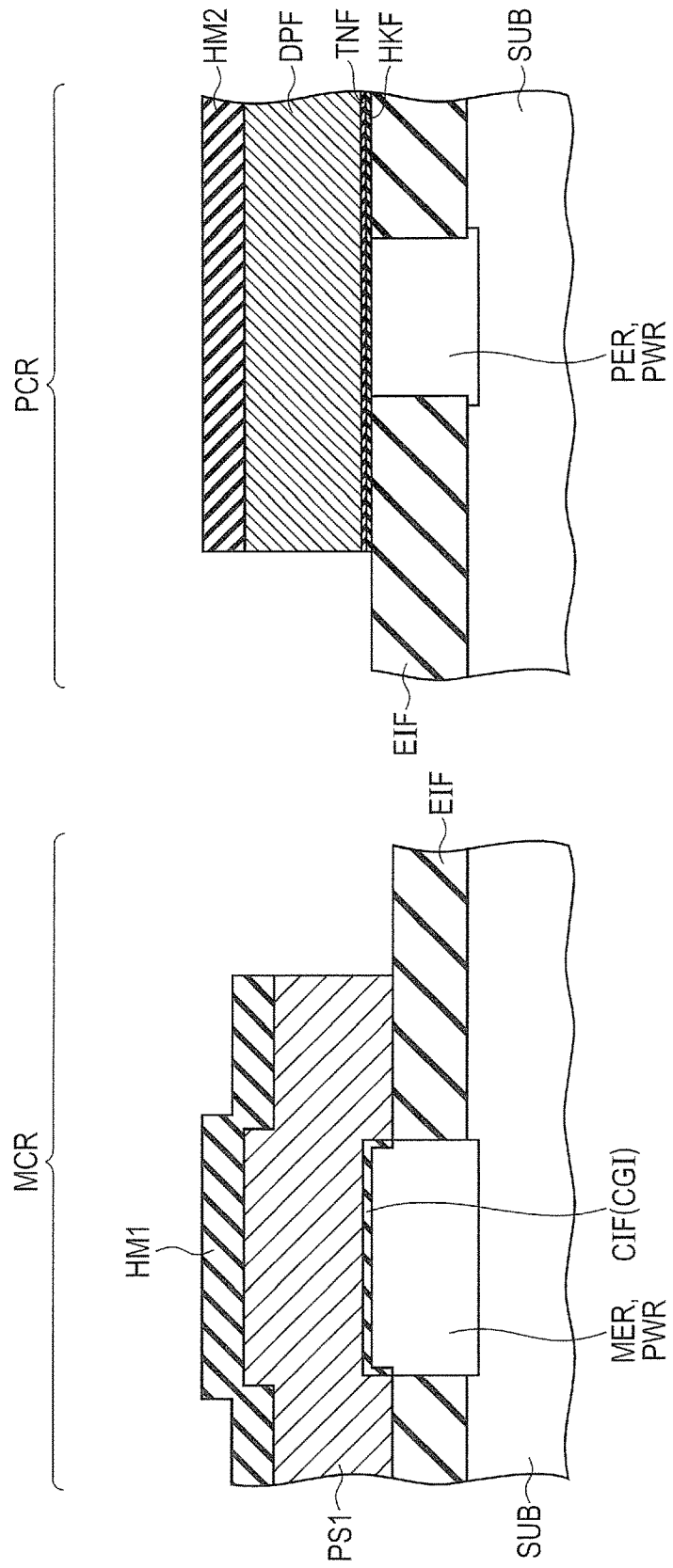
FIG. 33 is sectional views illustrating the step performed after the step illustrated in FIGS. 30 and 31 in the same embodiment, each taken along the section line corresponding to the section line IV-IV.

Next, n-type impurities are implanted by using, as implantation masks, the pattern of the conductive film PS1 to serve as the control gate electrode, the pattern of the conductive film PS2 to serve as the memory gate electrode, the pattern of the dummy gate electrode including the polysilicon film DPF and the like. Thereby, the N− diffusion layer MLD is formed, as the LDD region, in the memory active region MER, as illustrated in FIGS. 32 and 33. In the peripheral active region PER, the N− diffusion layer PLD is formed as the LDD region. At this time, the implantation conditions in which n-type impurities are implanted into the memory active region MER may be different from those in which n-type impurities are implanted into the peripheral active region PER. Also, in the memory active region MER, the implantation conditions to be adopted on the source side may be different from those to be adopted on the drain side.

Herein, before the N− diffusion layers MLD and PLD are formed, an offset spacer film (not illustrated) may be formed over each of one side surface of the pattern of the conductive film PS1, the other side surface of the pattern of the conductive film PS2, and both side surfaces of the pattern of the dummy gate electrode including the polysilicon film DPF and the like. The thickness of the offset spacer film is, for example, approximately 5 to 10 nm. For forming the offset spacer film, a CVD process can be adopted. Further, a pocket region or a halo region (neither is illustrated) may be formed in each of the memory active region MER and the peripheral active region PER.

Figure 34:
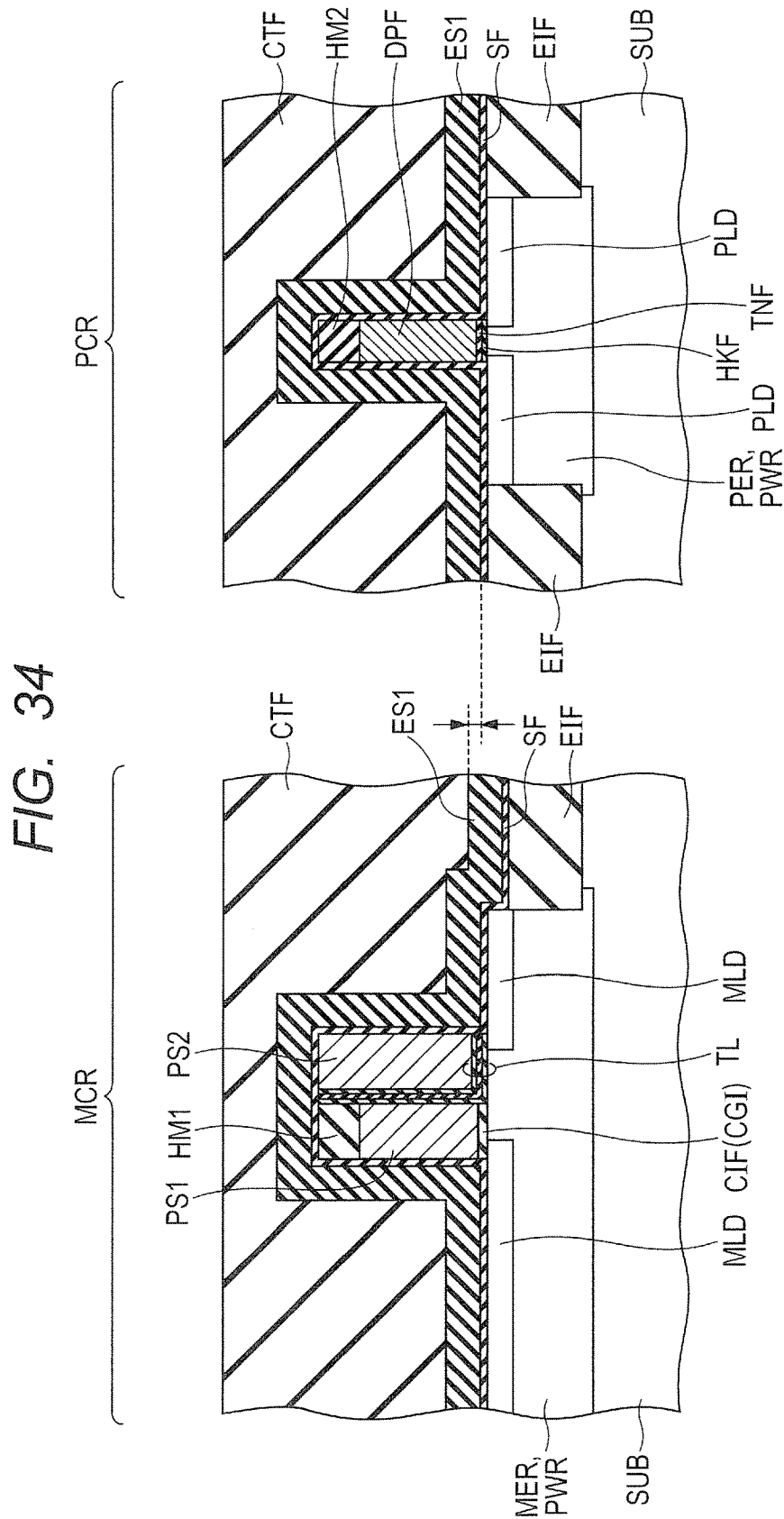
FIG. 34 is sectional views illustrating a step performed after the step illustrated in FIGS. 32 and 33 in the same embodiment, each taken along the section line corresponding to the section line III-III.
Figure 35:
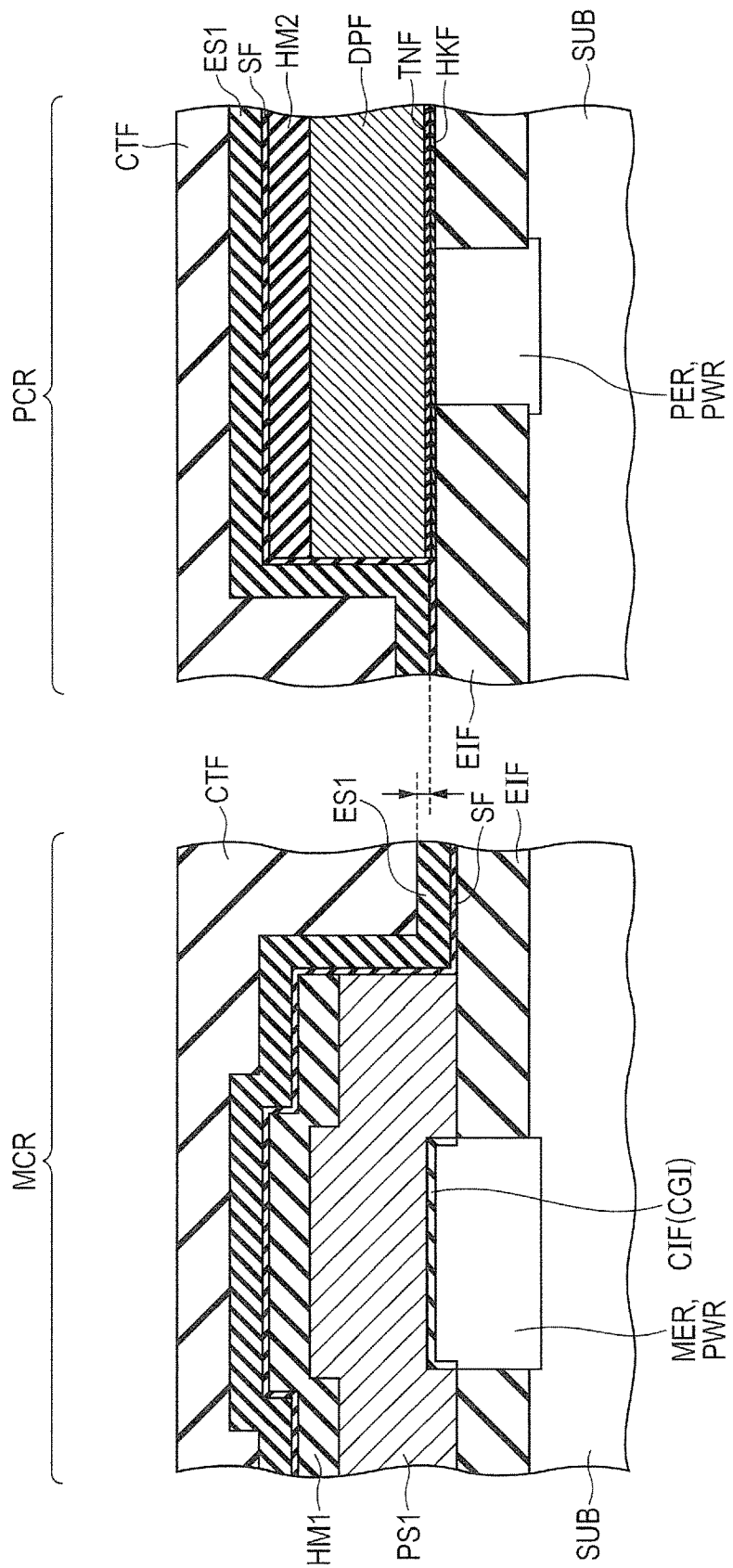
FIG. 35 is sectional views illustrating the step performed after the step illustrated in FIGS. 32 and 33 in the same embodiment, each taken along the section line corresponding to the section line IV-IV.

Next, the silicon oxide film SF is formed, as an insulating film, to cover the semiconductor substrate SUB, as illustrated in FIGS. 34 and 35. The thickness of the silicon oxide film SF is, for example, approximately 2 to 10 nm. For forming the silicon oxide film SF, for example, a CVD process can be adopted. Next, the buried silicon nitride film ES1 is formed to cover the silicon oxide film SF. The buried silicon nitride film ES1 needs to be formed such that the thickness thereof is larger than the retreat amount by which the element isolation insulating film EIF in the memory cell region MCR is retreated from the main surface of the semiconductor substrate SUB. The thickness of the buried silicon nitride film ES1 is, for example, approximately 20 to 50 nm. Herein, the buried silicon nitride film ES1 is formed such that the position of the upper surface thereof is higher than that of the upper surface of the silicon oxide film SF located in the peripheral circuit region PCR (see the dotted lines). For forming the buried silicon nitride film ES1, for example, a CVD process can be adopted. Next, a coating film CTF is formed to cover the buried silicon nitride film ES1. As the coating film CTF, for example, a photoresist or the like can be adopted.

Figure 36:
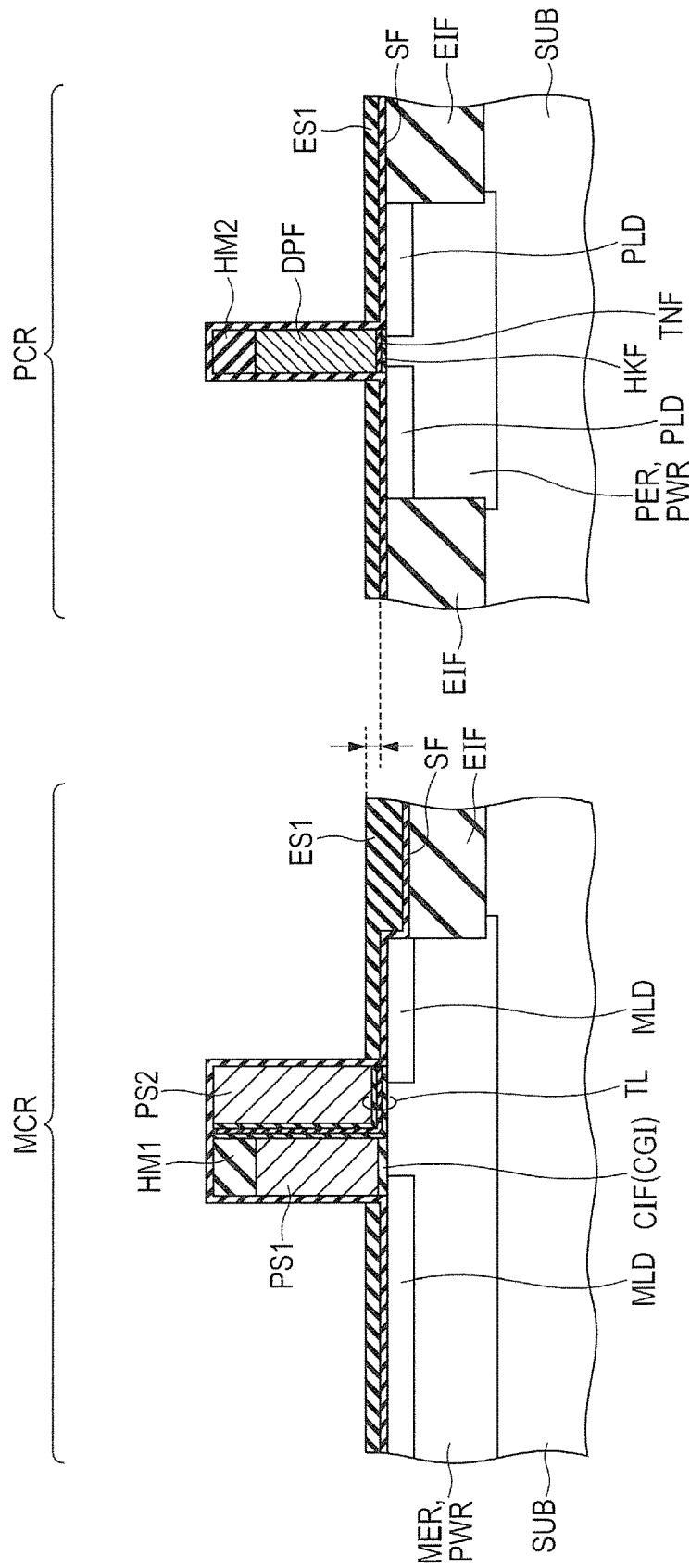
FIG. 36 is sectional views illustrating a step performed after the step illustrated in FIGS. 34 and 35 in the same embodiment, each taken along the section line corresponding to the section line III-III.
Figure 37:
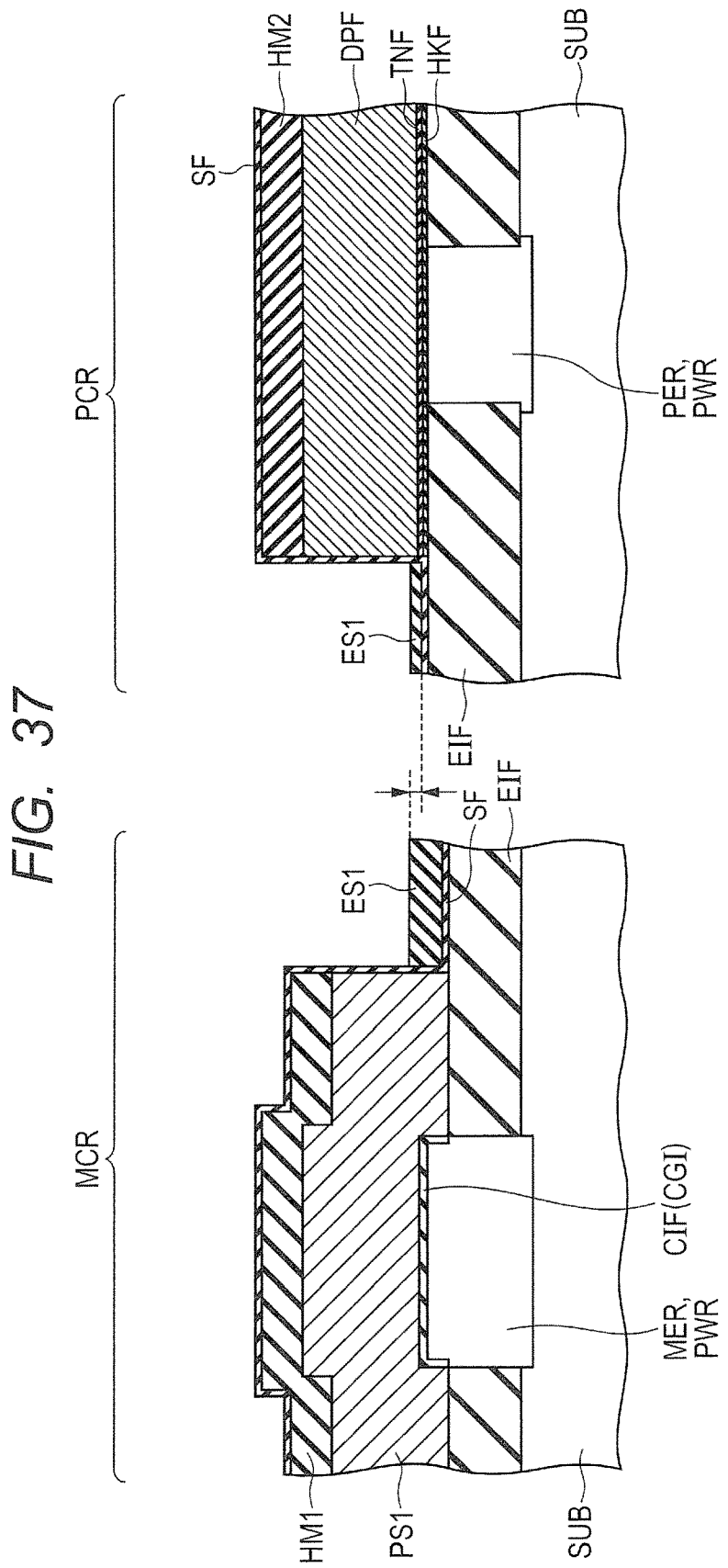
FIG. 37 is sectional views illustrating the step performed after the step illustrated in FIGS. 34 and 35 in the same embodiment, each taken along the section line corresponding to the section line IV-IV.

Next, an anisotropic etching process is performed on each of the coating film CTF and the buried silicon nitride film ES1 under predetermined etching conditions, as illustrated in FIGS. 36 and 37. The etching conditions are set such that: the etching rate of the coating film CTF is equal to that of the buried silicon nitride film ES1; and each of the coating film CTF and the buried silicon nitride film ES1 has selectivity (selection ratio) to the silicon oxide film SF including a silicon oxide film. The anisotropic etching process is stopped in a state where part of the buried silicon nitride film ES1 is left over the element isolation insulating film EIF and the like by detecting the end point of the coating film CTF while the anisotropic etching is being performed. In this case, the thickness of the remaining buried silicon nitride film ES1 can be grasped by providing a thickness monitoring pattern (not illustrated) in the peripheral circuit region PCR and by measuring the thickness of the buried silicon nitride film over the thickness monitoring pattern.

Figure 38:
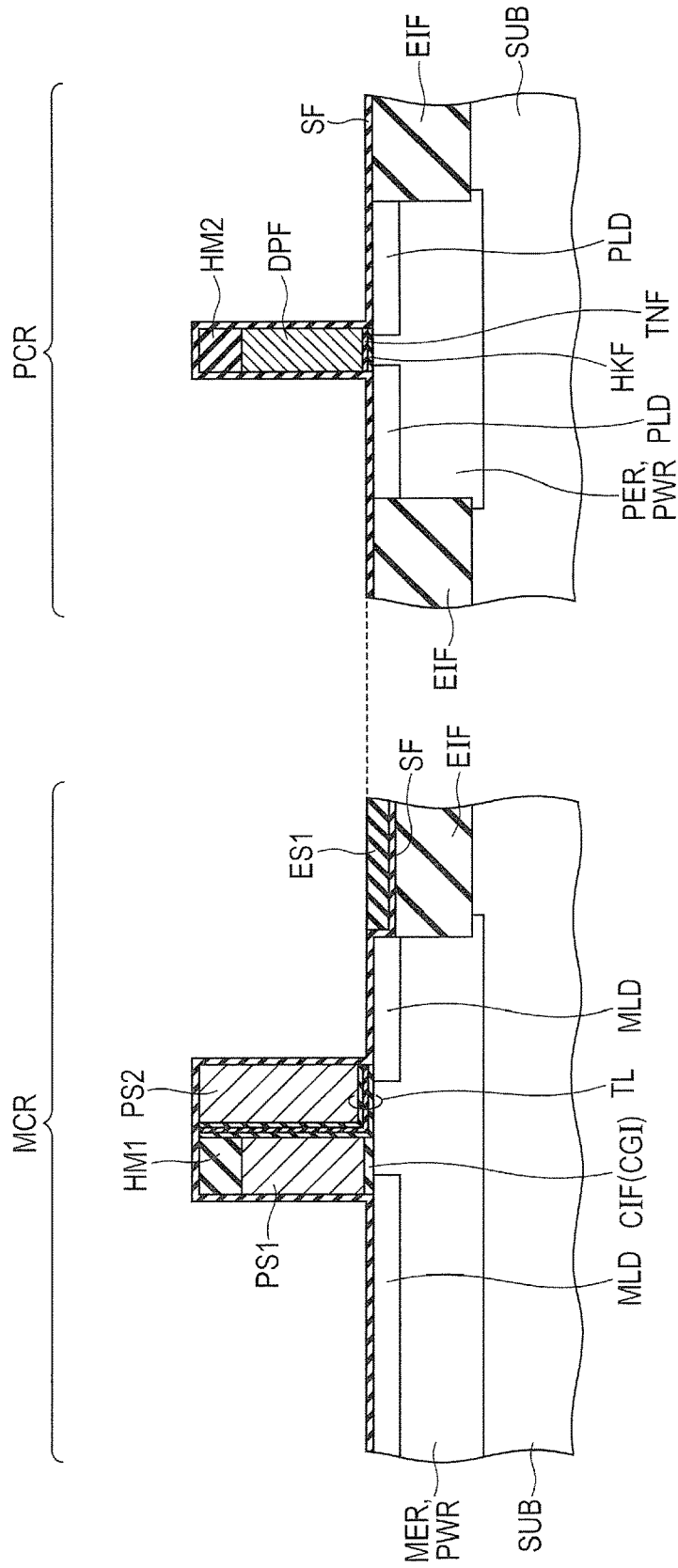
FIG. 38 is sectional views illustrating a step performed after the step illustrated in FIGS. 36 and 37 in the same embodiment, each taken along the section line corresponding to the section line III-III.
Figure 39:
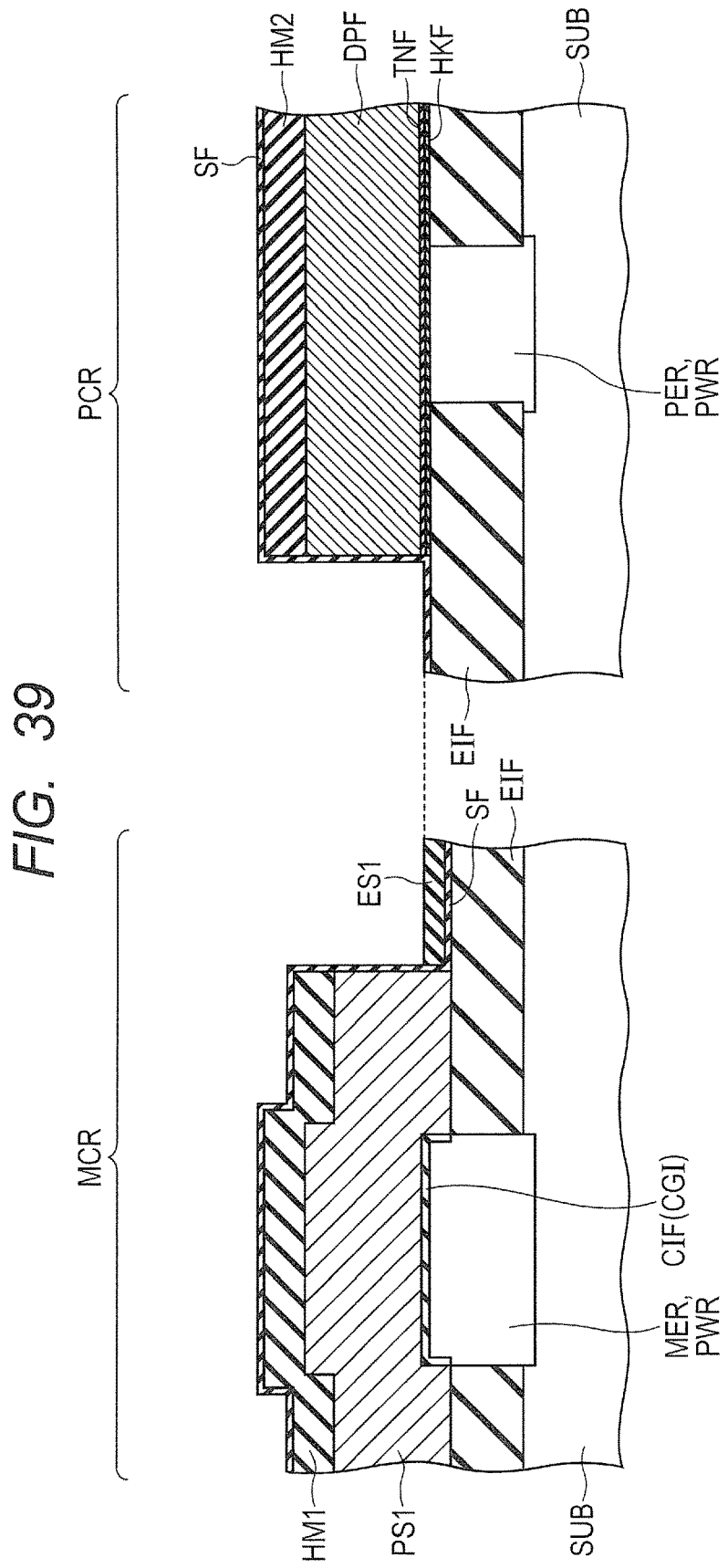
FIG. 39 is sectional views illustrating the step performed after the step illustrated in FIGS. 36 and 37 in the same embodiment, each taken along the section line corresponding to the section line IV-IV.

Next, the portion of the buried silicon nitride film ES1, located in the regions other than the region where the buried silicon nitride film ES1 is located over the element isolation insulating film EIF defining the memory active region MER, is removed by performing an etching process on the buried silicon nitride film ES1 under etching conditions in which etching selectivity (selection ratio) to the silicon oxide film SF including a silicon oxide film is further higher, as illustrated in FIGS. 38 and 39. Thus, in the memory cell region MCR, the buried silicon nitride film ES1 is left over the upper surface of the element isolation insulating film EIF retreated from the main surface of the semiconductor substrate SUB.

Figure 40:
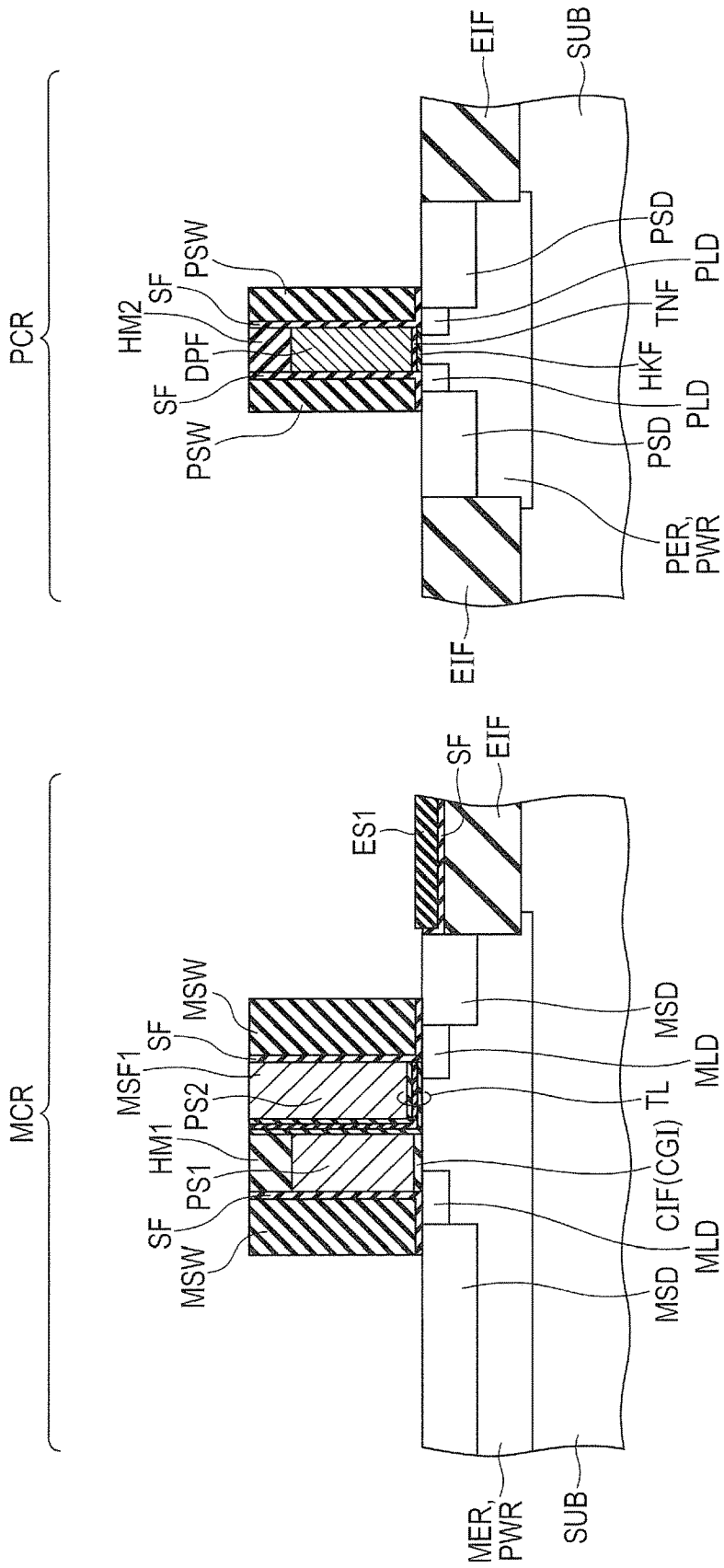
FIG. 40 is sectional views illustrating a step performed after the step illustrated in FIGS. 38 and 39 in the same embodiment, each taken along the section line corresponding to the section line III-III.
Figure 41:
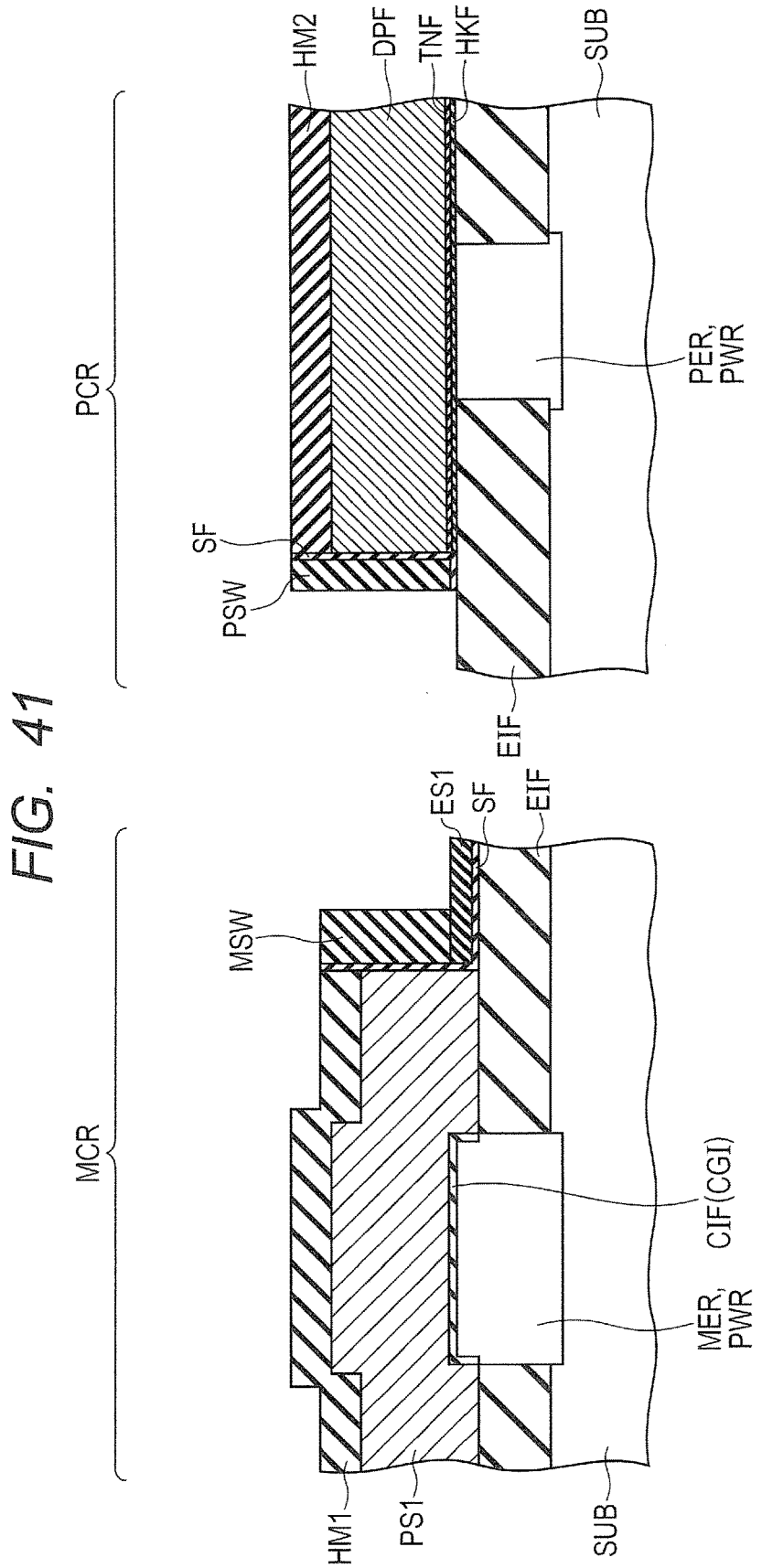
FIG. 41 is sectional views illustrating the step performed after the step illustrated in FIGS. 38 and 39 in the same embodiment, each taken along the section line corresponding to the section line IV-IV.

Next, the sidewall spacer film MSW is formed, in the memory cell region MCR, over the side surface of the pattern of the conductive film PS1 to serve as the control gate electrode, as illustrated in FIGS. 40 and 41. Also, the sidewall spacer film MSW is formed over the side surface of the pattern of the conductive film PS2 to serve as the memory gate electrode. In the peripheral circuit region PCR, the sidewall spacer film PSW is formed over the side surface of the dummy gate electrode including the pattern of the polysilicon film DPF. The sidewall spacer film MSW is formed by forming a desired insulating film (not illustrated) so as to cover the semiconductor substrate SUB and by performing anisotropic etching on the insulating film. The sidewall spacer film PSW is formed by forming a desired insulating film (not illustrated) so as to cover the semiconductor substrate SUB and by performing anisotropic etching on the insulating film. Herein, the width of the sidewall spacer film MSW may be different from that of the sidewall spacer film PSW.

The silicon oxide film SF, located over the memory active region MER, the element isolation insulating film EIF defining the peripheral active region PER, and the like, are removed by forming the sidewall spacer films MSW and PSW. Thereby, the position of the upper surface of the buried silicon nitride film ES1 becomes higher than that of the upper surface of the element isolation insulating film EIF defining the peripheral active region PER.

Figure 42:
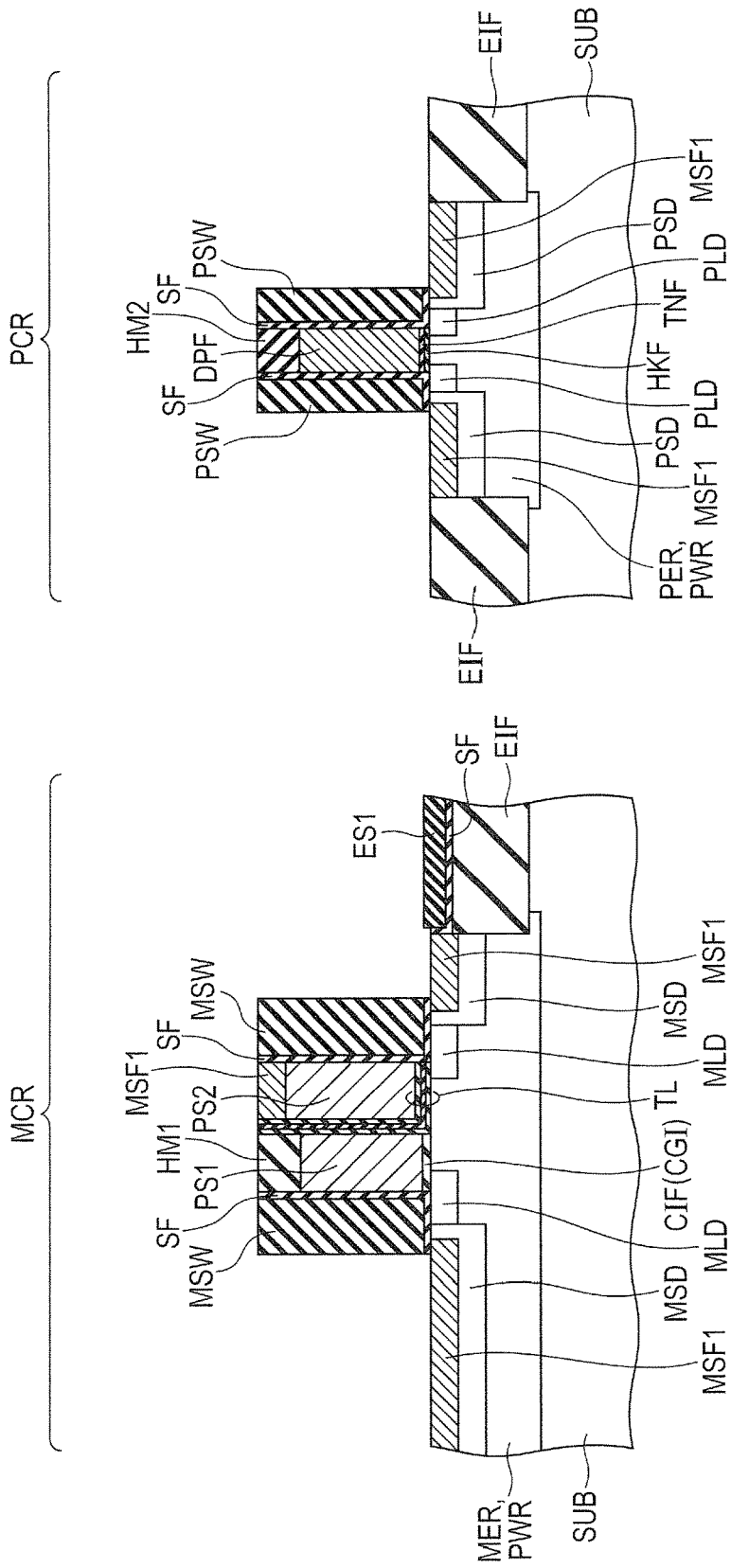
FIG. 42 is sectional views illustrating a step performed after the step illustrated in FIGS. 40 and 41 in the same embodiment, each taken along the section line corresponding to the section line III-III.
Figure 43:
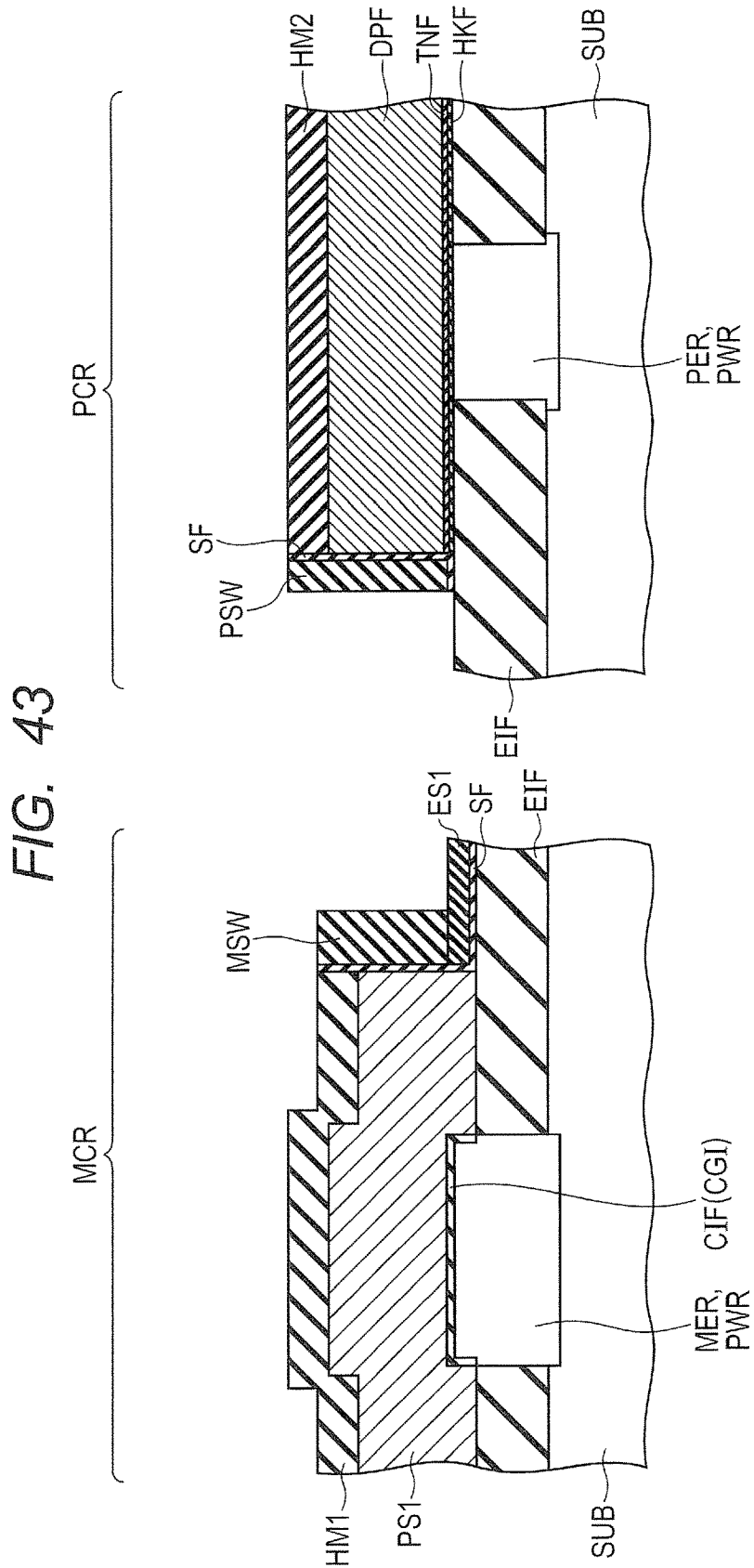
FIG. 43 is sectional views illustrating the step performed after the step illustrated in FIGS. 40 and 41 in the same embodiment, each taken along the section line corresponding to the section line IV-IV.

Next, n-type impurities are implanted by using, as implantation masks, the sidewall spacer film MSW and the like in the memory cell region MCR and the sidewall spacer film PSW and the like in the peripheral circuit region PCR. Thereby, the N+ diffusion layer MSD is formed in the memory active region MER, as illustrated in FIGS. 42 and 43. In the peripheral active region PER, the N+ diffusion layer PSD is formed. At this time, the implantation conditions in which n-type impurities are implanted into the memory active region MER may be different from those in which n-type impurities are implanted into the peripheral active region PER. Also, in the memory active region MER, the implantation conditions to be adopted on the source side may be different from those to be adopted on the drain side. Thereafter, an annealing process is performed.

Next, the metal silicide layer MSF1 is formed by, for example, a salicide process. The metal silicide layer MSF1 is formed over each of the surface of the N+ diffusion layer MSD, the surface of the N+ diffusion layer PSD, and the upper surface of the pattern of the conductive film PS2 to serve as the memory gate electrode. As the metal silicide layer MSF1, for example, a cobalt silicide layer, a nickel silicide layer, or a platinum-added nickel silicide layer can be formed.

Figure 44:
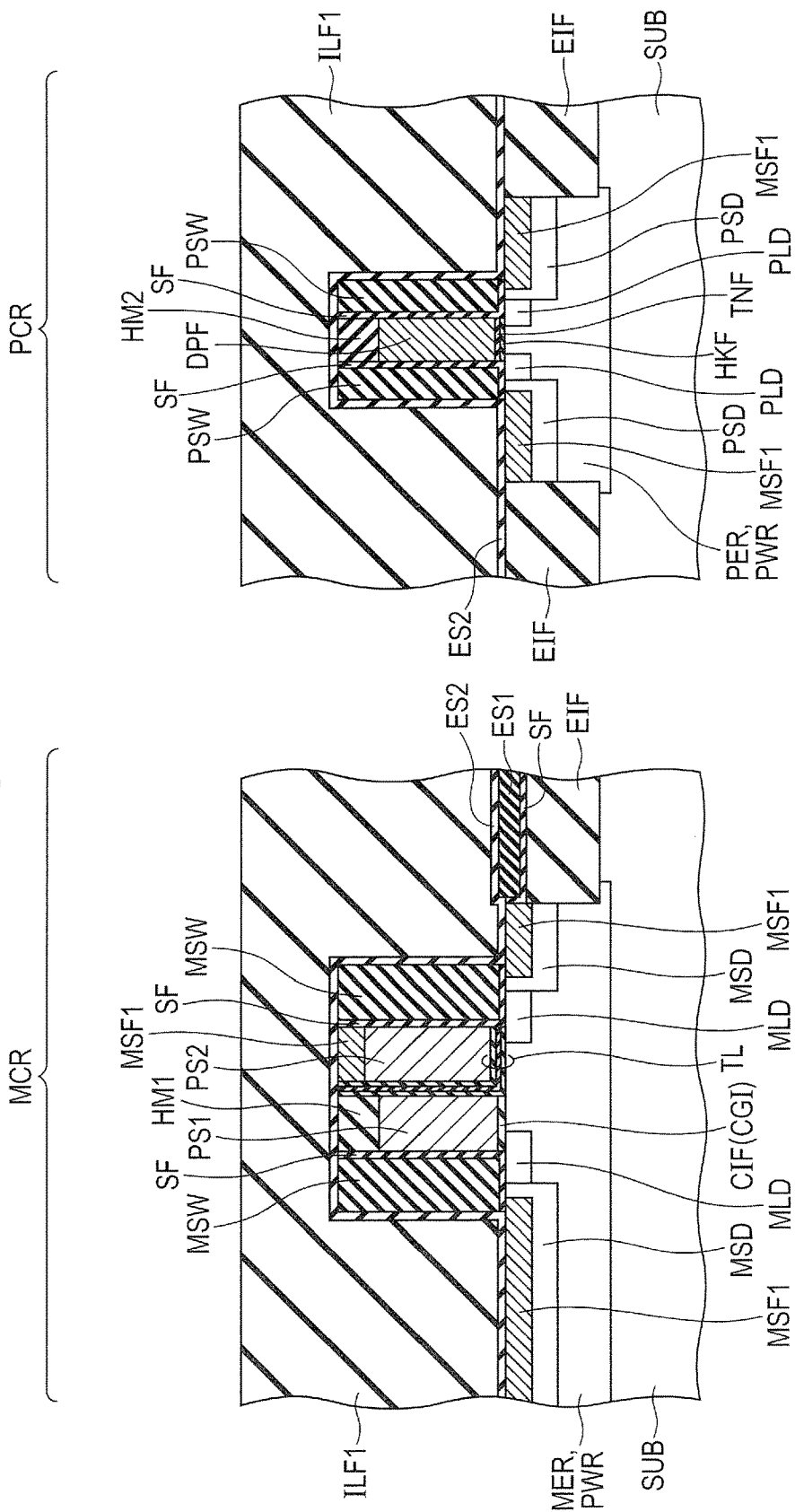
FIG. 44 is sectional views illustrating a step performed after the step illustrated in FIGS. 42 and 43 in the same embodiment, each taken along the section line corresponding to the section line III-III.
Figure 45:
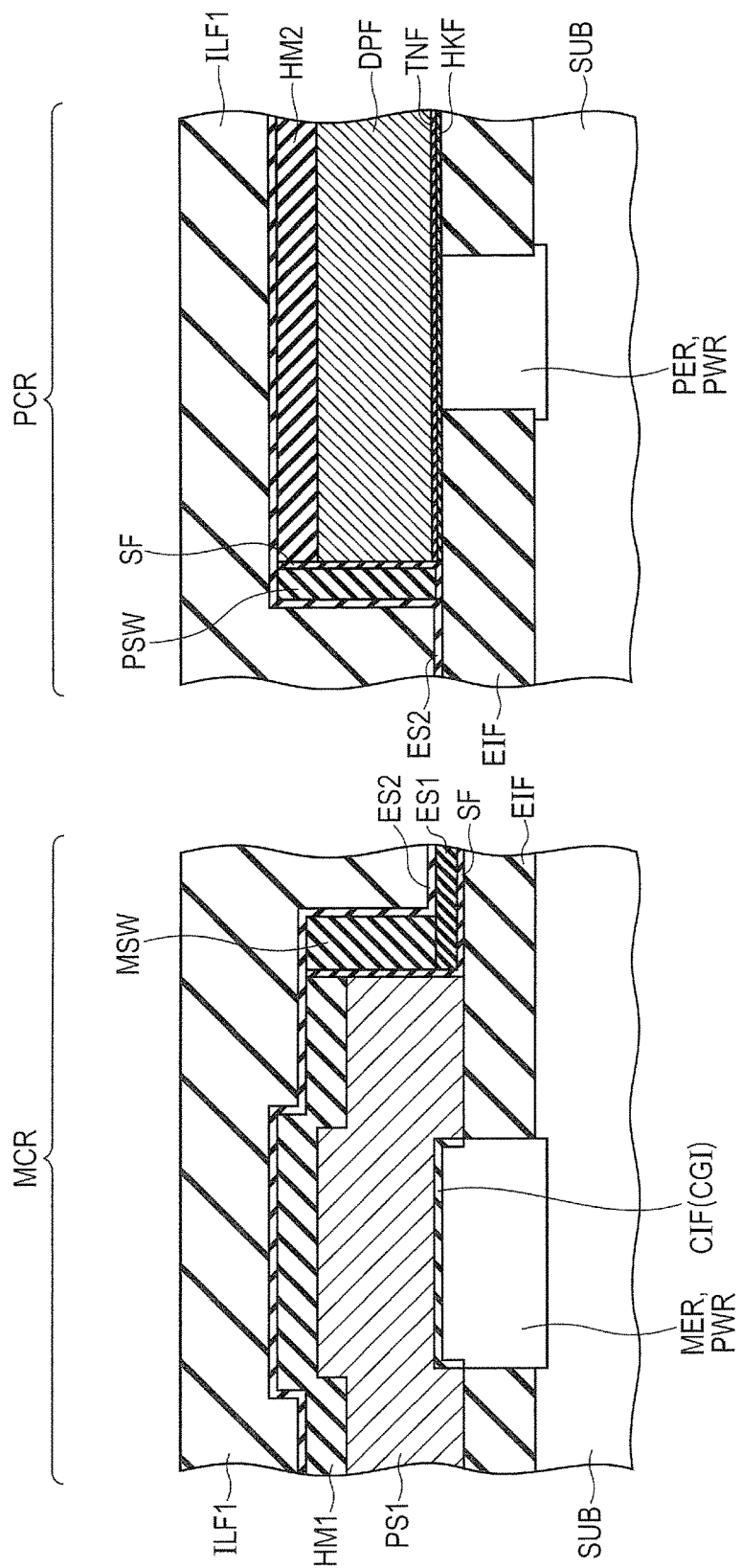
FIG. 45 is sectional views illustrating the step performed after the step illustrated in FIGS. 42 and 43 in the same embodiment, each taken along the section line corresponding to the section line IV-IV.

Next, the etching stopper film ES2 is formed to cover the semiconductor substrate SUB, as illustrated in FIGS. 44 and 45. Next, the interlayer insulating film ILF1 is formed to cover the etching stopper film ES2. As the etching stopper film ES2, a silicon nitride film is formed. For forming the etching stopper film ES2, a CVD process can be adopted. As the interlayer insulating film ILF1, a silicon oxide film is formed. For forming the interlayer insulating film ILF1, a CVD process can be adopted.

Figure 46:
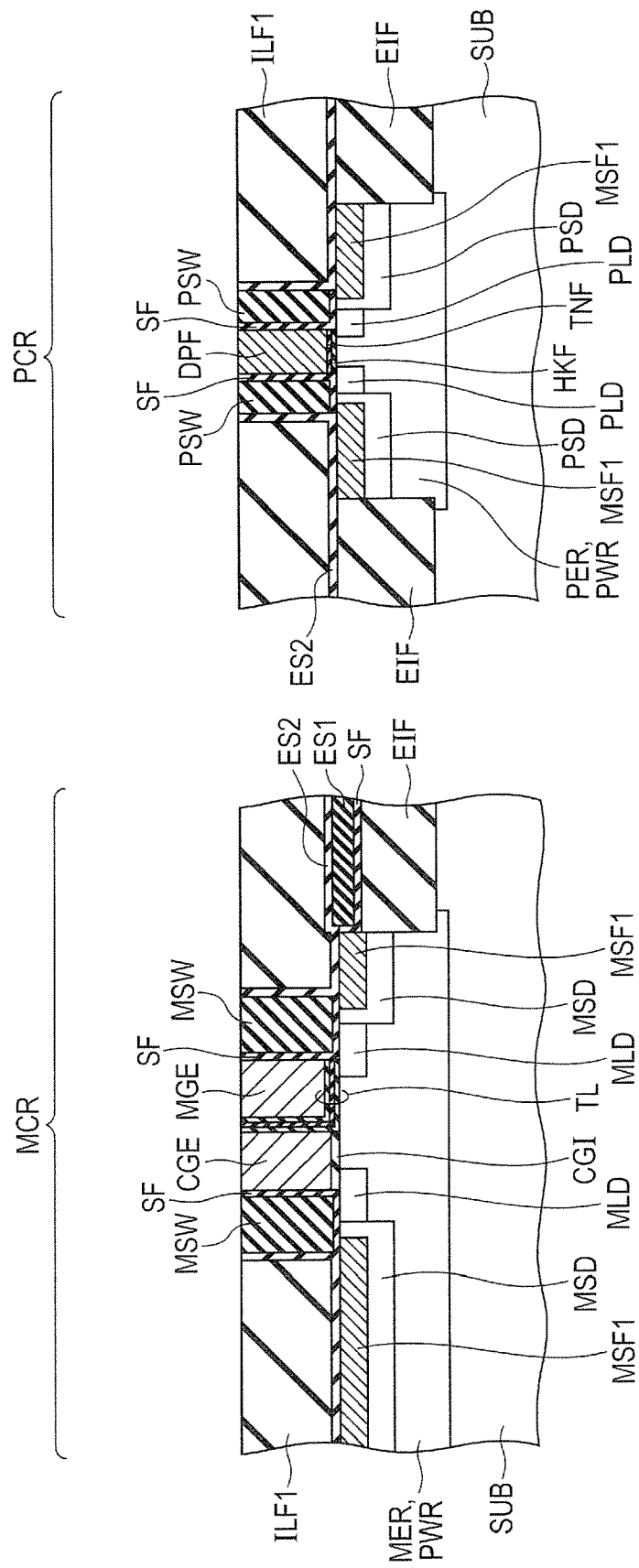
FIG. 46 is sectional views illustrating a step performed after the step illustrated in FIGS. 44 and 45 in the same embodiment, each taken along the section line corresponding to the section line III-III.
Figure 47:
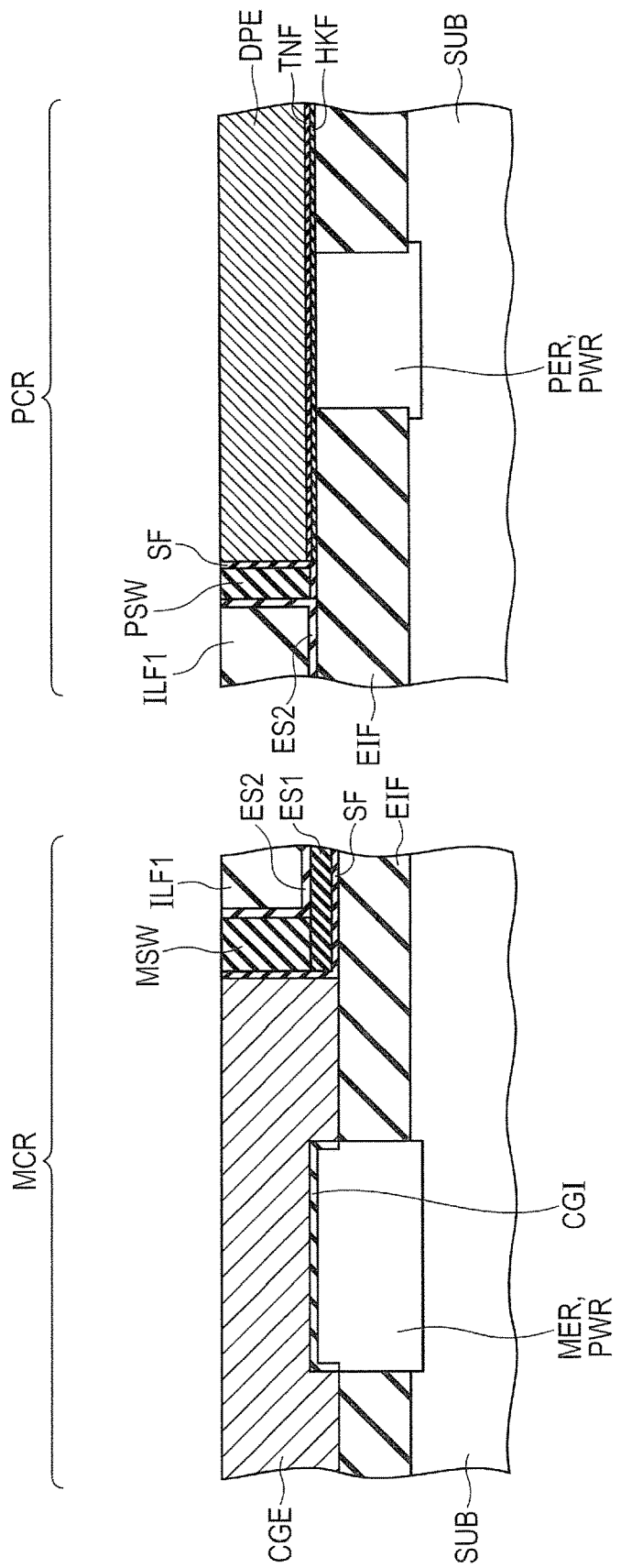
FIG. 47 is sectional views illustrating the step performed after the step illustrated in FIGS. 44 and 45 in the same embodiment, each taken along the section line corresponding to the section line IV-IV.

Next, the interlayer insulating film ILF1 is flattened by performing a chemical mechanical polishing process, as illustrated in FIGS. 46 and 47. The cap insulating film HM1, the metal silicide layer MSF1 over the conductive film PS2, and the insulating film HM2 are removed by flattening the interlayer insulating film ILF1. Each of the pattern of the conductive film PS1 to serve as the control gate electrode, the pattern of the conductive film PS2 to serve as the memory gate electrode, and the pattern of the polysilicon film DPF as the dummy gate electrode is exposed by flattening the interlayer insulating film ILF1. Thereby, the control gate electrode CGE and the memory gate electrode MGE are formed in the memory cell region MCR. The control gate electrode CGE is formed, via the control gate insulating film CGI (CIF), over the surface of the well region PWR.

Figure 48:
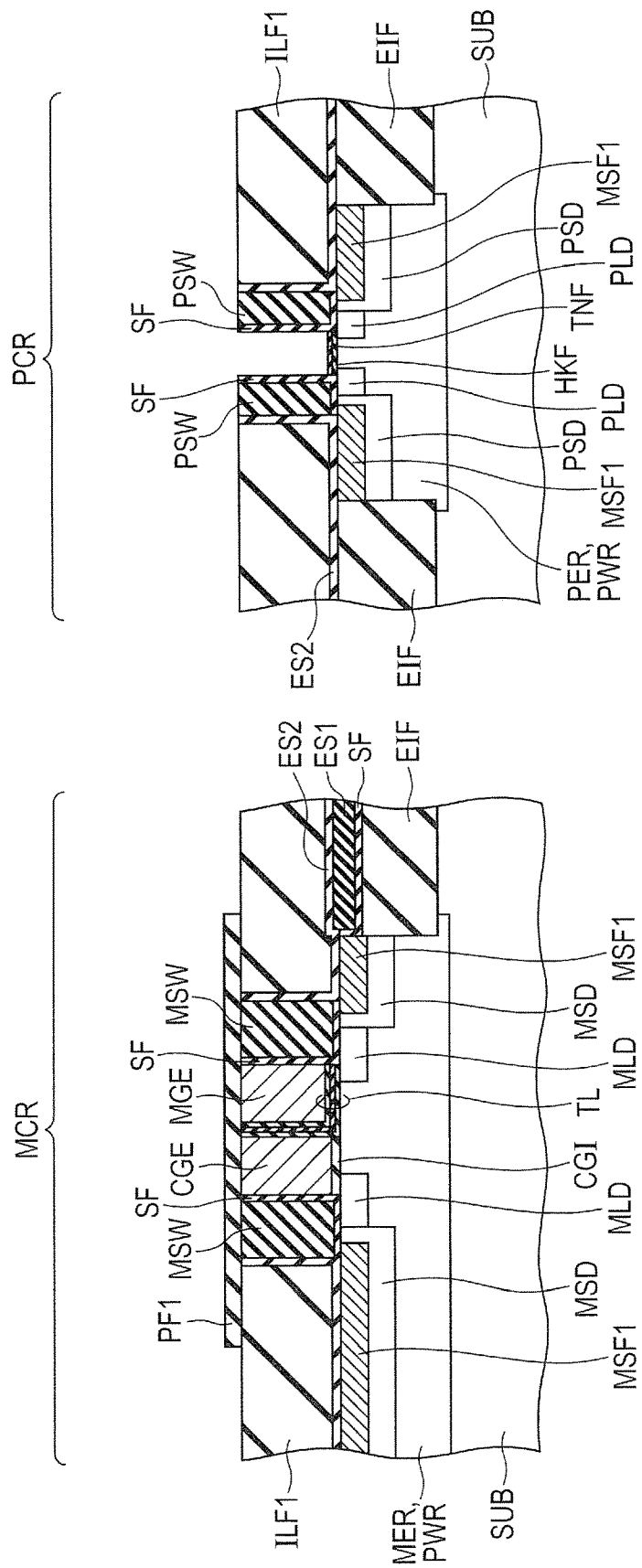
FIG. 48 is sectional views illustrating a step performed after the step illustrated in FIGS. 46 and 47 in the same embodiment, each taken along the section line corresponding to the section line III-III.
Figure 49:
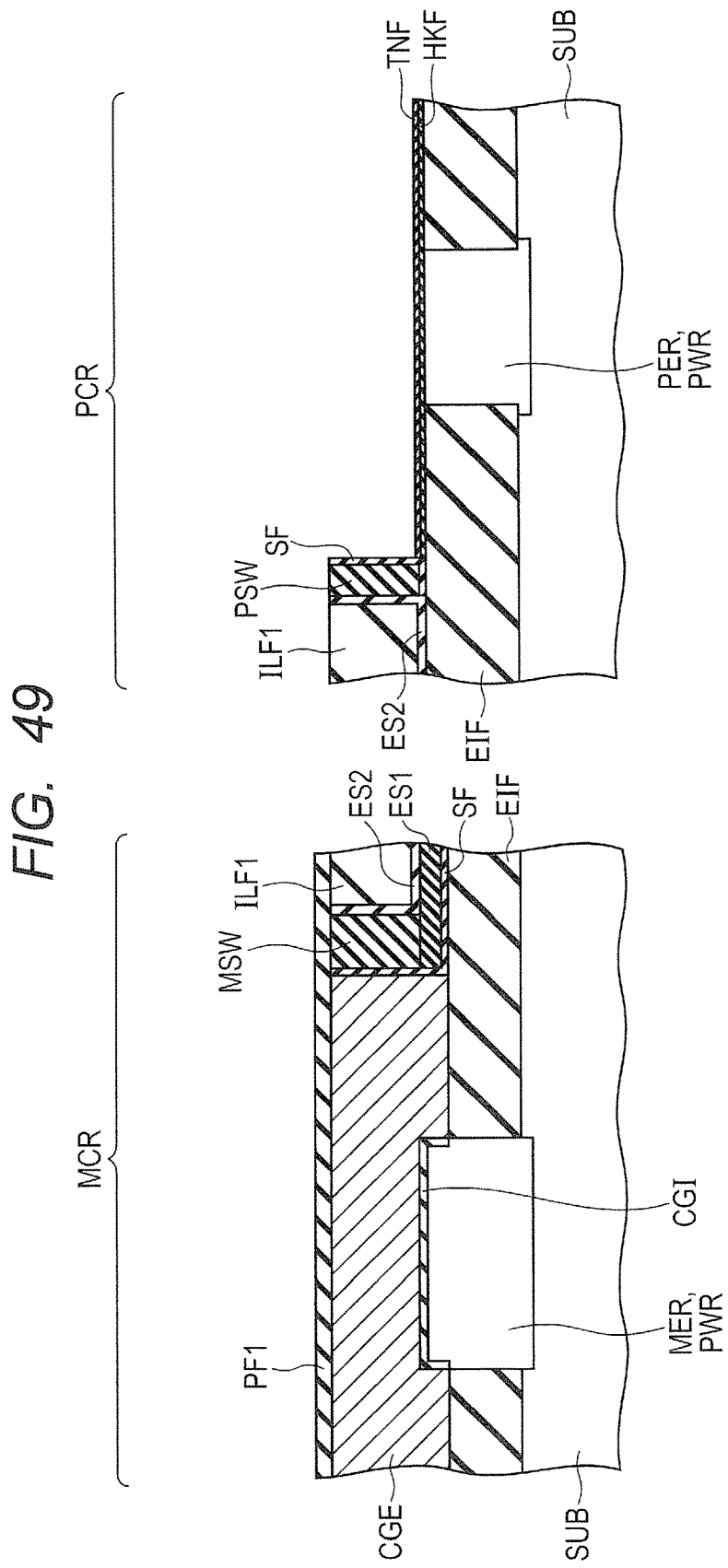
FIG. 49 is sectional views illustrating the step performed after the step illustrated in FIGS. 46 and 47 in the same embodiment, each taken along the section line corresponding to the section line IV-IV.

Next, the insulating film PF1, for covering the control gate electrode CGE, the memory gate electrode MGE, and the like in the memory cell region MCR, is formed as illustrated in FIGS. 48 and 49. Next, the pattern of the polysilicon film DPF as the exposed dummy gate electrode is removed by performing an etching process using the insulating film PF1, the interlayer insulating film ILF1, and the like as etching masks.

Next, a conductive film (not illustrated) is formed to fill a portion (trench) from which the pattern of the polysilicon film DPF has been removed. As the conductive film, a metal film other than a silicon film can be adopted, and for example, a metal film such as an aluminum (Al) film, a tantalum nitride (TaN) film, a titanium nitride (TiN) film, or the like can be adopted. For forming the conductive film, for example, a sputtering process can be adopted. Alternatively, another metal film, for adjusting the work function of the gate electrode of a low breakdown voltage MIS transistor or the like, may be formed between the titanium nitride film TNF and the conductive film.

Figure 50:
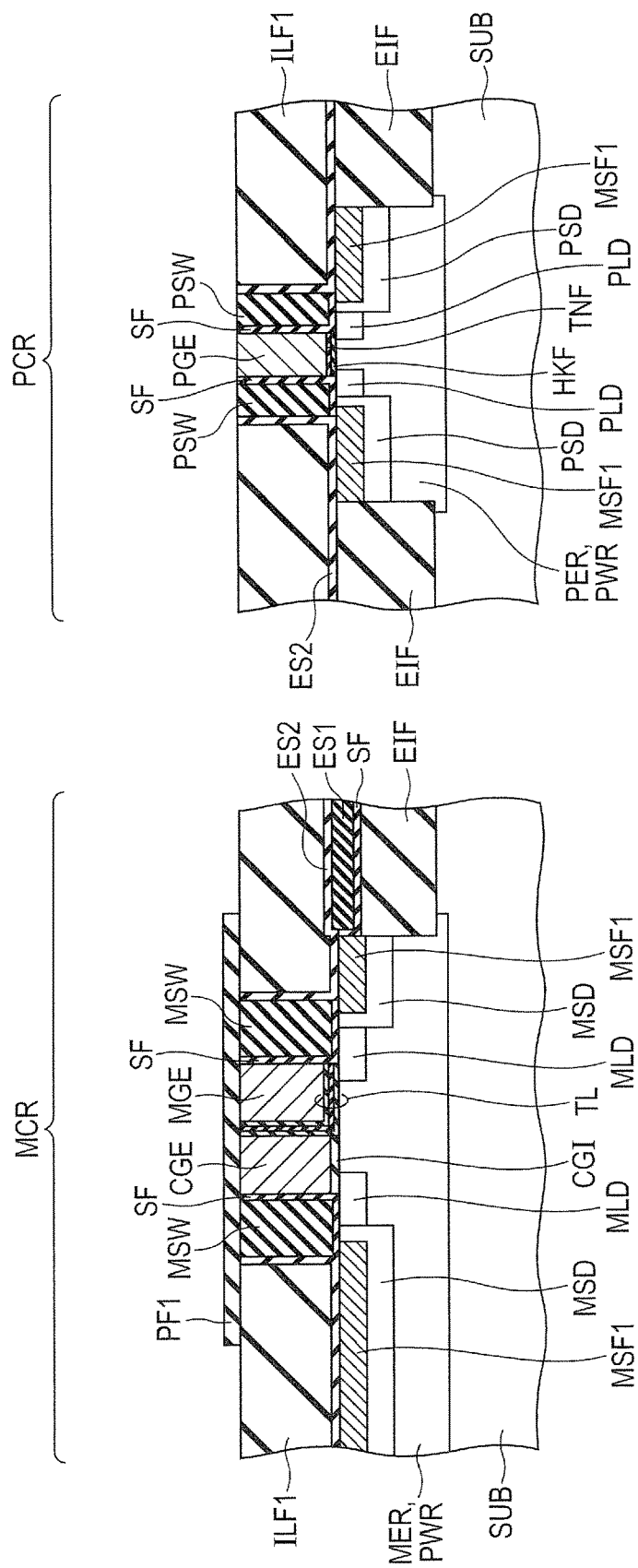
FIG. 50 is sectional views illustrating a step performed after the step illustrated in FIGS. 48 and 49 in the same embodiment, each taken along the section line corresponding to the section line III-III.
Figure 51:
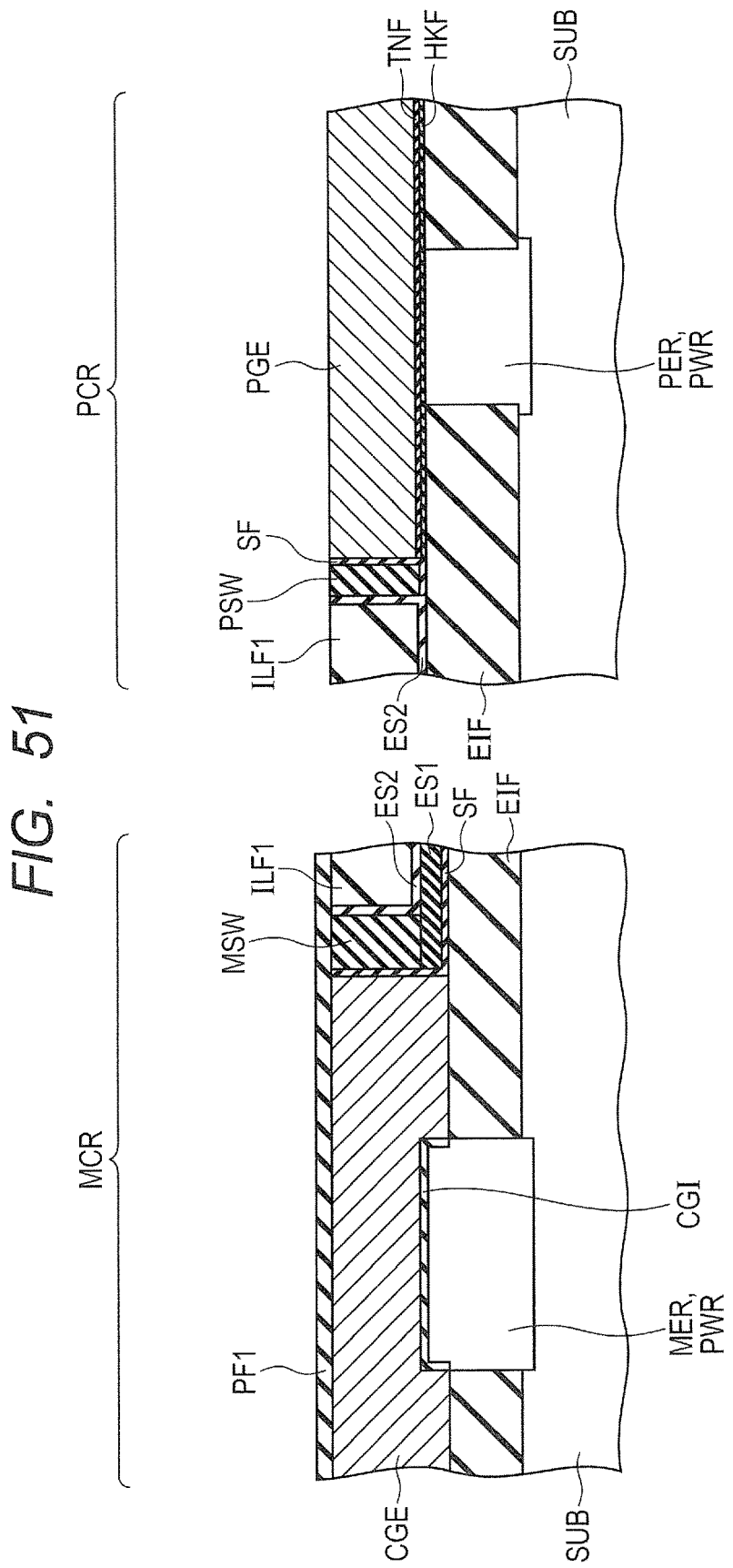
FIG. 51 is sectional views illustrating the step performed after the step illustrated in FIGS. 48 and 49 in the same embodiment, each taken along the section line corresponding to the section line IV-IV.

Next, the portion of the conductive film located over the upper surface of the interlayer insulating film ILF1 is removed by performing a chemical mechanical polishing process, in which the portion of the conductive film, with which the portion from which the pattern of the polysilicon film DPF has been removed is filled, is left. Thereby, the gate electrode PGE of the low breakdown voltage MIS transistor as one of the peripheral MIS transistors PTR is formed in the peripheral circuit region PCR, as illustrated in FIGS. 50 and 51.

Figure 52:
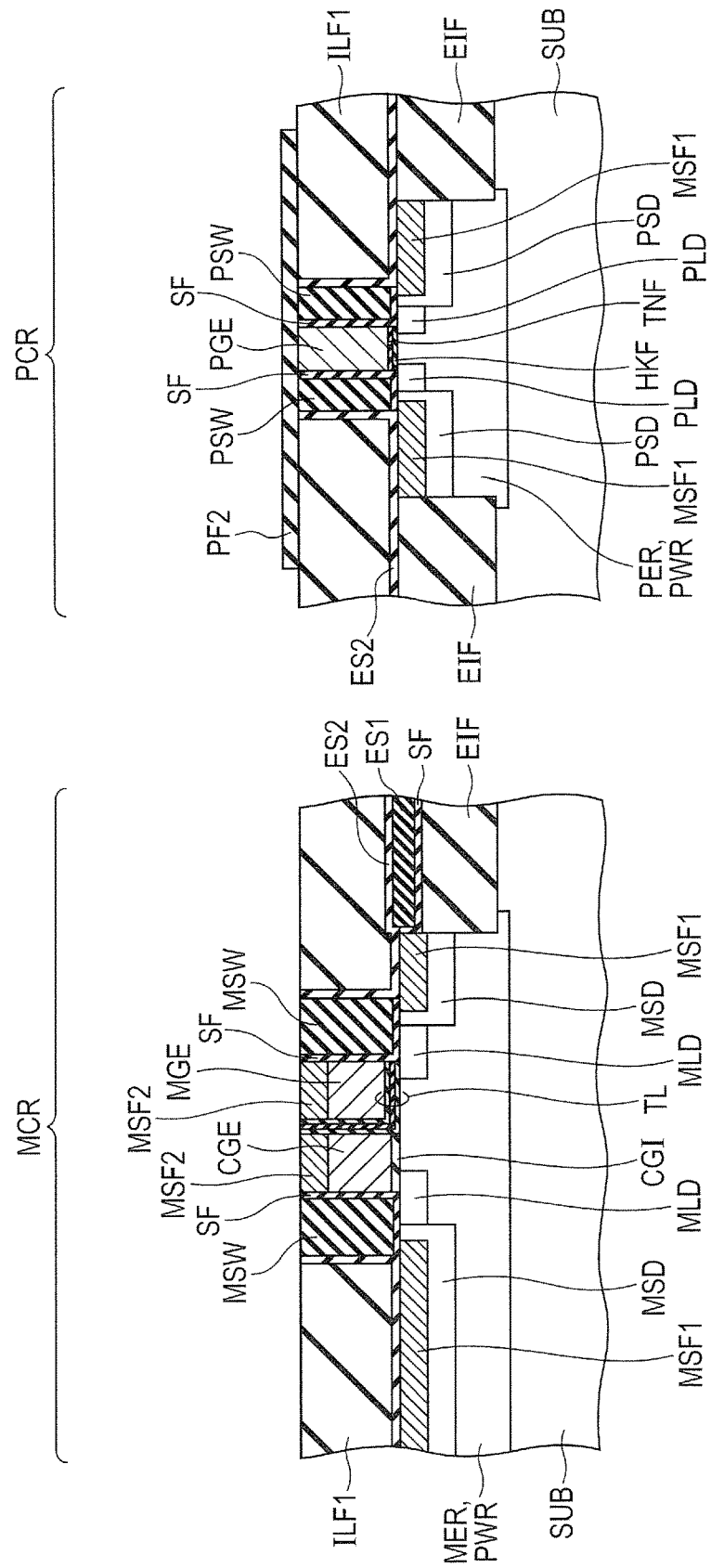
FIG. 52 is sectional views illustrating a step performed after the step illustrated in FIGS. 50 and 51 in the same embodiment, each taken along the section line corresponding to the section line III-III.
Figure 53:
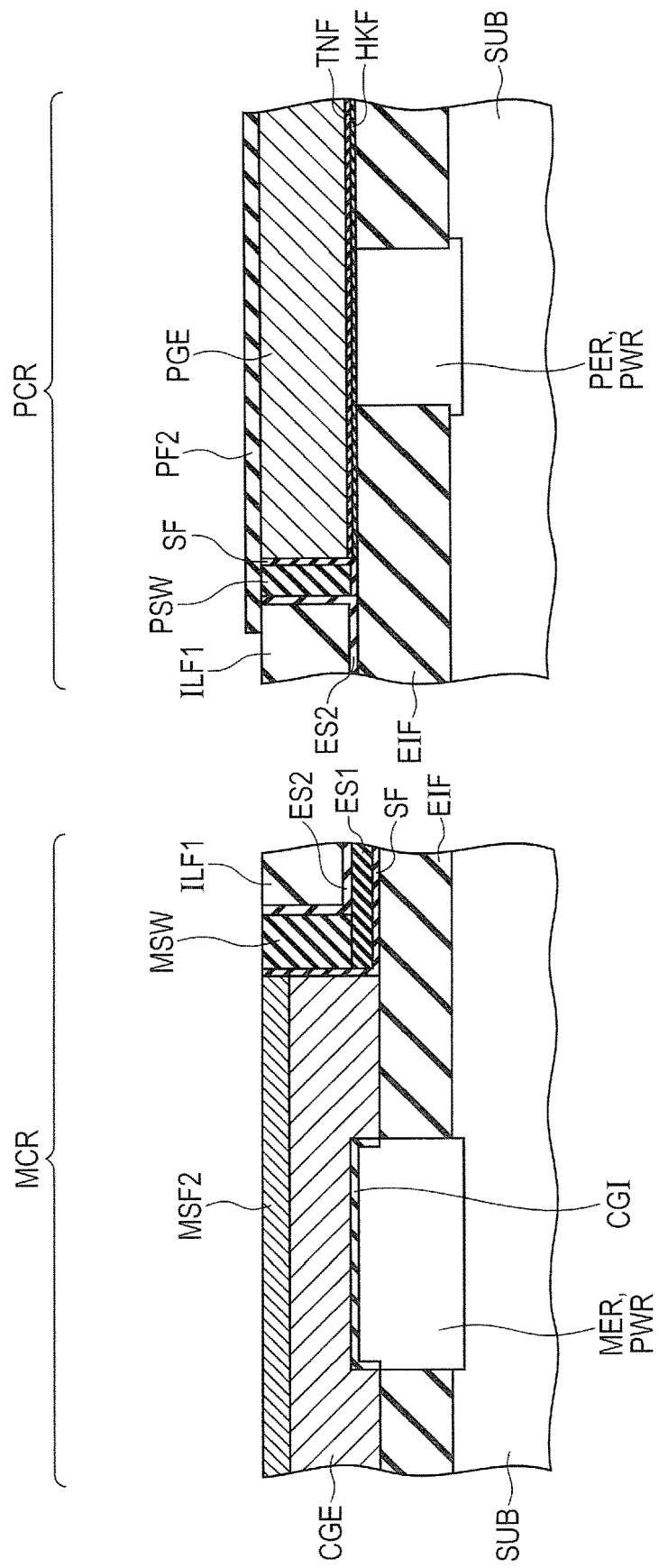
FIG. 53 is sectional views illustrating the step performed after the step illustrated in FIGS. 50 and 51 in the same embodiment, each taken along the section line corresponding to the section line IV-IV.

Next, an insulating film PF2 for covering the gate electrode PGE and the like in the peripheral circuit region PCR is formed as illustrated in FIGS. 52 and 53. Next, the metal silicide layer MSF2 is formed by, for example, a salicide process. The metal silicide layer MSF2 is formed over each of the upper surface of the control gate electrode CGE and the upper surface of the memory gate electrode MGE. As the metal silicide layer MSF2, for example, a cobalt silicide layer, a nickel silicide layer, or a platinum-added nickel silicide layer can be formed.

Figure 54:
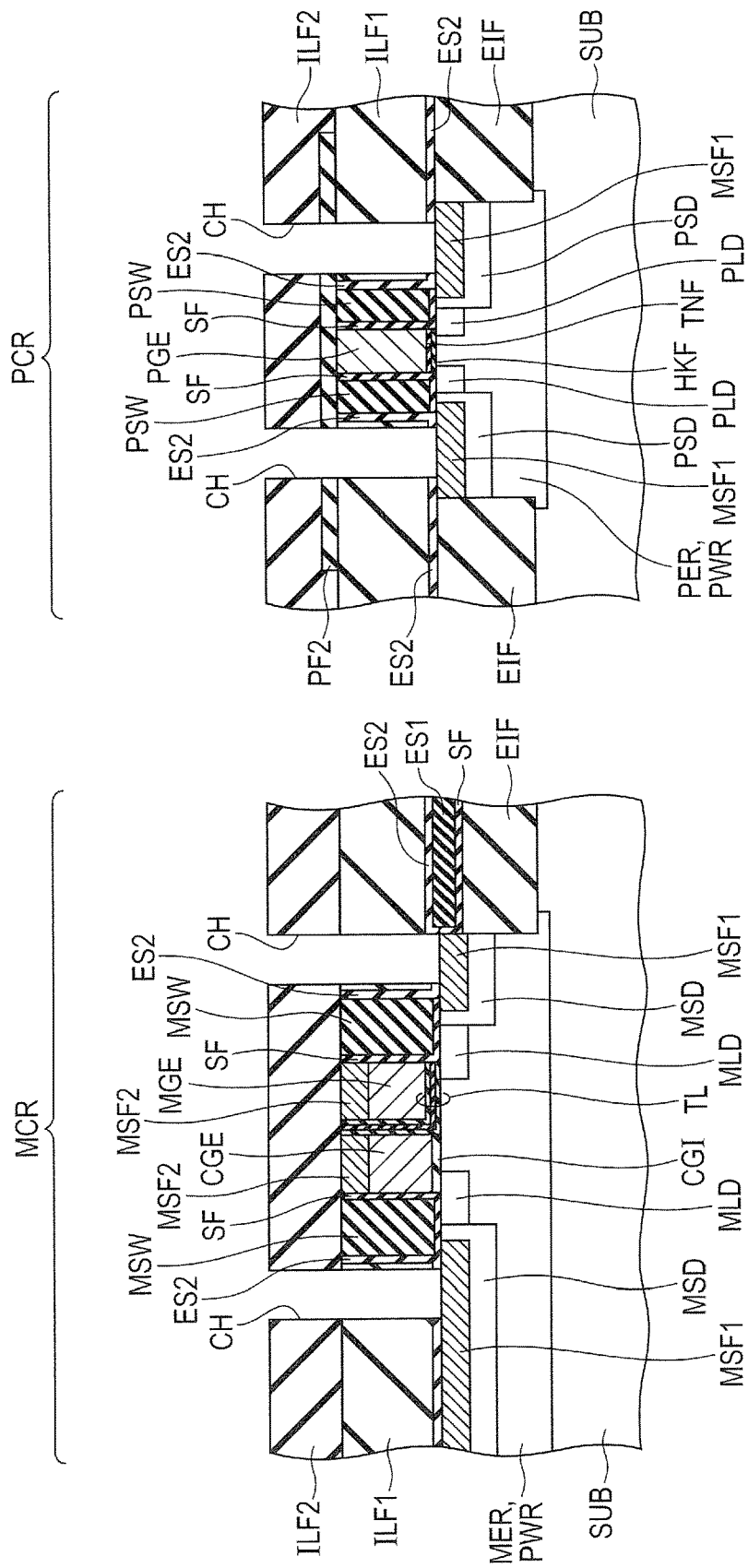
FIG. 54 is sectional views illustrating a step performed after the step illustrated in FIGS. 52 and 53 in the same embodiment, each taken along the section line corresponding to the section line III-III.
Figure 55:
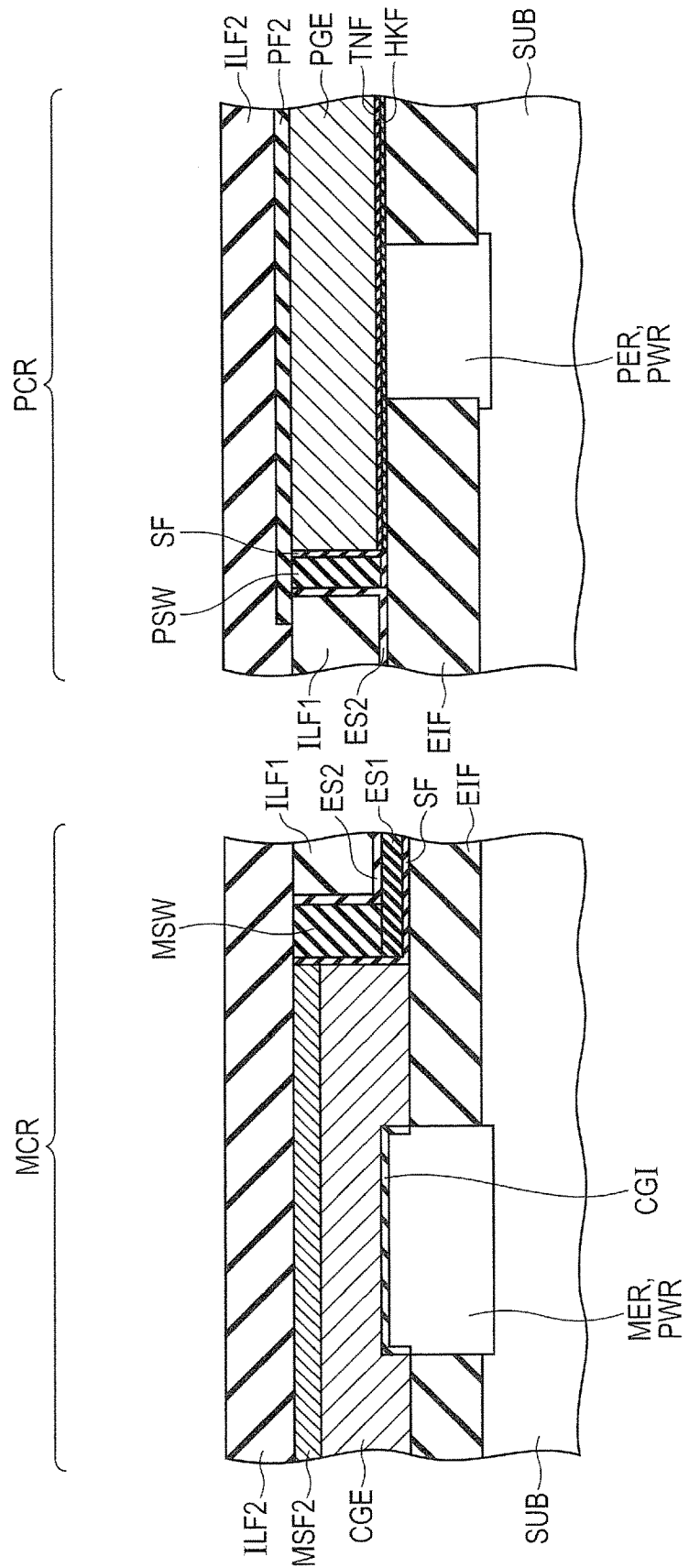
FIG. 55 is sectional views illustrating the step performed after the step illustrated in FIGS. 52 and 53 in the same embodiment, each taken along the section line corresponding to the section line IV-IV.

Next, the interlayer insulating film ILF2 is formed to cover the interlayer insulating film ILF1, as illustrated in FIGS. 54 and 55. As the interlayer insulating film ILF2, for example, a single-layered silicon oxide film or a laminated film of a silicon oxide film and a silicon nitride film is formed. For forming the interlayer insulating film ILF2, a CVD process can be adopted. Next, a photoresist pattern (not illustrated) for forming a contact hole is formed by performing a predetermined photoengraving process. Next, an anisotropic etching process is performed by using the photoresist pattern as an etching mask. Thereby, the contact hole CH for exposing the N+ diffusion layer MSD is formed in the memory cell region MCR. In the peripheral circuit region PCR, the contact hole CH for exposing the N+ diffusion layer PSD is formed. In the semiconductor device according to First Embodiment, leakage current caused by misalignment of the contact hole CH can be suppressed as described later. Thereafter, the photoresist pattern is removed.

Figure 56:
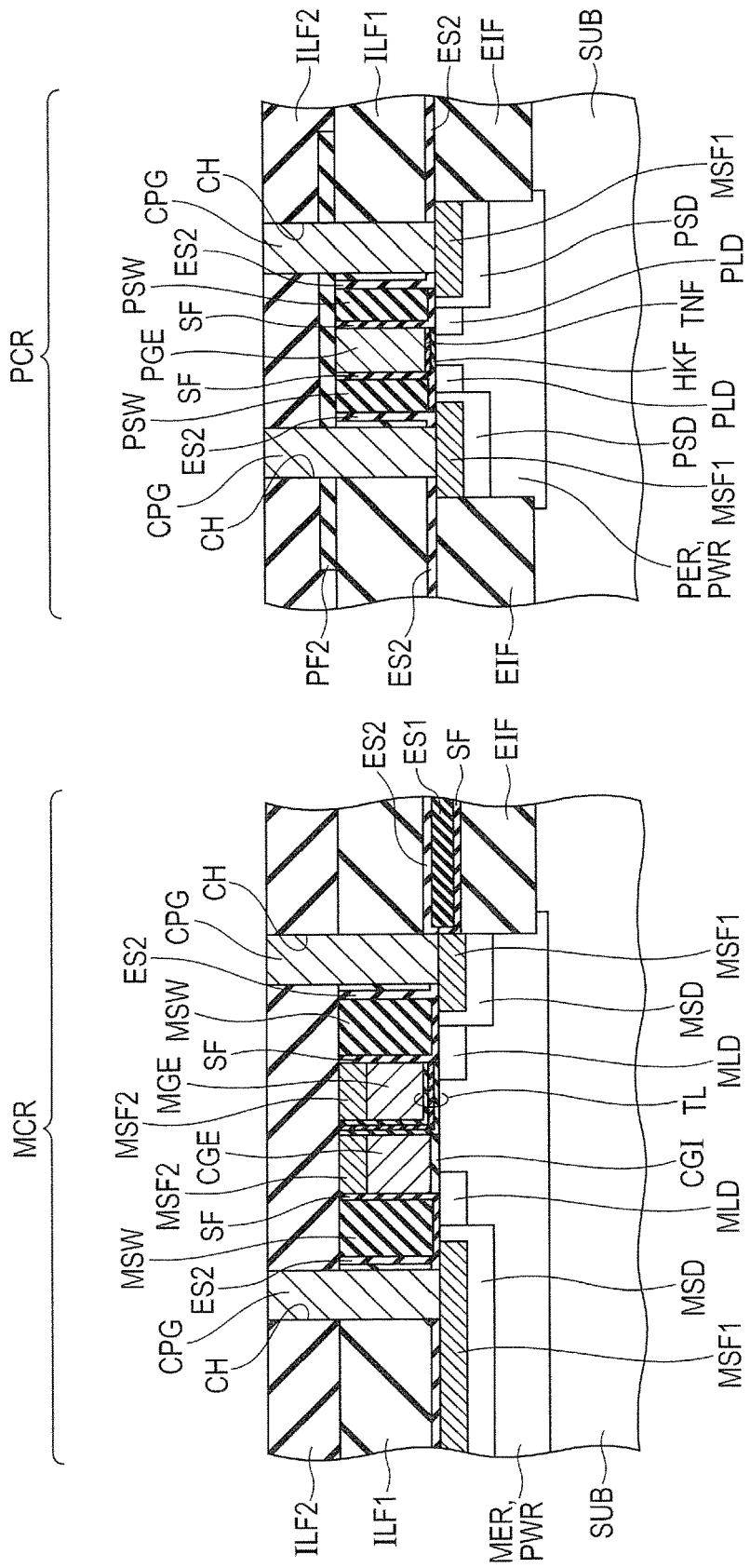
FIG. 56 is sectional views illustrating a step performed after the step illustrated in FIGS. 54 and 55 in the same embodiment, each taken along the section line corresponding to the section line III-III.

Next, a main conductor film (not illustrated) is formed in the contact hole CH via a barrier conductor film (not illustrated). As the barrier conductor film, for example, a titanium (Ti) film, a titanium nitride (TiN) film, or a laminated film of a titanium film and a titanium nitride film is formed. As the main conductor film, for example, a tungsten film is formed. Next, the portions of the barrier conductor film and the main conductor film, which are located over the upper surface of the interlayer insulating film ILF2, are removed by performing a chemical mechanical polishing process or an etching back process. Thereby, the contact plug CPG is formed in the contact hole CH, as illustrated in FIG. 56. The contact plug CPG is electrically coupled to the N+ diffusion layer MSD in the memory cell region MCR. In the peripheral circuit region PCR, the contact plug CPG is electrically coupled to the N+ diffusion layer PSD.

Figure 57:
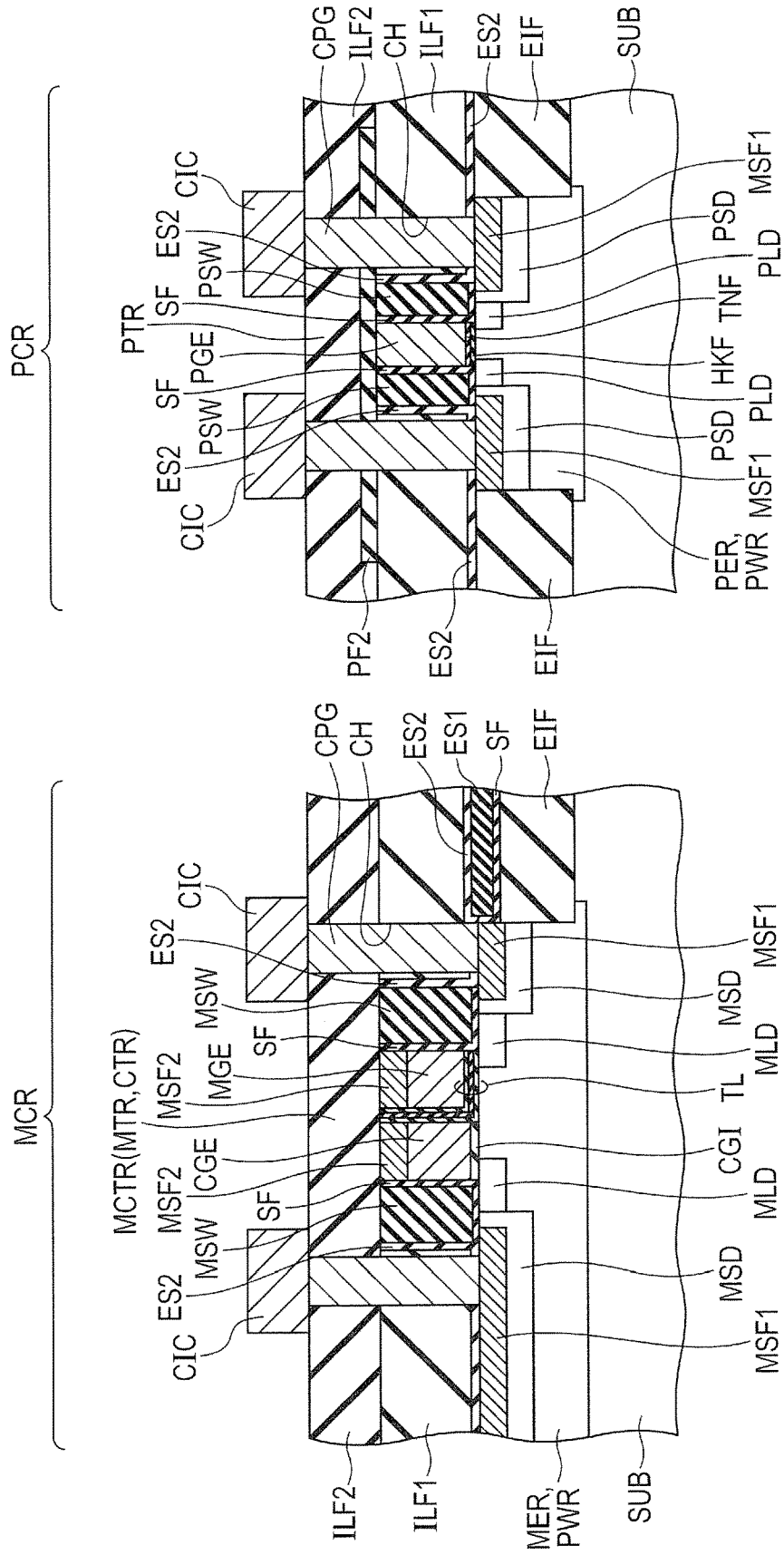
FIG. 57 is sectional views illustrating a step performed after the step illustrated in FIG. 56 in the same embodiment, each taken along the section line corresponding to the section line III-III.
Figure 58:
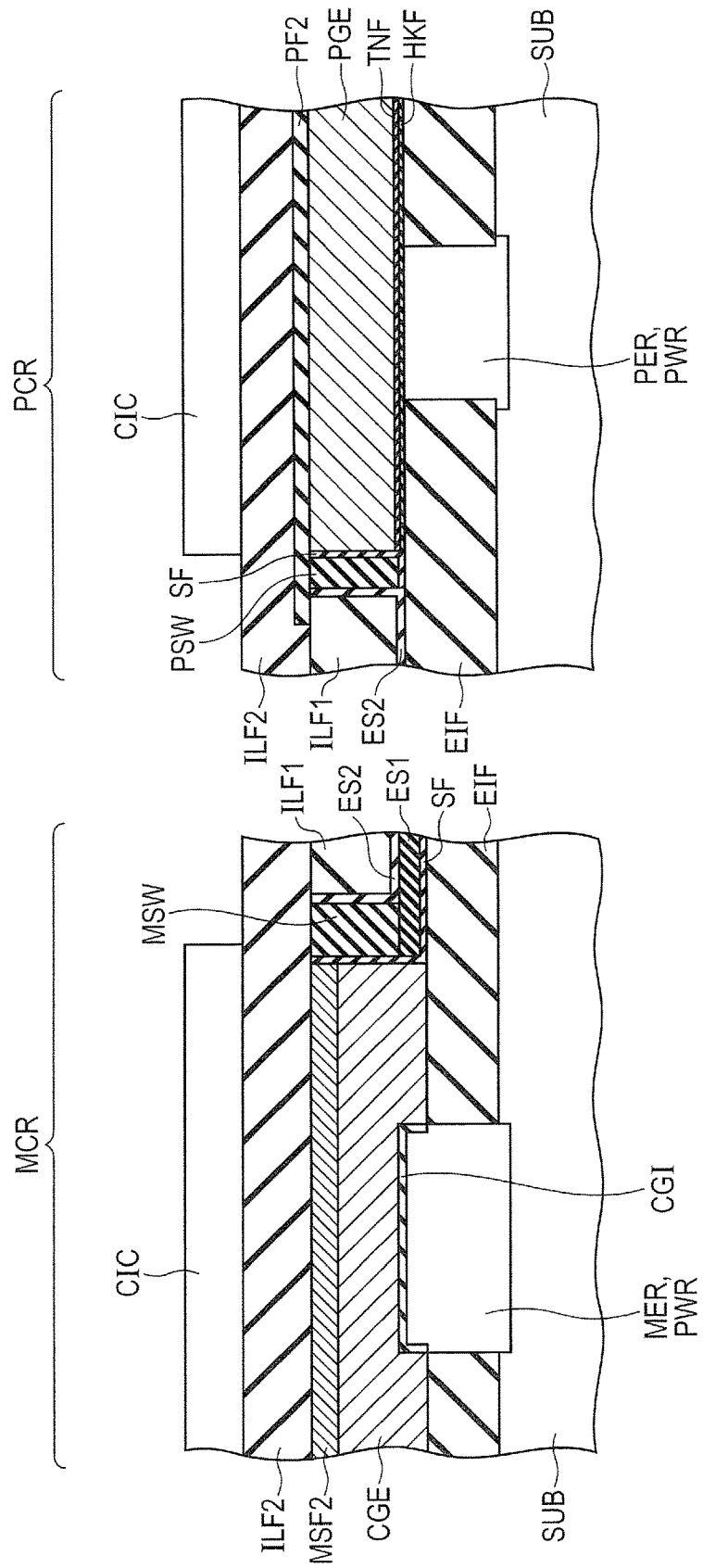
FIG. 58 is sectional views illustrating the step performed after the step illustrated in FIG. 56 in the same embodiment, each taken along the section line corresponding to the section line IV-IV.

Next, the first layer wiring CIC is formed over the interlayer insulating film ILF2, as illustrated in FIGS. 57 and 58. As the wiring CIC, for example, copper wiring can be formed. For forming the copper wiring, for example, a damascene process can be adopted. Thereafter, second or subsequent layer wiring (not illustrated) may be formed, if necessary. Thus, the main part of the semiconductor device is completed.

In the above semiconductor device, the buried silicon nitride film ES1 and the etching stopper film ES2 are formed over the element isolation insulating film EIF defining the memory active region MER. Thereby, leakage current caused by misalignment of the contact hole CH can be suppressed. This will be described in comparison with a semiconductor device of Comparative Example.

Figure 59:
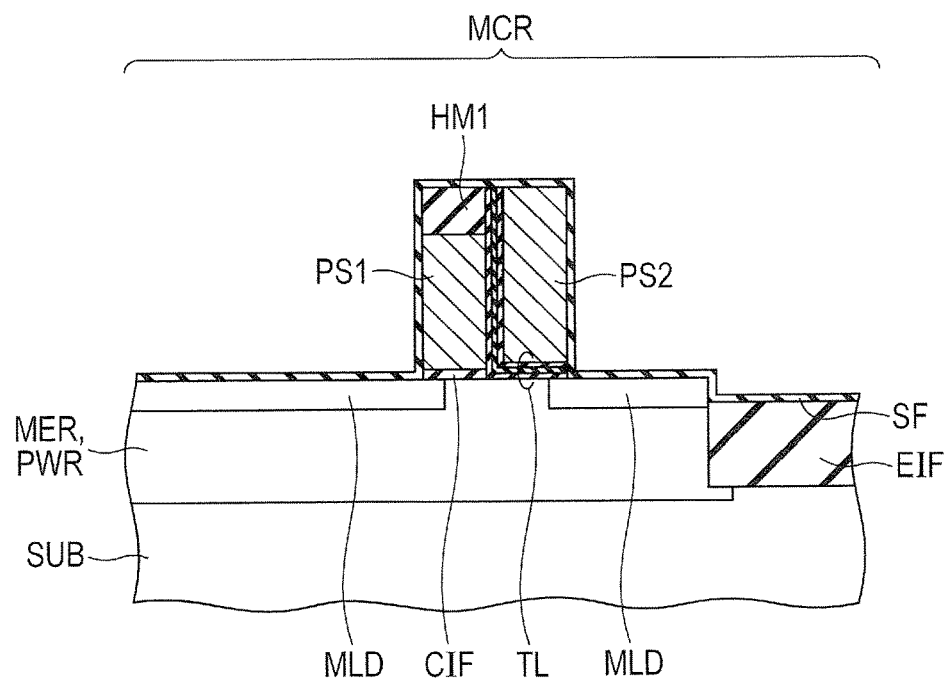
FIG. 59 is a sectional view of a memory cell region, illustrating one step of a manufacturing method of a semiconductor device according to Comparative Example.
Figure 60:
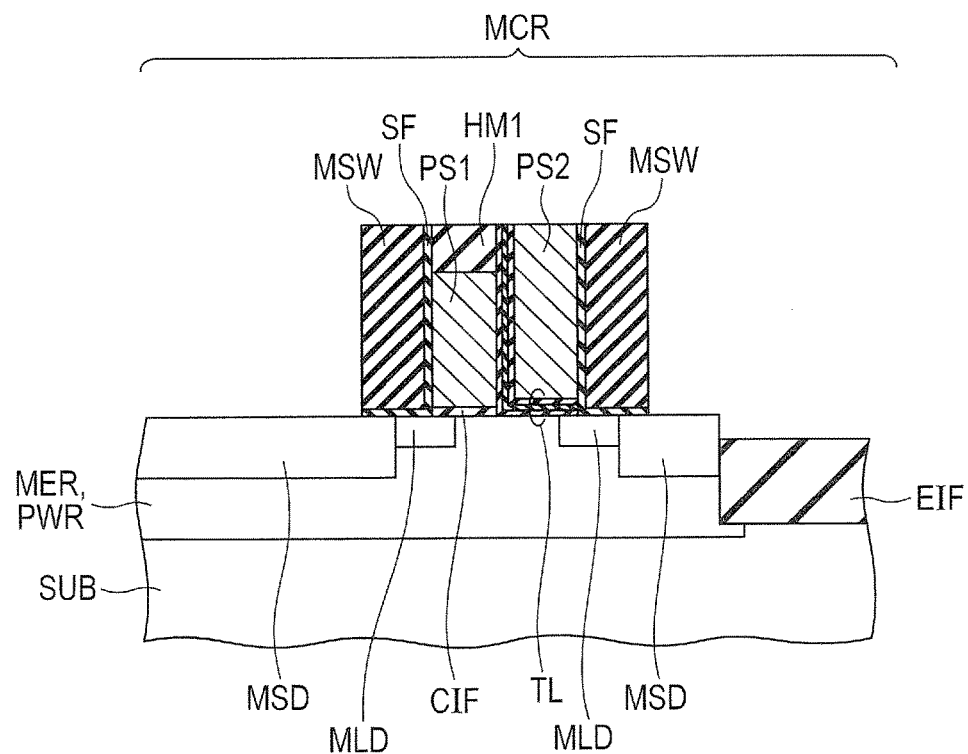
FIG. 60 is a sectional view of the memory cell region, illustrating a step performed after the step illustrated in FIG. 59.

In a semiconductor device of Comparative Example, the silicon oxide film SF including a silicon oxide film is formed to cover the semiconductor substrate SUB through steps similar to those illustrated in FIGS. 8 to 32, as illustrated in FIG. 59. Next, the side wall spacer film MSW is formed over the side surface of the pattern of the conductive film PS1 to serve as a control gate electrode by a step similar to that illustrated in FIG. 40, as illustrated in FIG. 60. Also, the sidewall spacer film MSW is formed over the side surface of the pattern of the conductive film PS2 to serve as a memory gate electrode.

Figure 61:
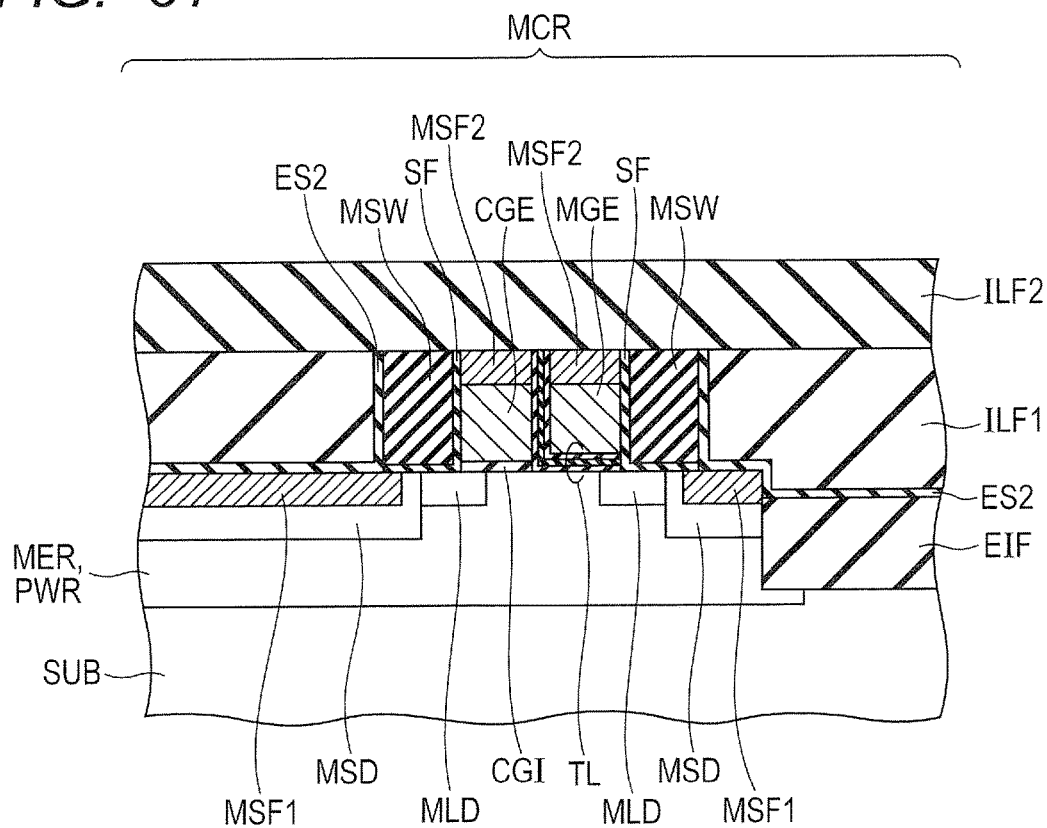
FIG. 61 is a sectional view of the memory cell region, illustrating a step performed after the step illustrated in FIG. 60.

Next, the interlayer insulating film ILF2 is formed to cover the interlayer insulating film ILF1 through steps similar to those illustrated in FIGS. 42 to 52, as illustrated in FIG. 61. Next, a photoresist pattern (not illustrated) for forming a contact hole is formed by performing a predetermined photoengraving process. Next, the contact holes CH are formed in the memory cell region MCR and the peripheral circuit region PCR by performing an anisotropic etching process using the photoresist pattern as an etching mask.

Figure 62:
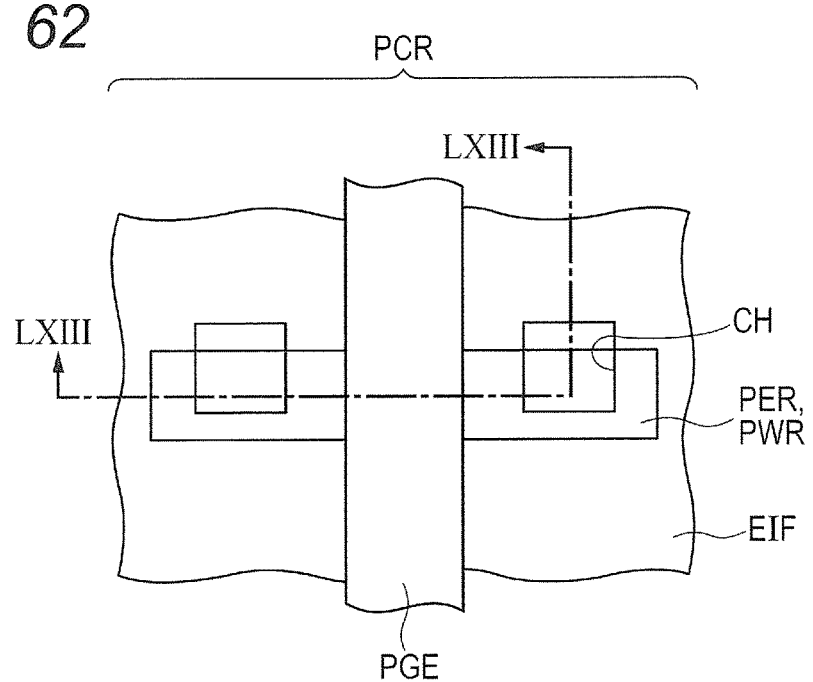
FIG. 62 is a partial plan view illustrating a peripheral circuit region and for explaining a problem related to Comparative Example.
Figure 63:
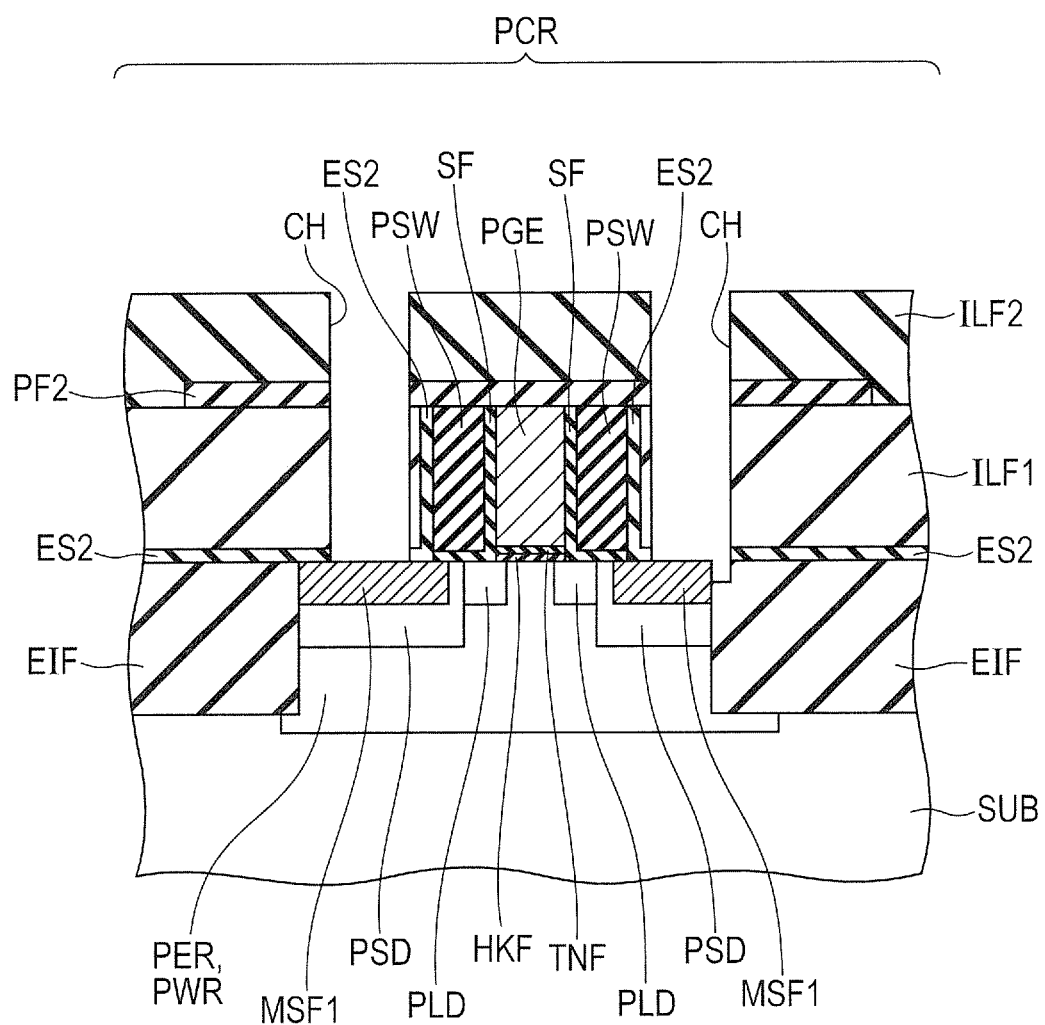
FIG. 63 is a sectional view taken along the section line LXIII-LXIII illustrated in FIG. 62.
Figure 64:
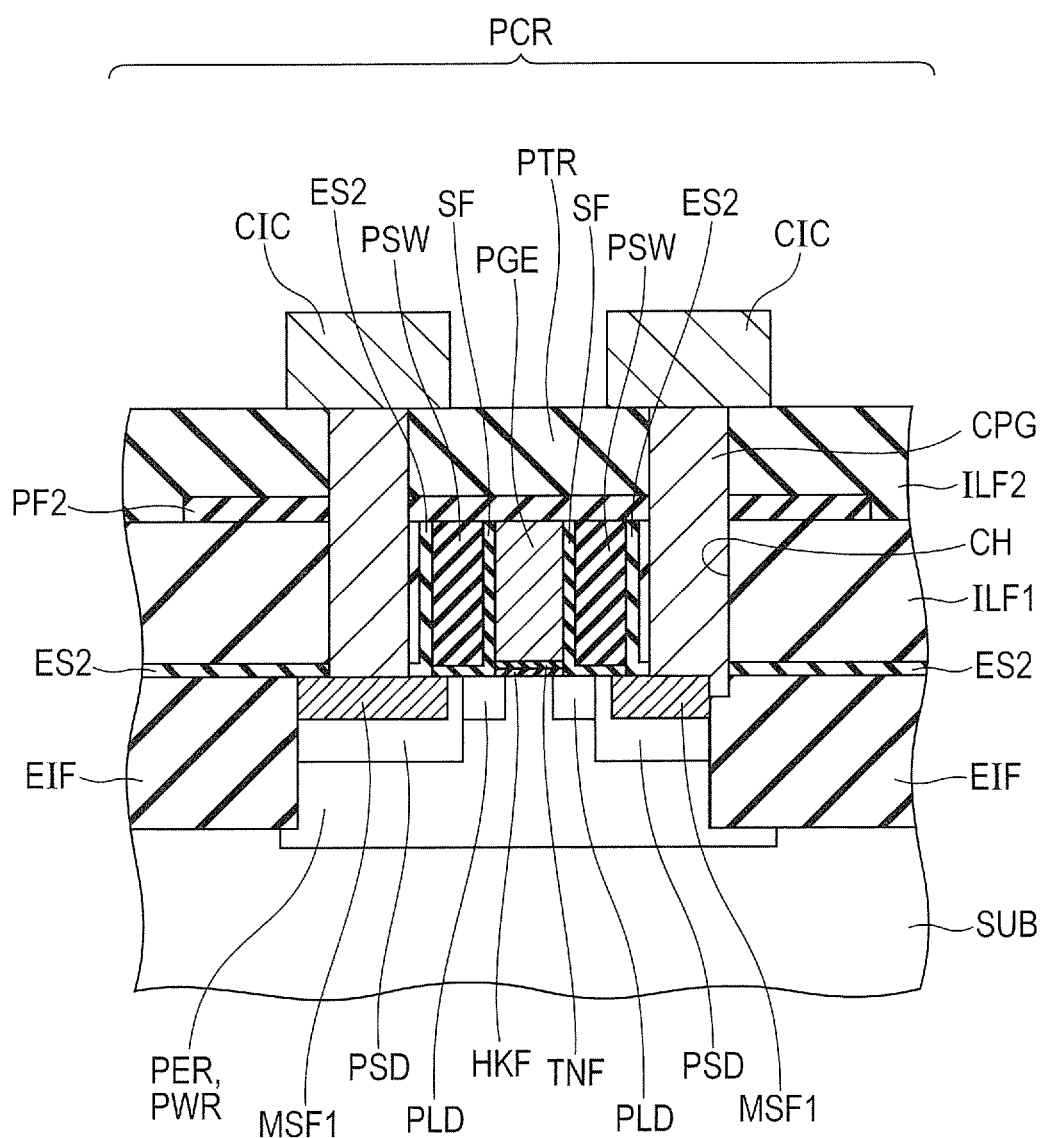
FIG. 64 is a sectional view of the peripheral circuit region, illustrating a step performed after the step illustrated in FIG. 63.

At this time, a case is assumed in which: due to misalignment in the photoengraving process, the opening of the photoresist pattern is formed to saddle the memory active region MER and the element isolation insulating film EIF and to saddle the peripheral active region PER and the element isolation insulating film EIF. In this case, part of the element isolation insulating film EIF is first etched at the bottom of the contact hole CH in the peripheral circuit region PCR, as illustrated in FIGS. 62 and 63. Herein, regarding the element isolation insulating film EIF defining the peripheral active region PER, the upper surface of the element isolation insulating film EIF is not retreated with respect to the main surface of the semiconductor substrate SUB. Therefore, in the contact hole CH, the distance between the portion where part of the element isolation insulating film EIF is etched and the well region PWR is secured to some extent. Thereby, leakage of current flowing from the contact plug CPG formed in the contact hole CH to the well region PWR is suppressed as illustrated in FIG. 64.

Figure 65:
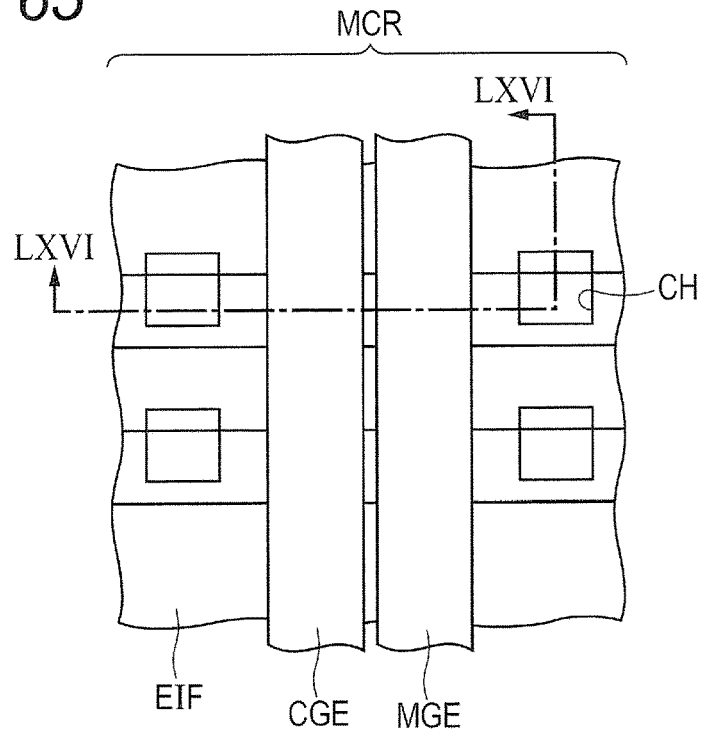
FIG. 65 is a partial plan view illustrating a memory cell region, which is for explaining a problem related to Comparative Example.
Figure 66:
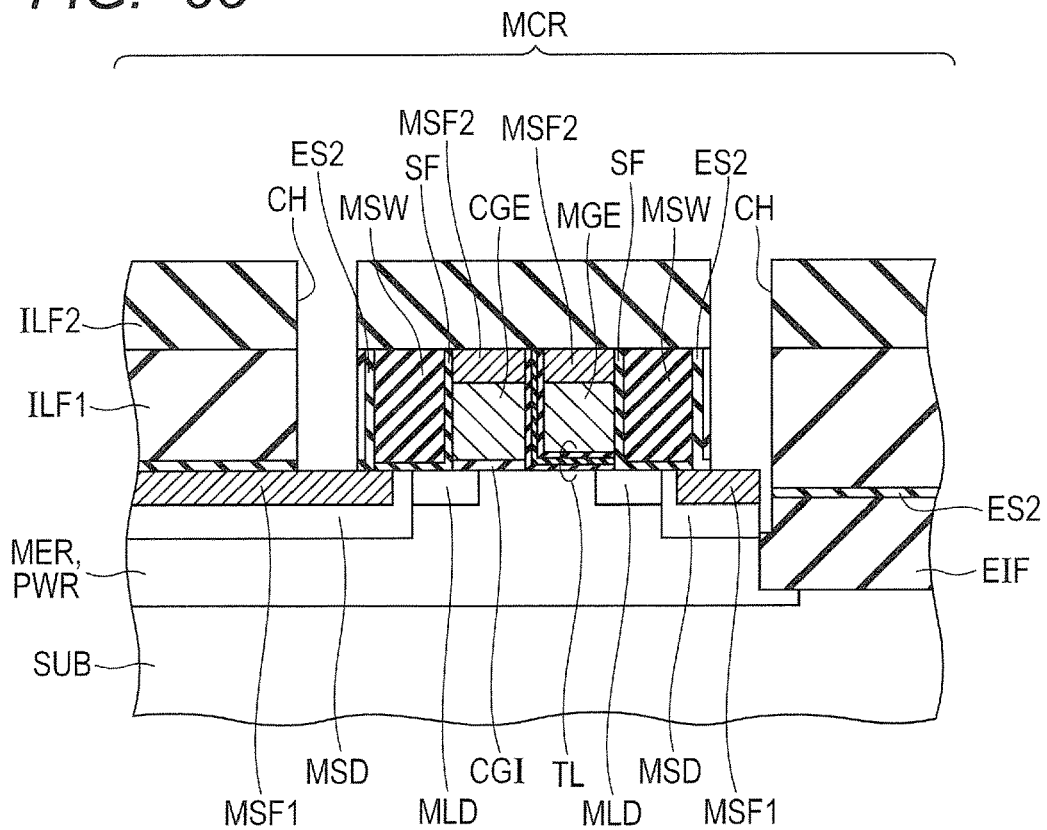
FIG. 66 is a sectional view taken along the section line LXVI-LXVI illustrated in FIG. 65.

Also, in the memory cell region MCR, part of the element isolation insulating film EIF is etched at the bottom of the contact hole CH, as illustrated in FIGS. 65 and 66. In the element isolation insulating film EIF defining the memory active region MER, the upper surface of the element isolation insulating film EIF is retreated with respect to the main surface of the semiconductor substrate SUB, and the position of the upper surface of the element isolation insulating film EIF is lower than that of the main surface of the semiconductor substrate SUB.

Figure 67:
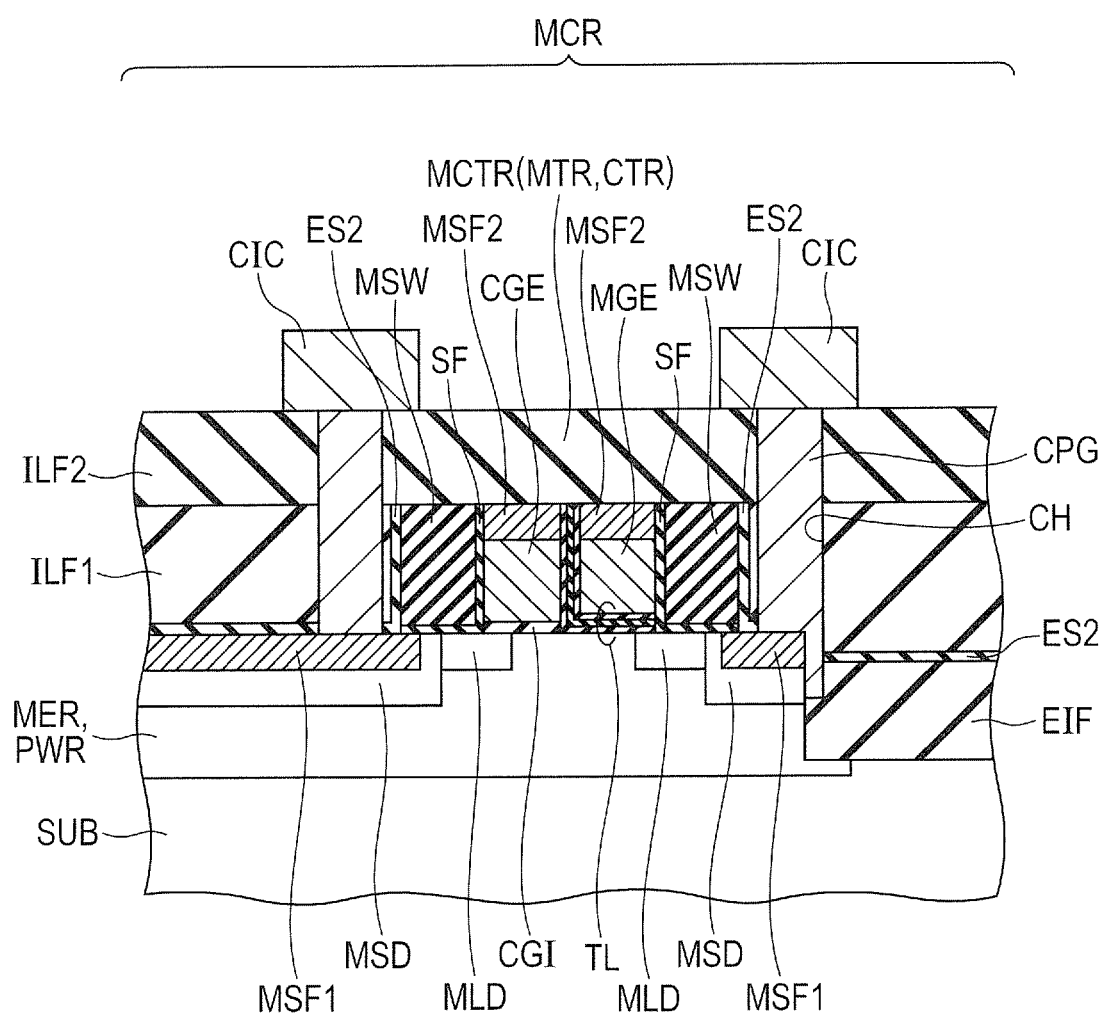
FIG. 67 is a sectional view of the memory cell region, illustrating a step performed after the step illustrated in FIG. 66.

Therefore, in the contact hole CH, the distance between the portion where part of the element isolation insulating film EIF is etched and the well region PWR becomes smaller by the amount by which the position of the upper surface of the element isolation insulating film EIF is retreated. As a result, the distance between the contact plug CPG formed in the contact hole CH and the well region PWR becomes short as illustrated in FIG. 67, and hence the risk that current may leak from the contact plug CPG to the well region PWR is increased.

On the other hand, in the semiconductor device according to First embodiment, the buried silicon nitride film ES1 and the etching stopper film ES2 are formed over the element isolation insulating film EIF defining the memory active region MER. The position of the upper surface of the etching stopper film ES2 is higher than that of the upper surface of the element isolation insulating film EIF defining the peripheral active region PER.

Figure 68:
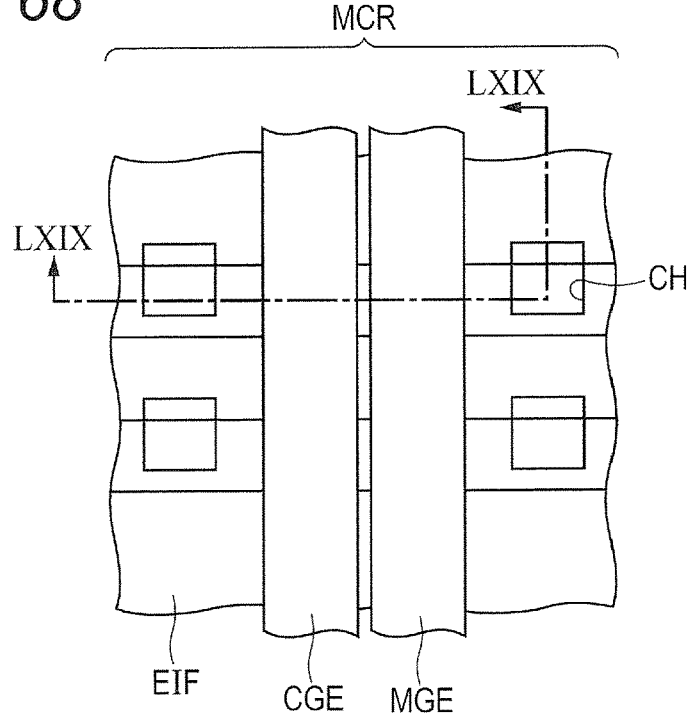
FIG. 68 is a partial plan view illustrating the memory cell region in the same embodiment, which is for explaining an advantage.
Figure 69:
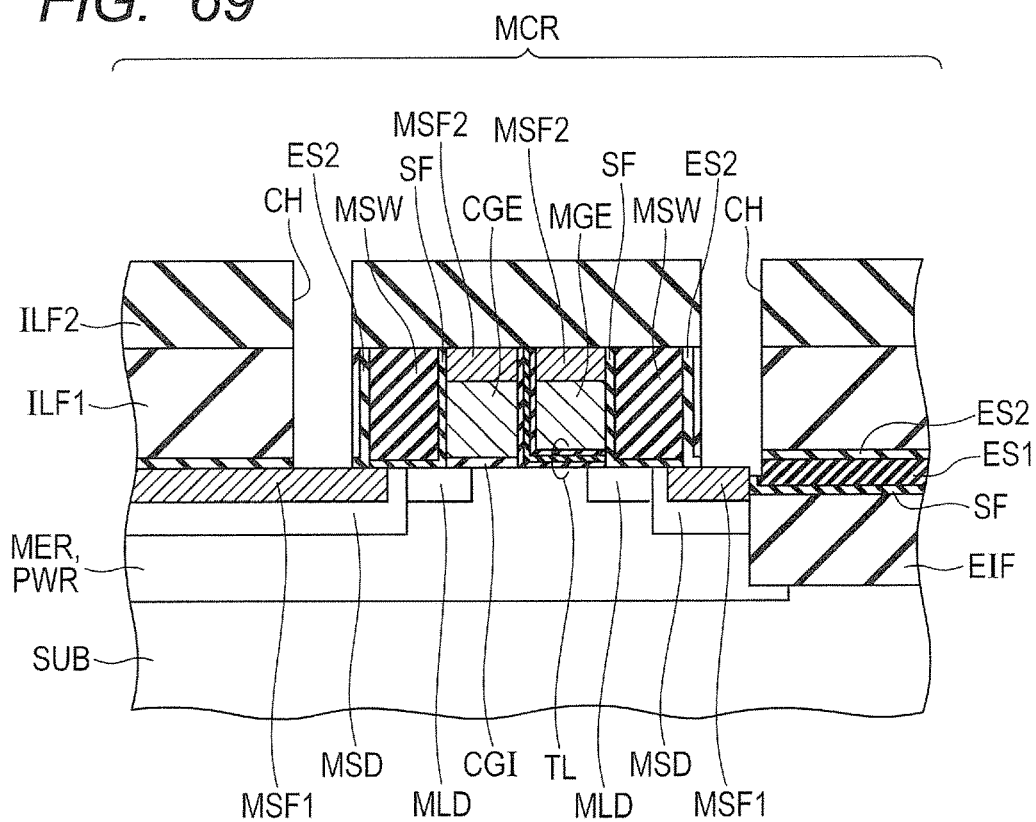
FIG. 69 is a sectional view in the same embodiment, taken along the section line LXIX-LXIX illustrated in FIG. 68.
Figure 70:
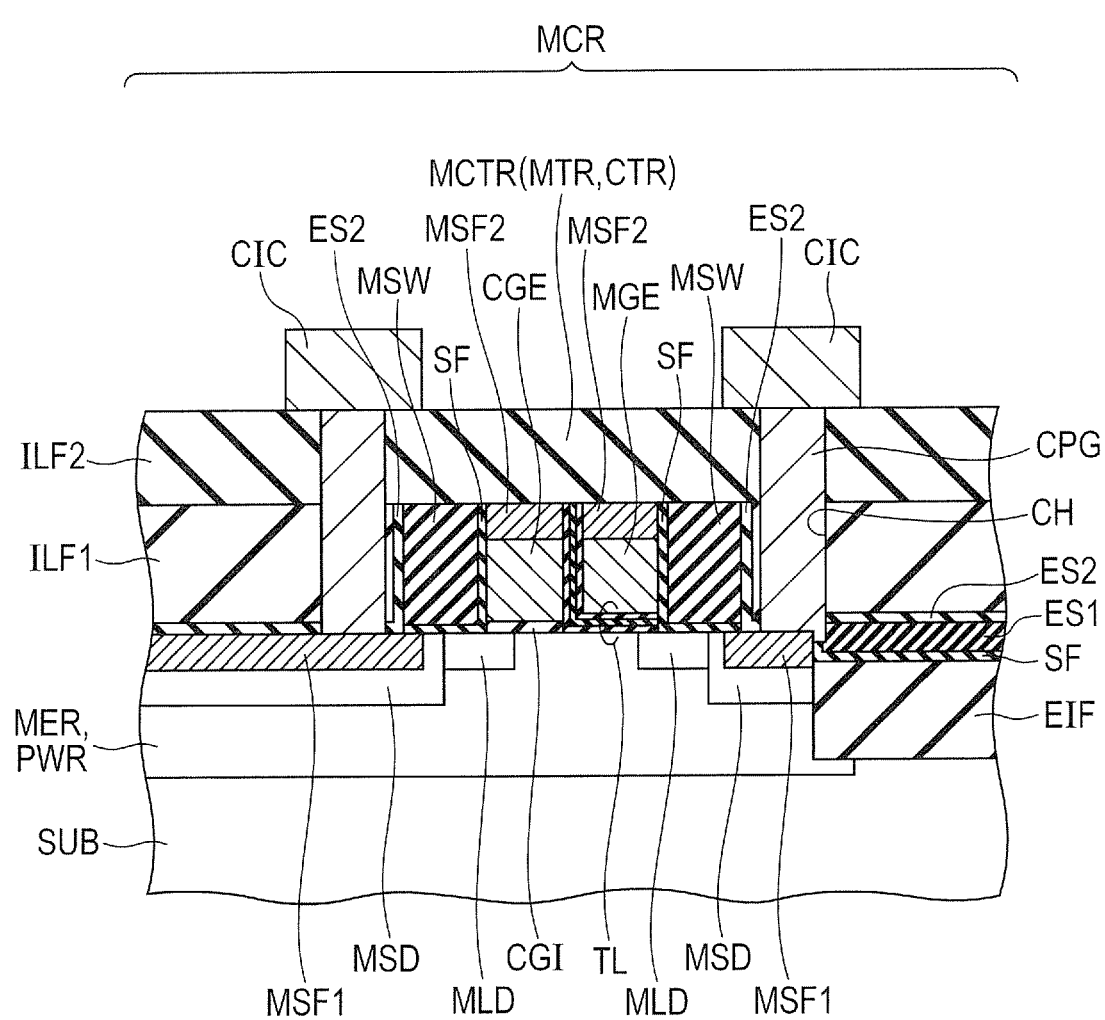
FIG. 70 is a sectional view of the memory cell region in the same embodiment, illustrating a step performed after the step illustrated in FIG. 69.

Thereby, when misalignment occurs in the photolithography process for forming the contact hole, the etching of the portion where the element isolation insulation film EIF is located is suppressed by the etching stopper film ES2 and the buried silicon nitride film ES1, and hence the distance between the bottom of the contact hole CH and the well region PWR is secured as illustrated in FIGS. 68 and 69. Thereby, leakage of current flowing from the contact plug CPG formed in the contact hole CH to the well region PWR can be prevented as illustrated in FIG. 70.

Second Embodiment

In Second Embodiment, variations of a method of forming the peripheral MIS transistor PTR arranged in a peripheral circuit region will be described.
(Memory Cell Region and Peripheral Circuit Region)

Figure 71:
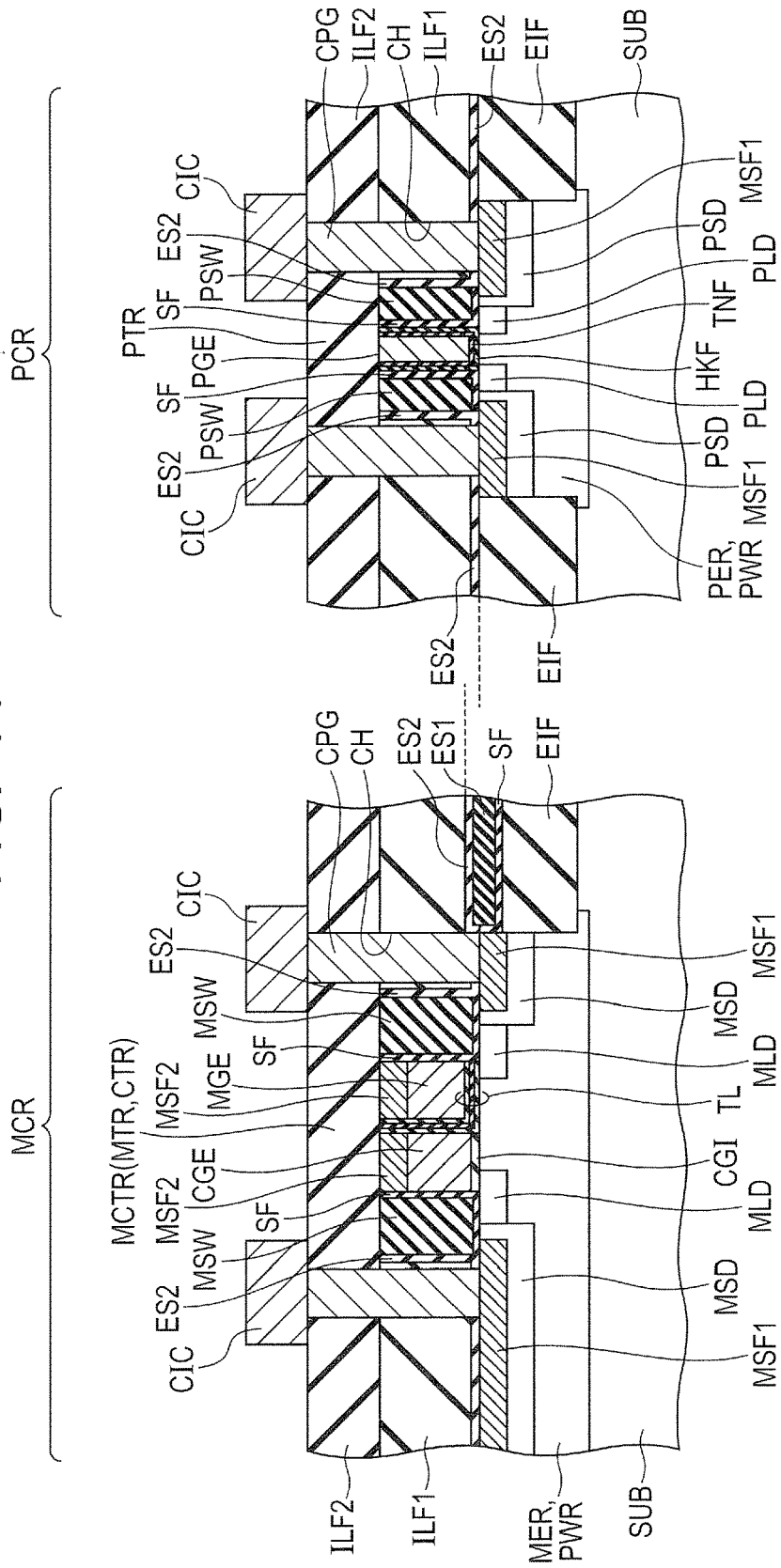
FIG. 71 is sectional views of a memory cell region and a peripheral circuit region of a semiconductor device according to Second Embodiment, each taken along a section line corresponding to the section line III-III illustrated in FIG. 2.
Figure 72:
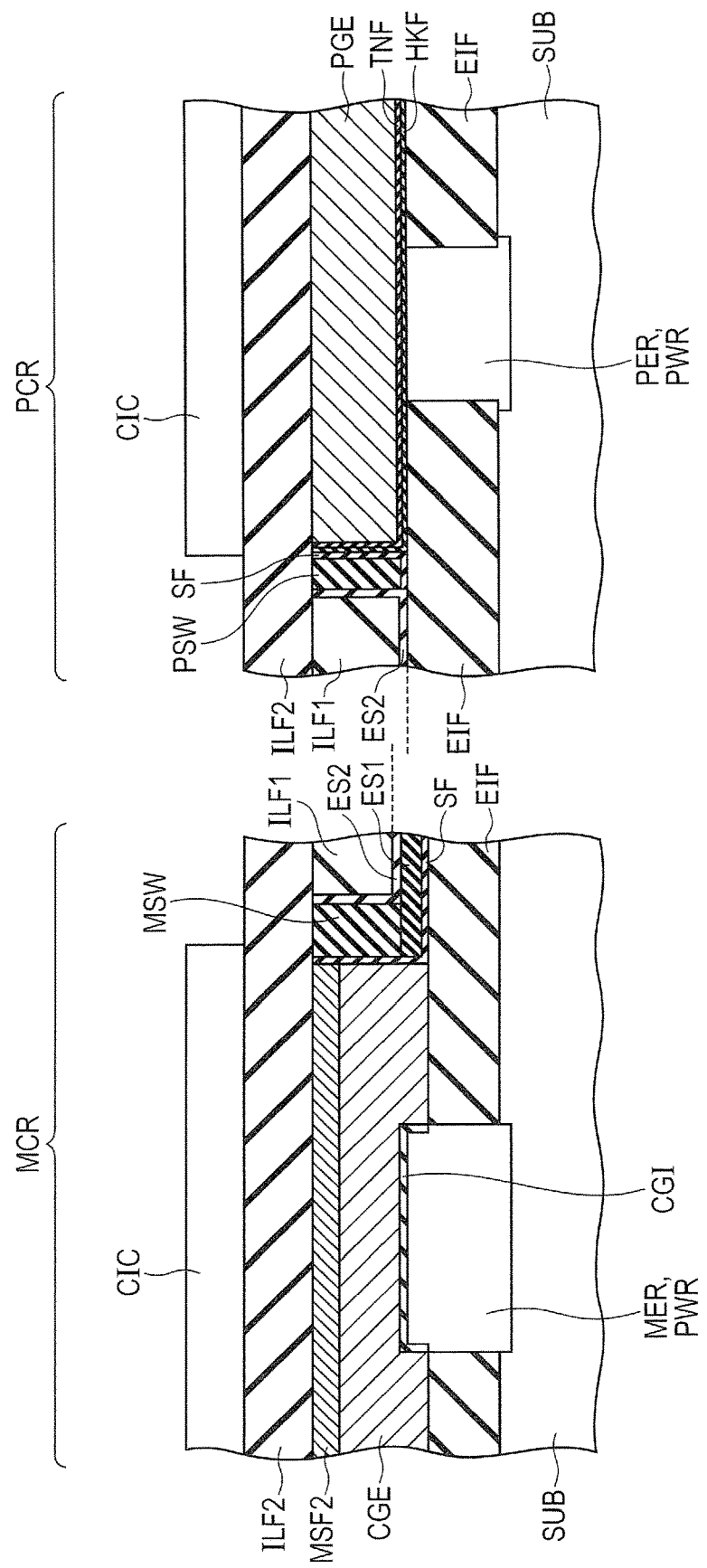
FIG. 72 is sectional views of the memory cell region and the peripheral circuit region in the same embodiment, each taken along a section line corresponding to the section line IV-IV illustrated in FIG. 2.

First, a structure of a semiconductor device will be described. In the peripheral circuit region PCR of a semiconductor device, the high dielectric constant film HKF and the titanium nitride film TNF of the peripheral MIS transistor PTR are interposed between the gate electrode PGE and the well region PWR and also interposed between the gate electrode PGE and the sidewall spacer film PSW, as illustrated in FIGS. 71 and 72. Because the configurations other than this, including the structure of the memory cell region MCR, are the same as those of the semiconductor device described in First Embodiment, the same reference numerals are given to the same members, and description thereof will not be repeated unless necessary.
(Manufacturing Method of Semiconductor Device)

Figure 73:
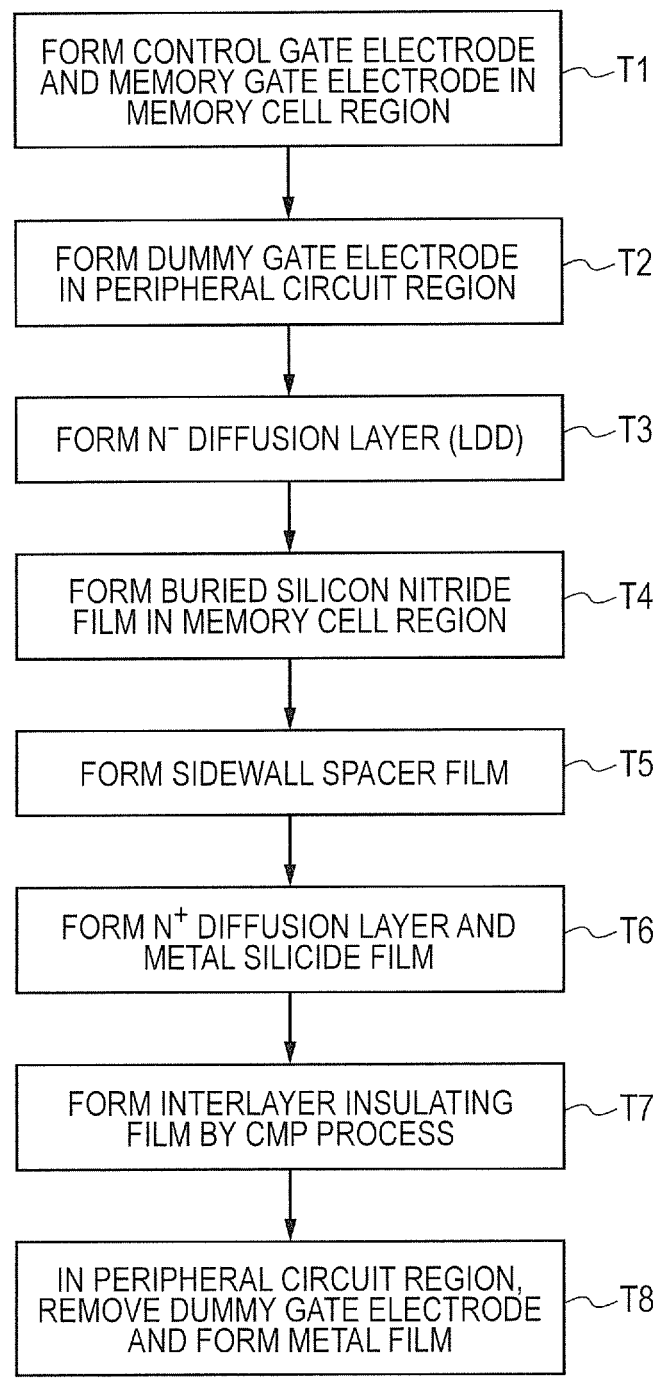
FIG. 73 is a view showing a manufacturing flow of a semiconductor device in the same embodiment.

Next, one example of a manufacturing method of the semiconductor device will be described. First, main manufacturing steps will be described by a flowchart. As illustrated in FIG. 73, a control gate electrode and a memory gate electrode are formed in a memory cell region in Step T1. In Step T2, a dummy gate electrode is formed in a peripheral circuit region. In Step T3, an N– diffusion layer (LDD region) is formed. In Step T4, a buried silicon nitride film is formed in the memory cell region. In Step T5, a sidewall spacer film is formed. In Step T6, an N+ diffusion layer is formed. Next, a metal silicide layer is formed. In Step T7, an interlayer insulating film is formed and flattened by a CMP process. In Step T8, the dummy gate electrode is removed. Next, an original metal film to serve as a gate electrode is formed.

Figure 74:
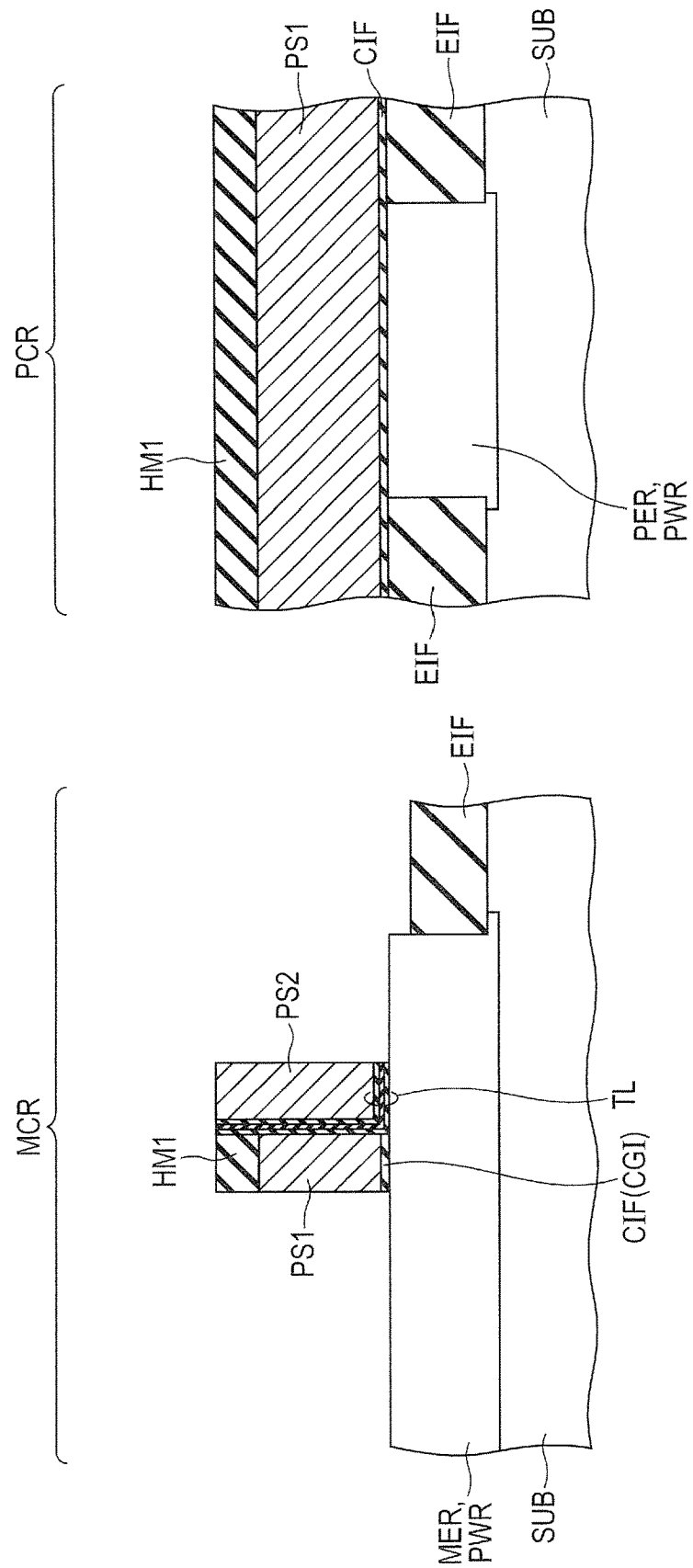
FIG. 74 is sectional views illustrating one step of the manufacturing method of a semiconductor device in the same embodiment, each taken along the section line corresponding to the section line III-III.
Figure 75:
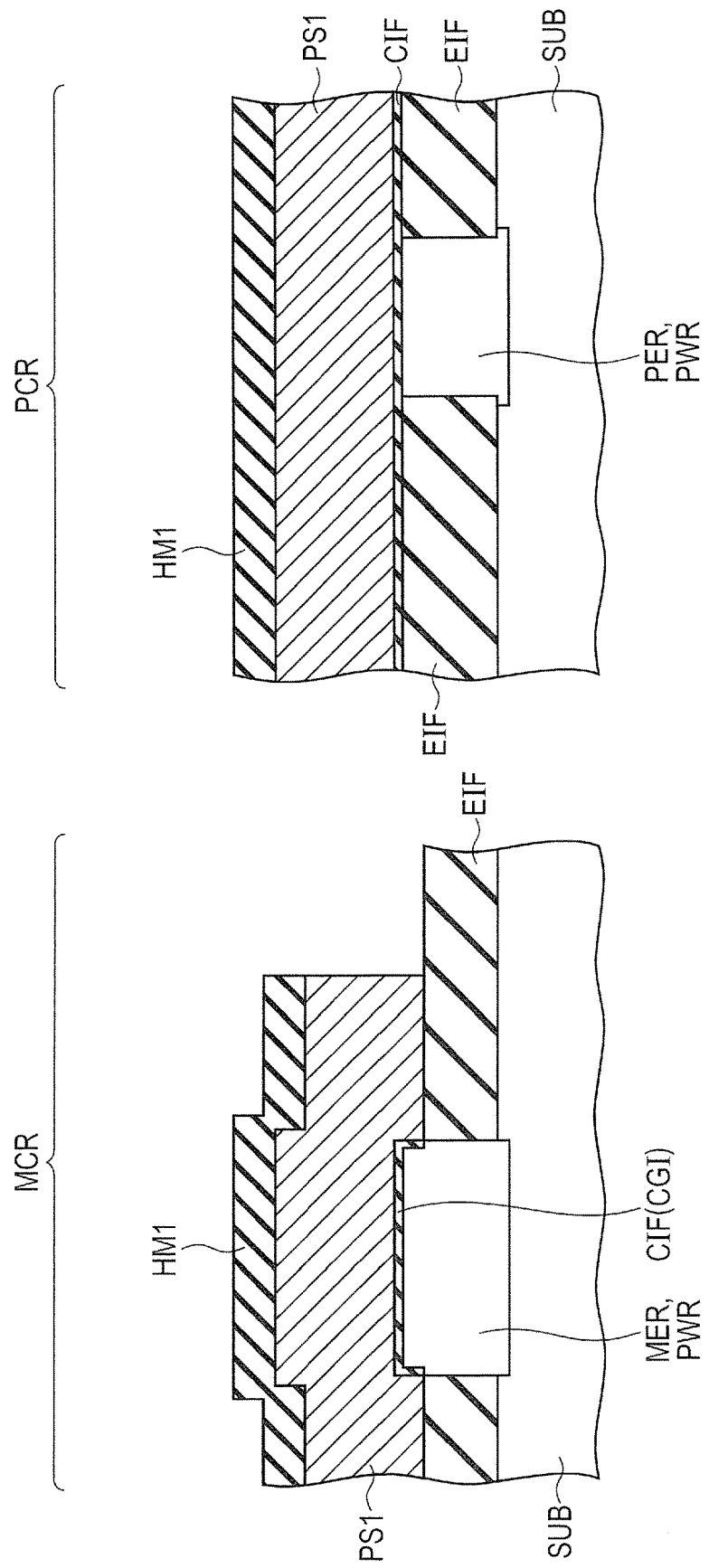
FIG. 75 is sectional views illustrating the one step of the manufacturing method of a semiconductor device in the same embodiment, each taken along the section line corresponding to the section line IV-IV.
Figure 76:
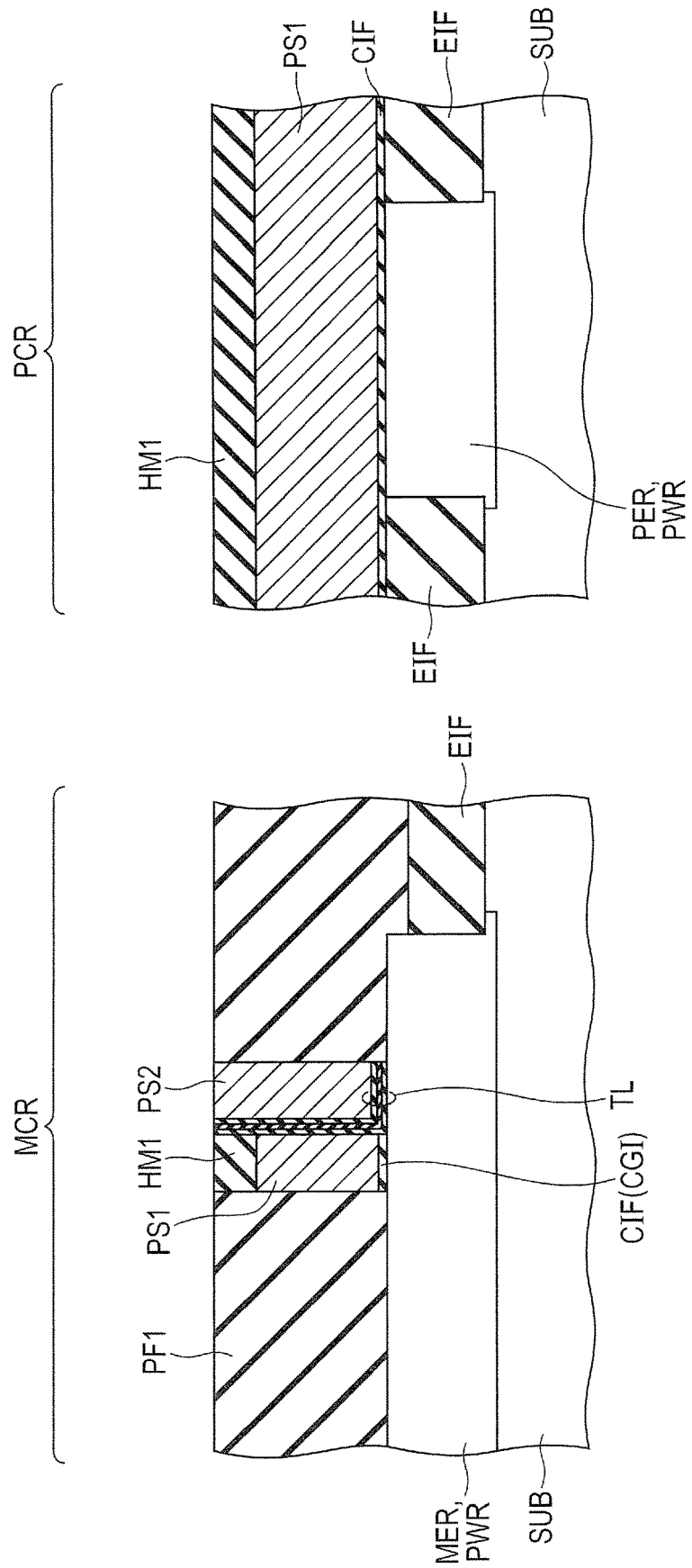
FIG. 76 is sectional views illustrating a step performed after the step illustrated in FIGS. 74 and 75 in the same embodiment, each taken along the section line corresponding to the section line III-III.
Figure 77:
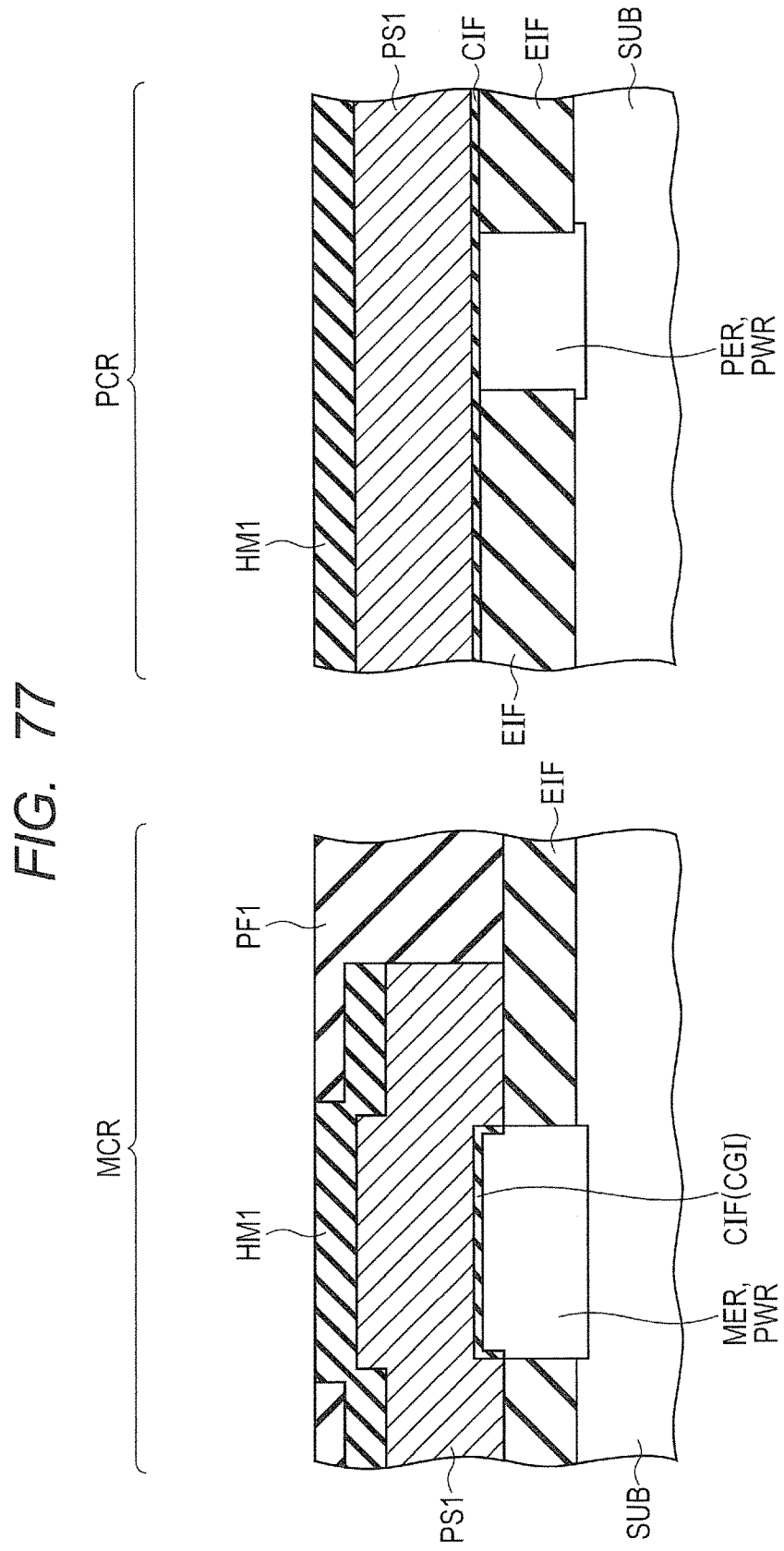
FIG. 77 is sectional views illustrating the step performed after the step illustrated in FIGS. 74 and 75 in the same embodiment, each taken along the section line corresponding to the section line IV-IV.

Next, the manufacturing method of the semiconductor device will be described in more detail. First, through steps similar to those illustrated in FIGS. 8, 9 to 16, and 17, the sidewall-shaped pattern of the conductive film PS2 to serve as the memory gate electrode is left, via the ONO film TL, over one side surface of the pattern of the conductive film PS1 to serve as the control gate electrode, as illustrated in FIGS. 74 and 75. Next, the insulating film PF1 is flattened through steps similar to those illustrated in FIGS. 18, 19 to 20, and 21, as illustrated in FIGS. 76 and 77.

Figure 78:
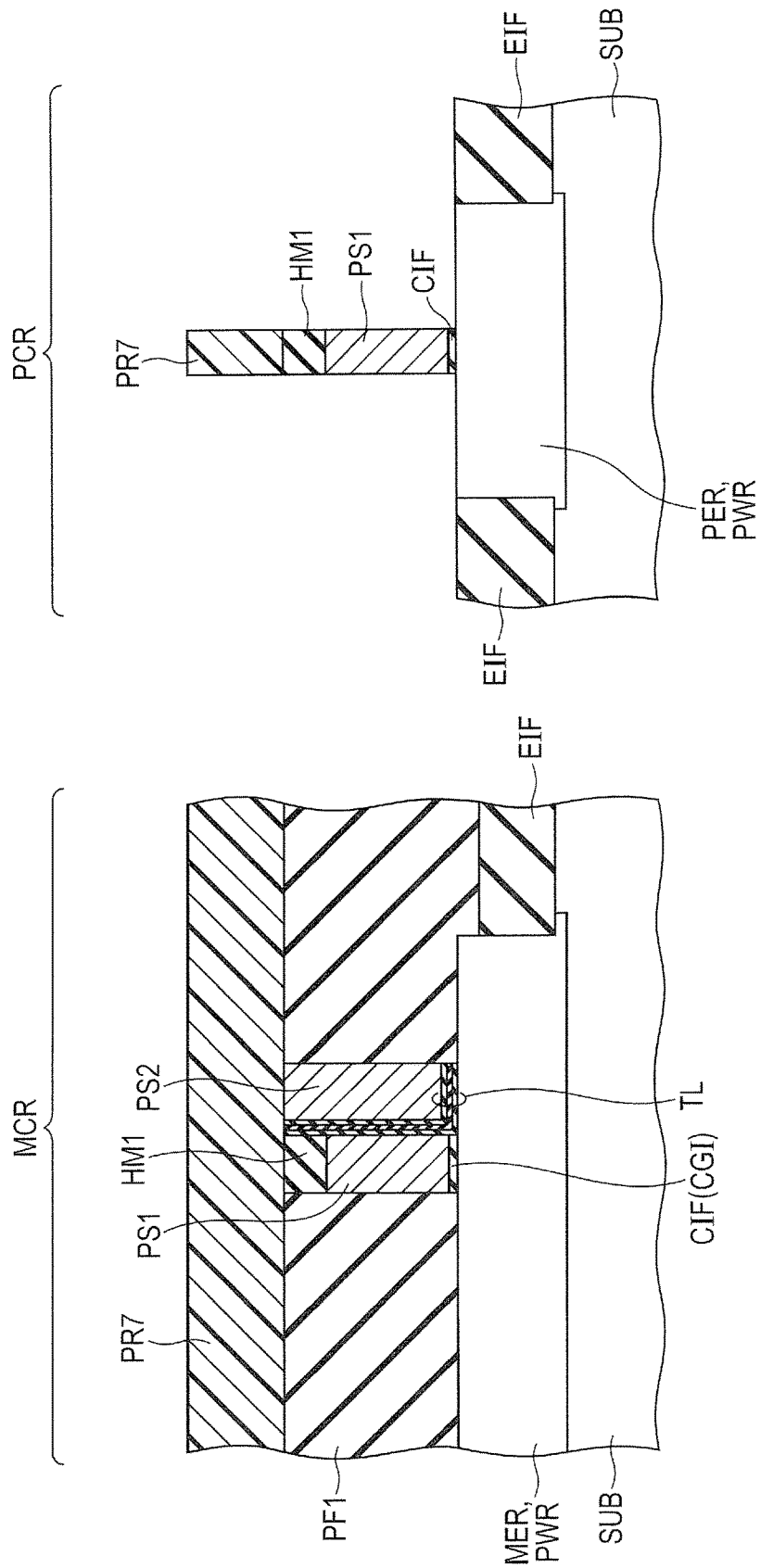
FIG. 78 is sectional views illustrating a step performed after the step illustrated in FIGS. 76 and 77 in the same embodiment, each taken along the section line corresponding to the section line III-III.
Figure 79:
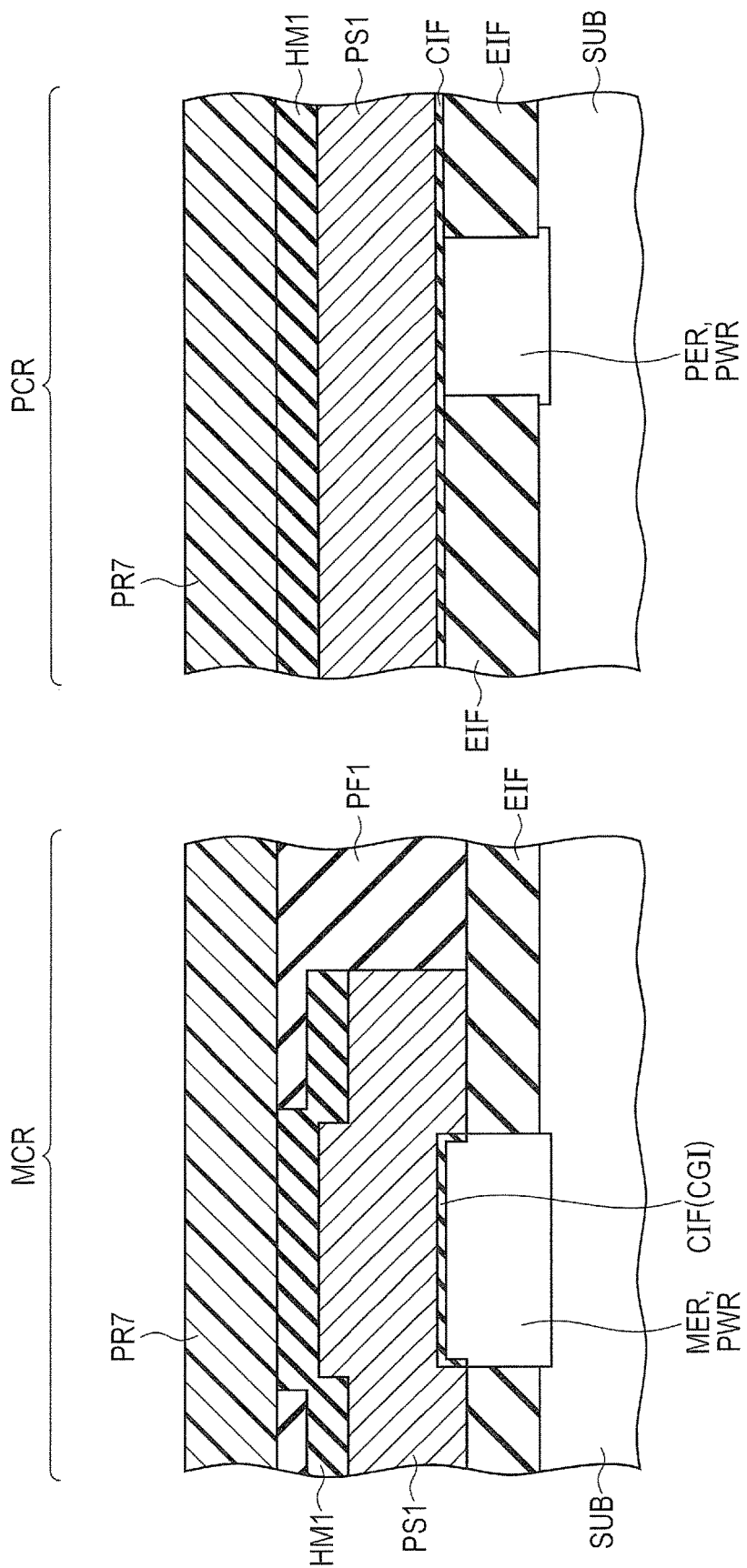
FIG. 79 is sectional views illustrating the step performed after the step illustrated in FIGS. 76 and 77 in the same embodiment, each taken along the section line corresponding to the section line IV-IV.

Next, a photoresist pattern PR7 for patterning the conductive film PS1 in the peripheral circuit region PCR is formed by performing a predetermined photoengraving process, as illustrated in FIGS. 78 and 79. Next, the conductive film PS1 in the peripheral circuit region PCR is patterned into a gate electrode shape by performing anisotropic etching using the photoresist pattern PR7 as an etching mask, whereby a dummy gate electrode including the conductive film PS1 is formed. Thereafter, the photoresist pattern PR7 is removed.

Figure 80:
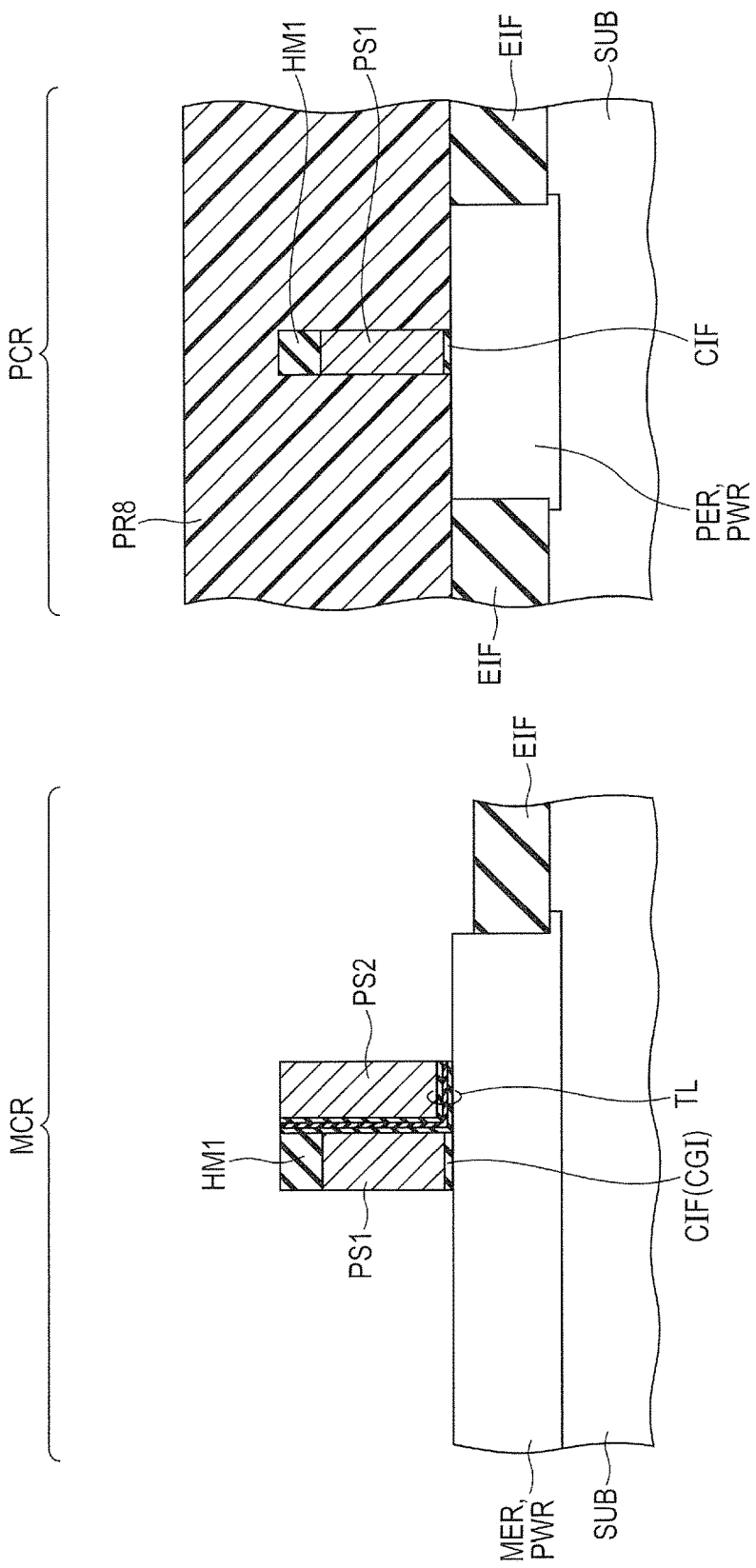
FIG. 80 is sectional views illustrating a step performed after the step illustrated in FIGS. 78 and 79 in the same embodiment, each taken along the section line corresponding to the section line III-III.
Figure 81:
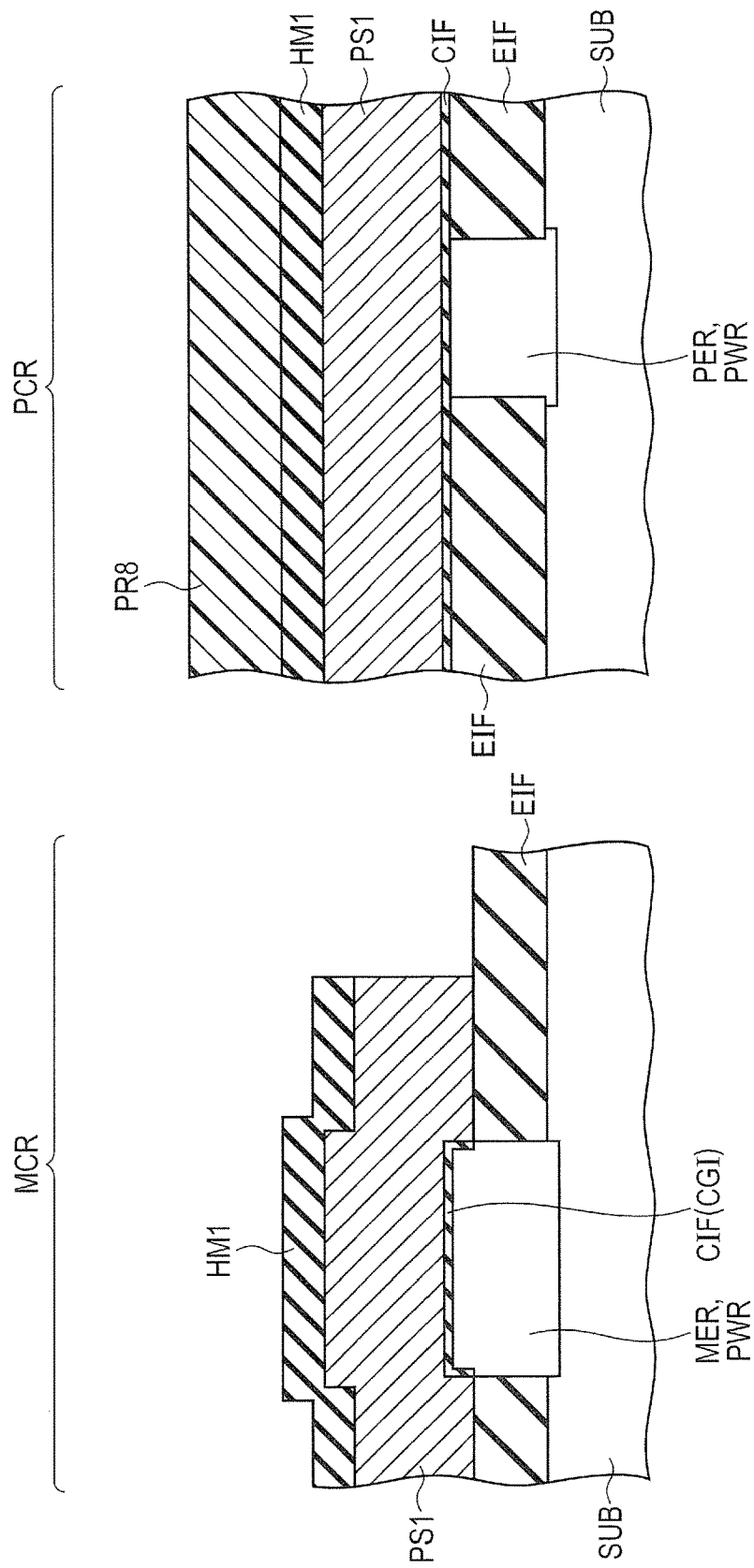
FIG. 81 is sectional views illustrating the step performed after the step illustrated in FIGS. 78 and 79 in the same embodiment, each taken along the section line corresponding to the section line IV-IV.

Next, a photoresist pattern PR8, for covering the peripheral circuit region PCR and exposing the memory cell region MCR, is formed by performing a predetermined photoengraving process, as illustrated in FIGS. 80 and 81. Next, the insulating film PF1 located in the memory cell region MCR is removed by performing an etching process using the photoresist pattern PR8 as an etching mask. Thereafter, the photoresist pattern PR8 is removed.

Figure 82:
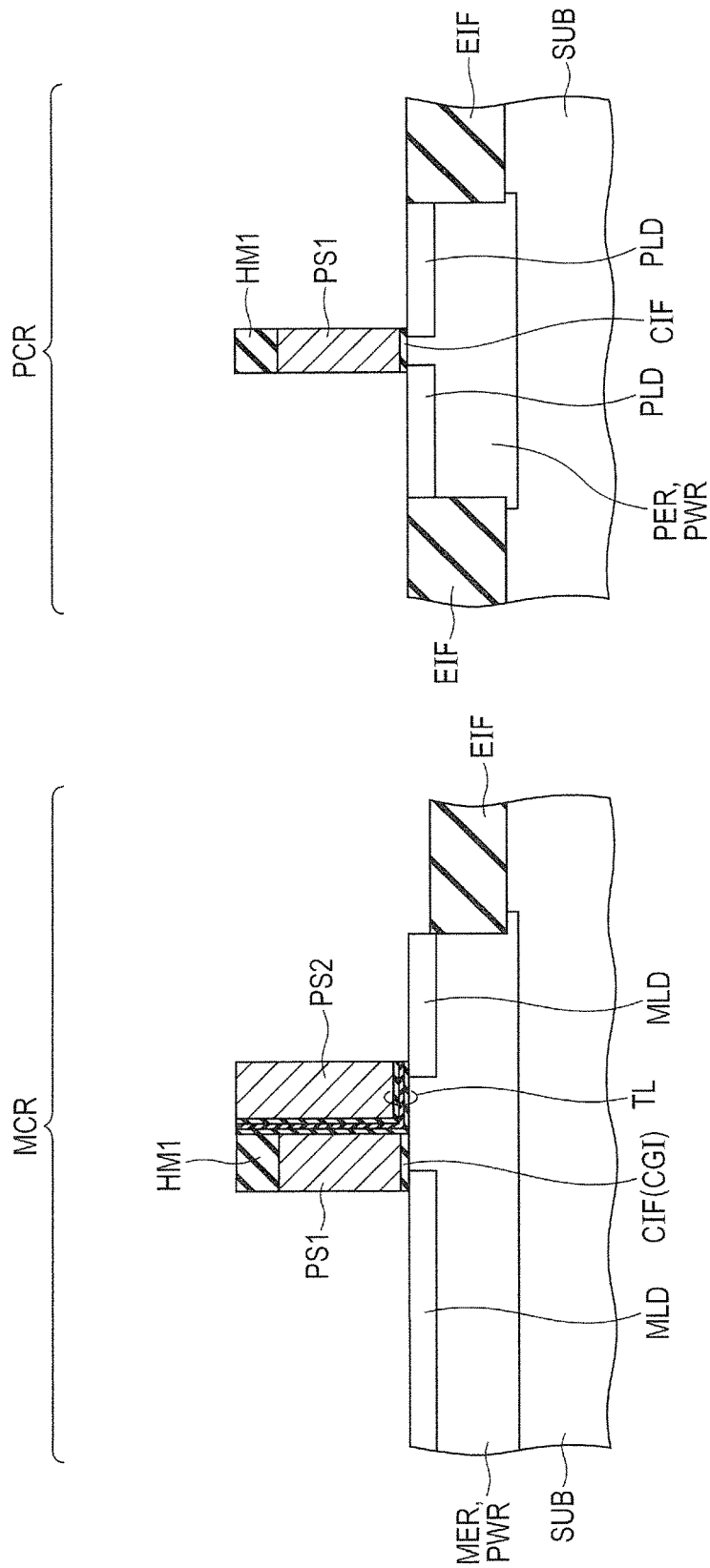
FIG. 82 is sectional views illustrating a step performed after the step illustrated in FIGS. 80 and 81 in the same embodiment, each taken along the section line corresponding to the section line III-III.
Figure 83:
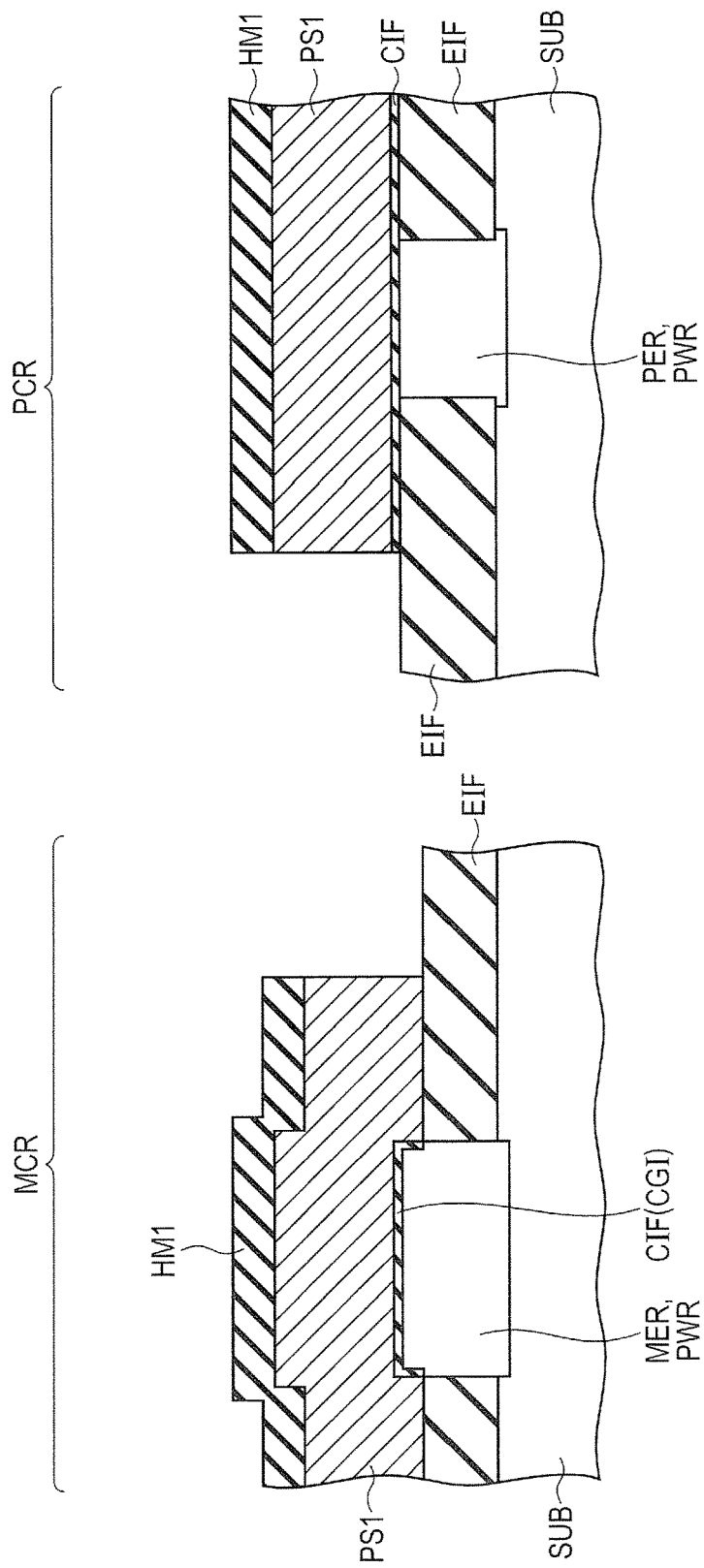
FIG. 83 is sectional views illustrating the step performed after the step illustrated in FIGS. 80 and 81 in the same embodiment, each taken along the section line corresponding to the section line IV-IV.

Next, n-type impurities are implanted by using, as implantation masks, the pattern of the conductive film PS1 to serve as the control gate electrode, the pattern of the conductive film PS2 to serve as the memory gate electrode, the pattern of the dummy gate electrode including the conductive film PS1, and the like, as illustrated in FIGS. 82 and 83. Thereby, the N– diffusion layer MLD is formed, as an LDD region, in the memory active region MER. In the peripheral active region PER, the N– diffusion layer PLD is formed as an LDD region.

Figure 84:
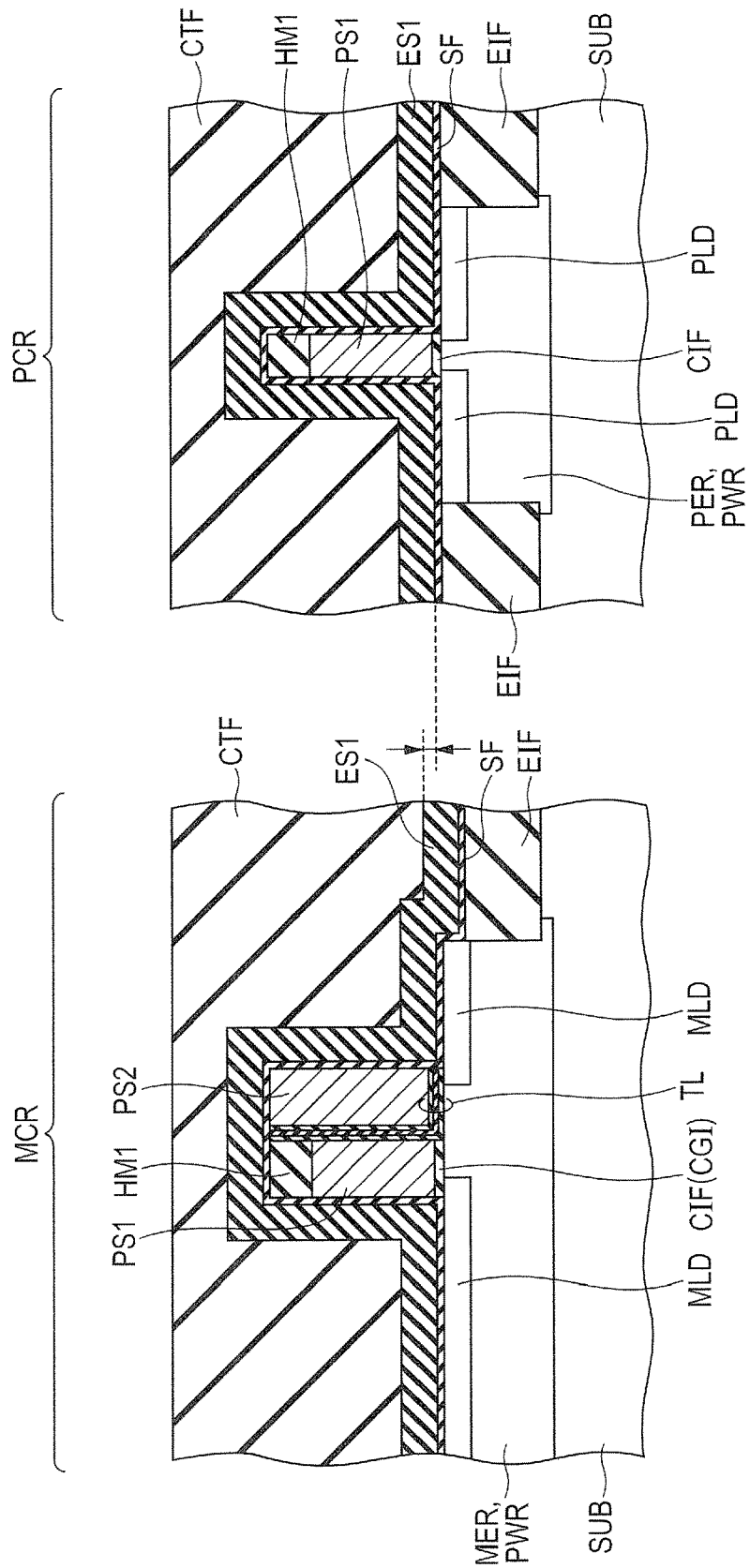
FIG. 84 is sectional views illustrating a step performed after the step illustrated in FIGS. 82 and 83 in the same embodiment, each taken along the section line corresponding to the section line III-III.
Figure 85:
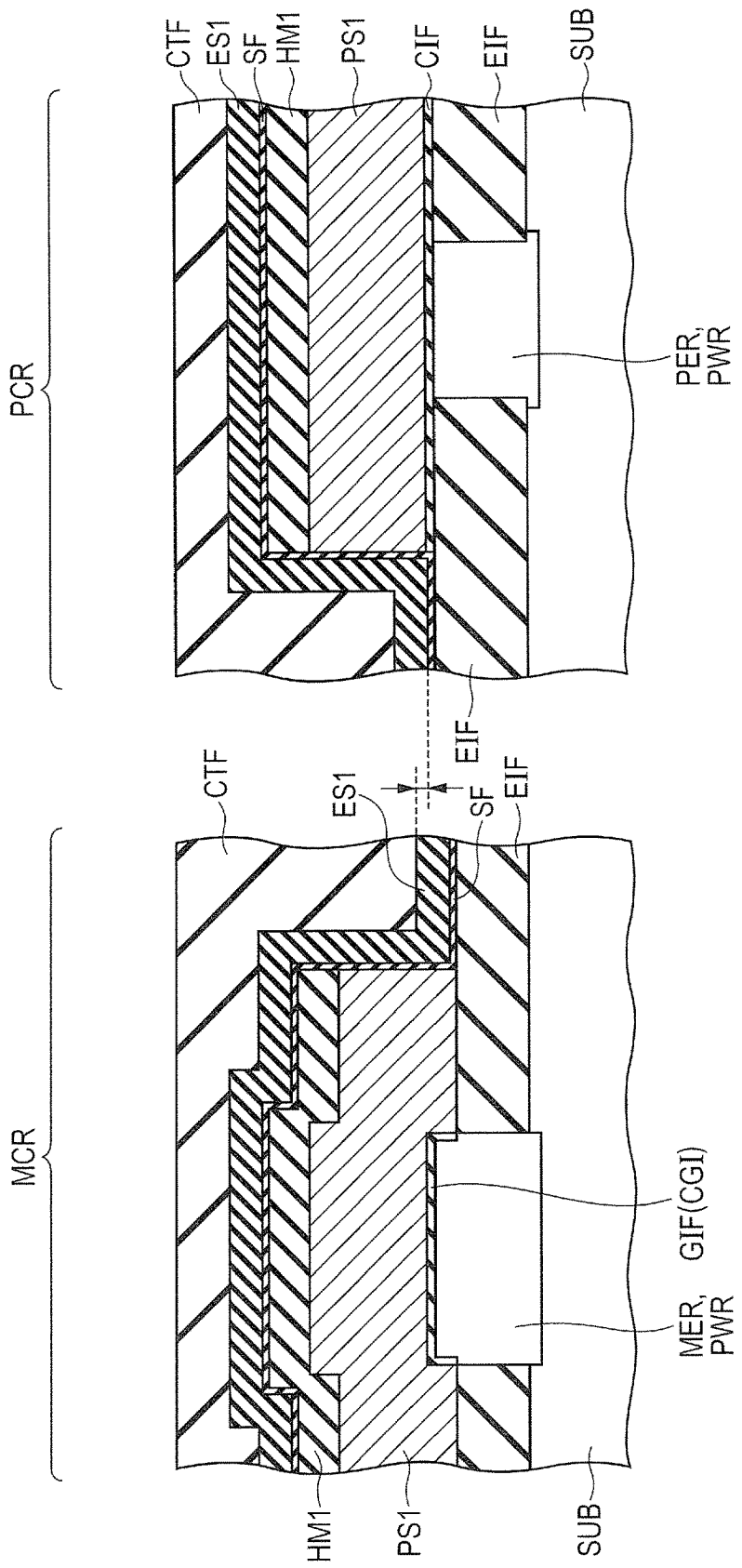
FIG. 85 is sectional views illustrating the step performed after the step illustrated in FIGS. 82 and 83 in the same embodiment, each taken along the section line corresponding to the section line IV-IV.
Figure 86:
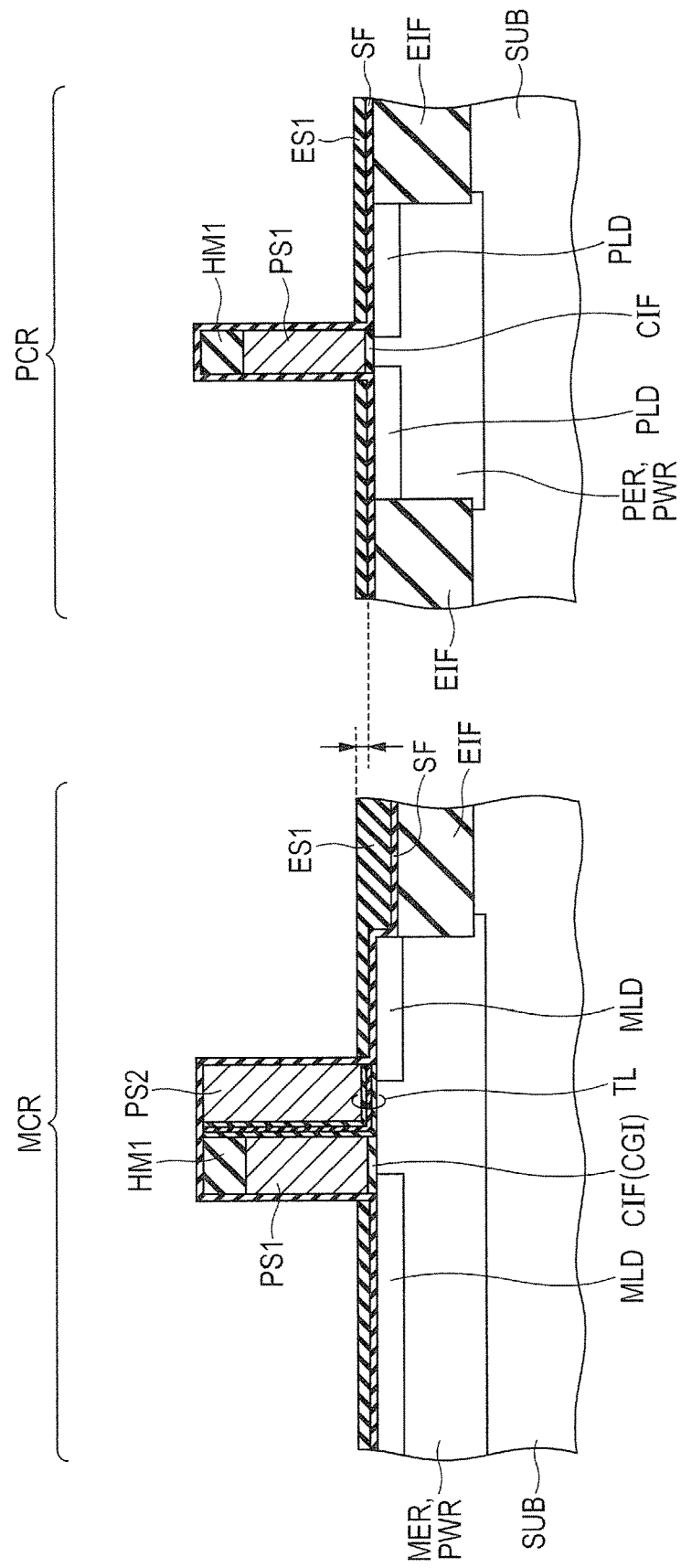
FIG. 86 is sectional views illustrating a step performed after the step illustrated in FIGS. 84 and 85 in the same embodiment, each taken along the section line corresponding to the section line III-III.
Figure 87:
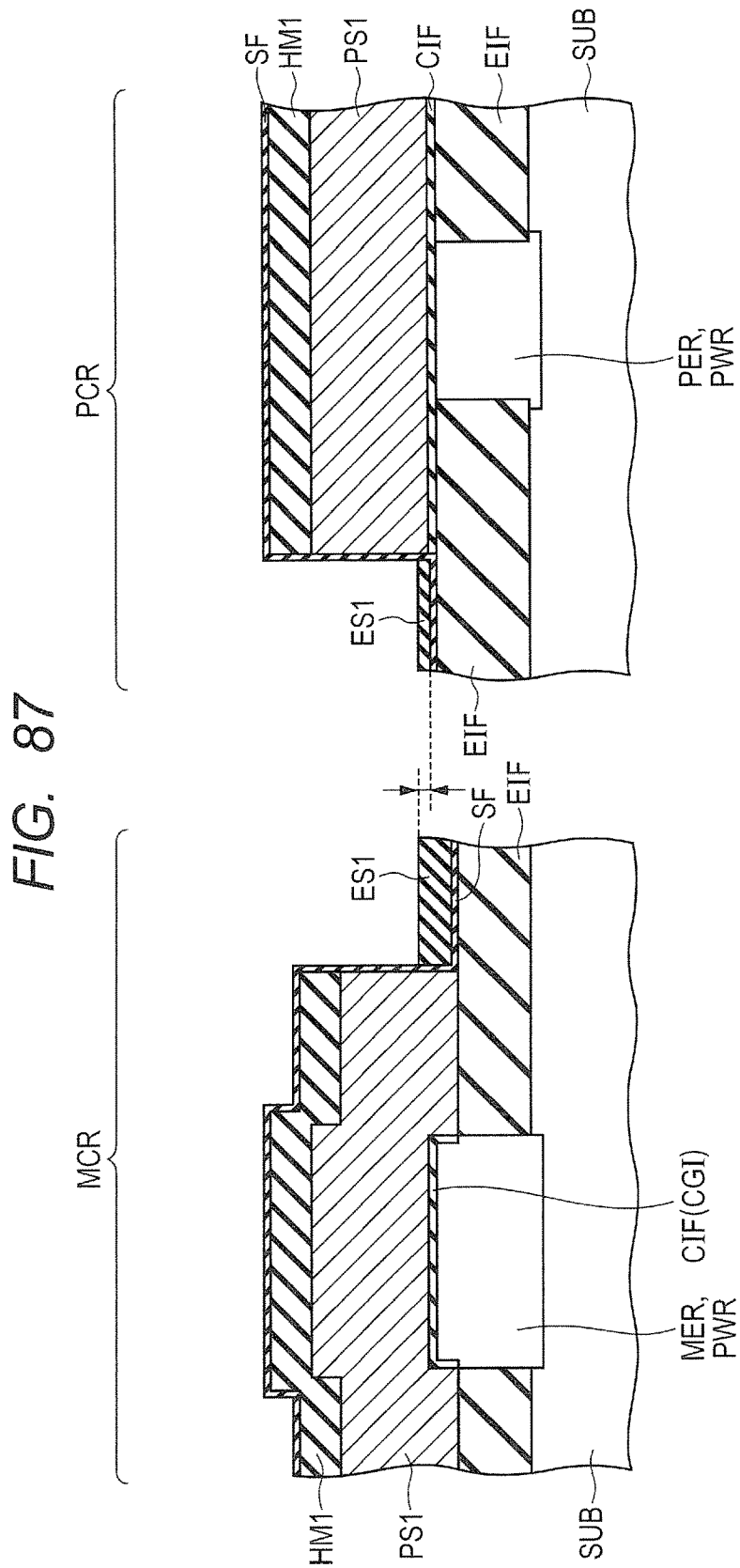
FIG. 87 is sectional views illustrating the step performed after the step illustrated in FIGS. 84 and 85 in the same embodiment, each taken along the section line corresponding to the section line IV-IV.

Next, the silicon oxide film SF including a silicon oxide film is formed to cover the semiconductor substrate SUB through a step similar to that illustrated in FIGS. 34 and 35, as illustrated in FIGS. 84 and 85. The buried silicon nitride film ES1 is formed to cover the silicon oxide film SF. The buried silicon nitride film ES1 is formed such that the position of the upper surface thereof is higher than that of the upper surface of the silicon oxide film SF located in the peripheral circuit region PCR (see the dotted lines). Further, the coating film CTF is formed to cover the buried silicon nitride film ES1. Next, after a step similar to that illustrated in FIGS. 36 and 37 is performed, the anisotropic etching process is stopped in a state where part of the buried silicon nitride film ES1 is left over the element isolation insulating film EIF and the like, as illustrated in FIGS. 86 and 87.

Figure 88:
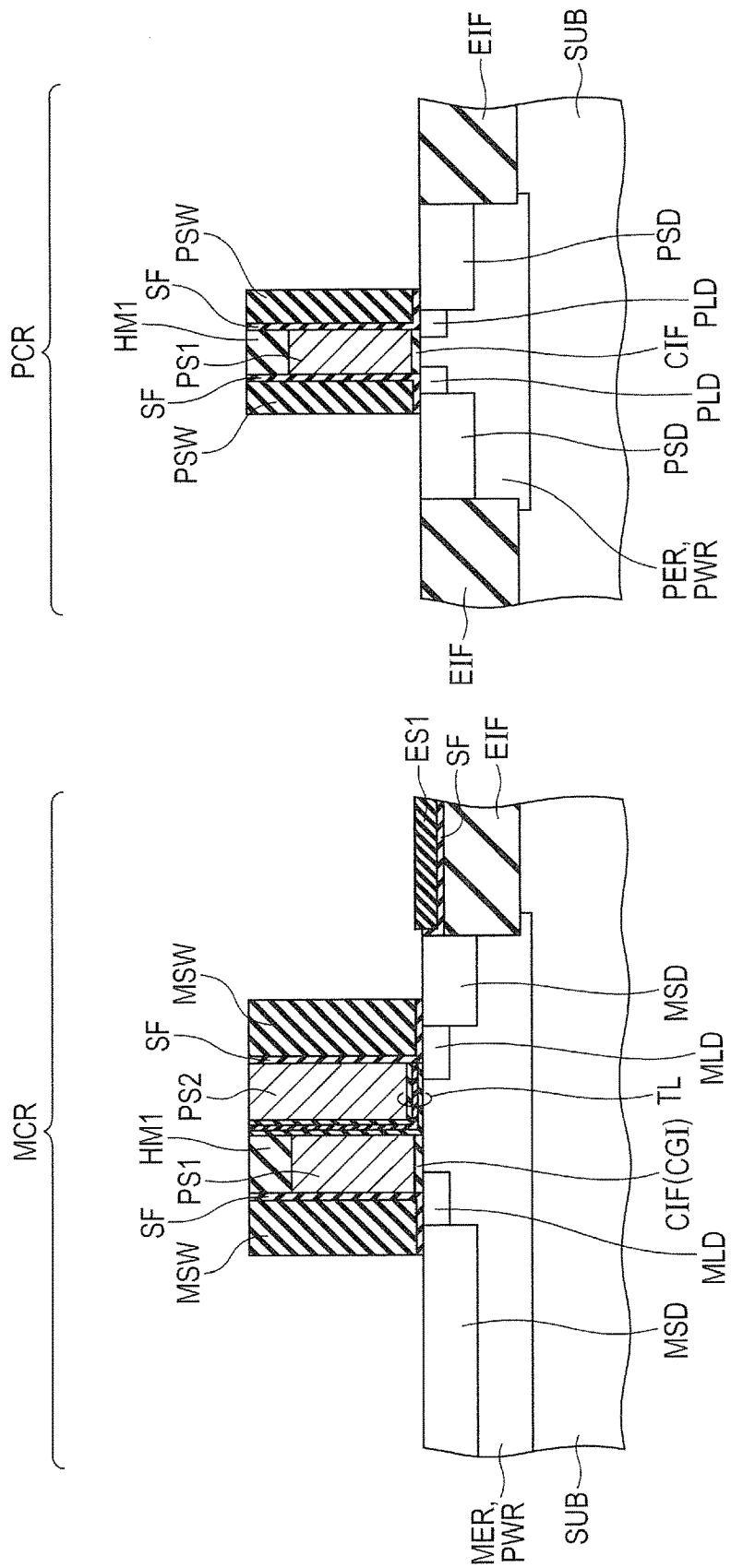
FIG. 88 is sectional views illustrating a step performed after the step illustrated in FIGS. 86 and 87 in the same embodiment, each taken along the section line corresponding to the section line III-III.
Figure 89:
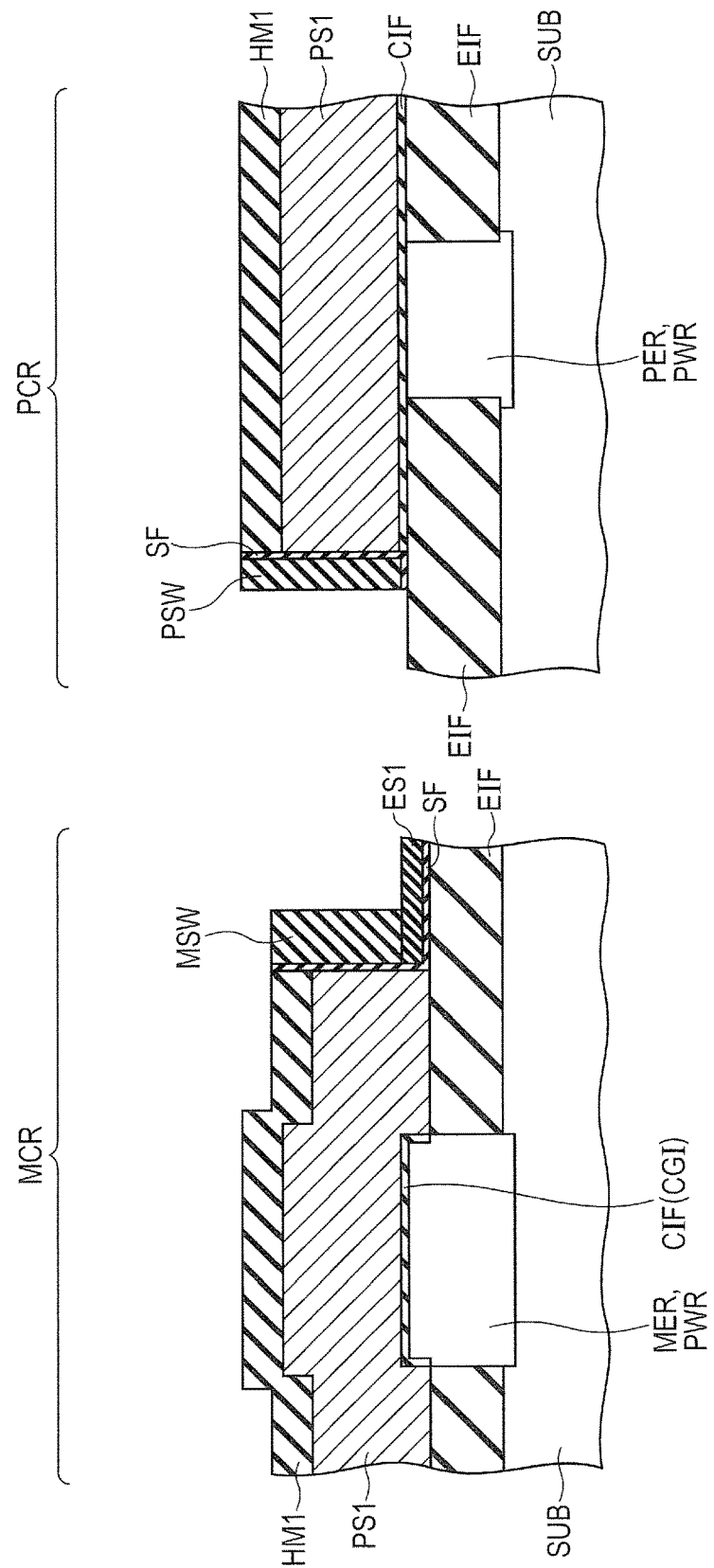
FIG. 89 is sectional views illustrating the step performed after the step illustrated in FIGS. 86 and 87 in the same embodiment, each taken along the section line corresponding to the section line IV-IV.

Next, through steps similar to those illustrated in FIGS. 38, 39 to 40, and 41, the buried silicon nitride film ES1 is left, in the memory cell region MCR, over the upper surface of the element isolation insulating film EIF retreated from the main surface of the semiconductor substrate SUB, as illustrated in FIGS. 88 and 89. The sidewall spacer film MSW is formed over the side surface of the pattern of the conductive film PS1 to serve as the control gate electrode. The sidewall spacer film MSW is formed over the side surface of the pattern of the conductive film PS2 to serve as the memory gate electrode. In the peripheral circuit region PCR, the sidewall spacer film PSW is formed over the side surface of the pattern of the dummy gate electrode including the conductive film PS1. At this time, the position of the upper surface of the buried silicon nitride film ES1 is higher than that of the upper surface of the element isolation insulating film EIF defining the peripheral active region PER. Herein, the sidewall spacer film MSW and the sidewall spacer film PSW may be formed such that the widths thereof are different from each other.

Figure 90:
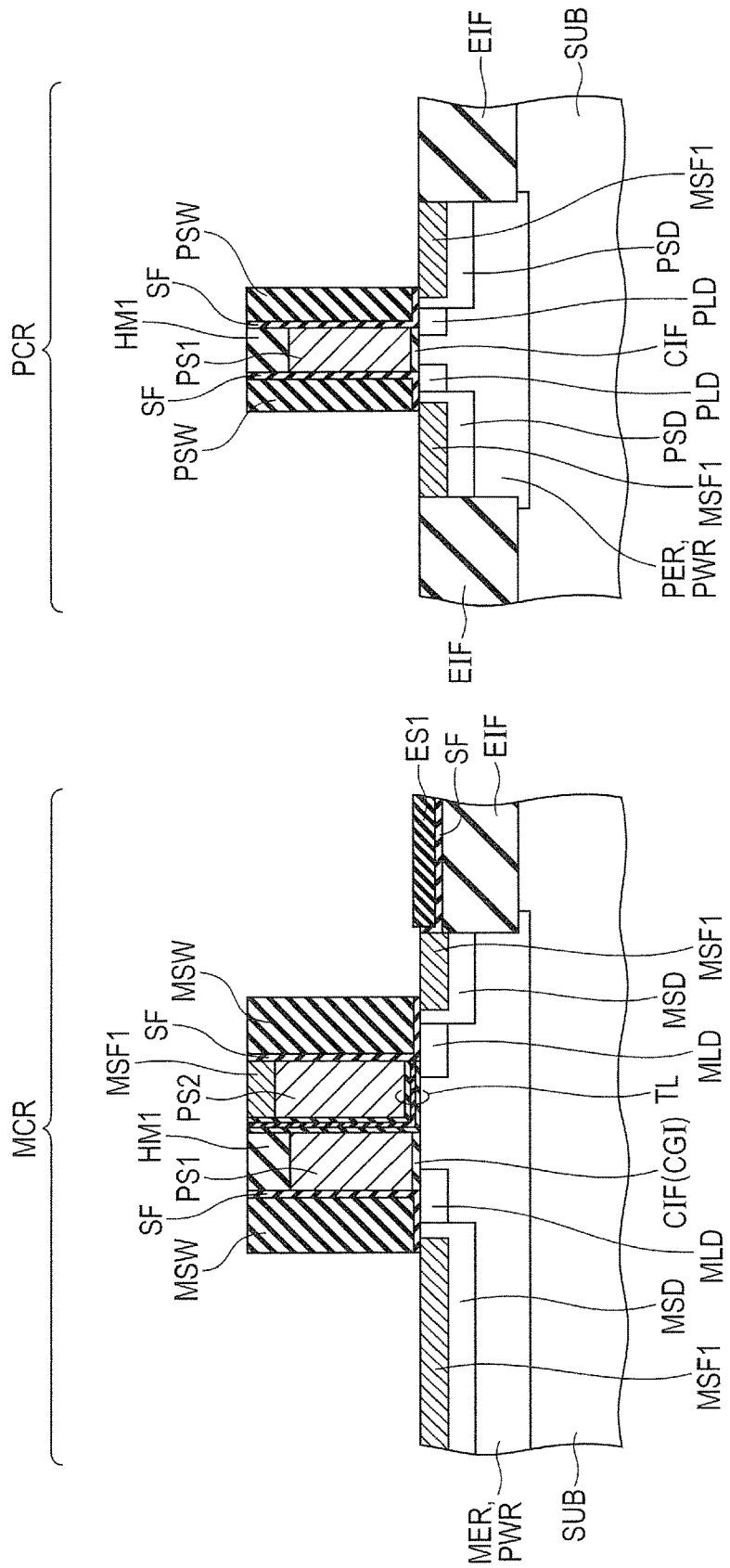
FIG. 90 is sectional views illustrating a step performed after the step illustrated in FIGS. 88 and 89 in the same embodiment, each taken along the section line corresponding to the section line III-III.
Figure 91:
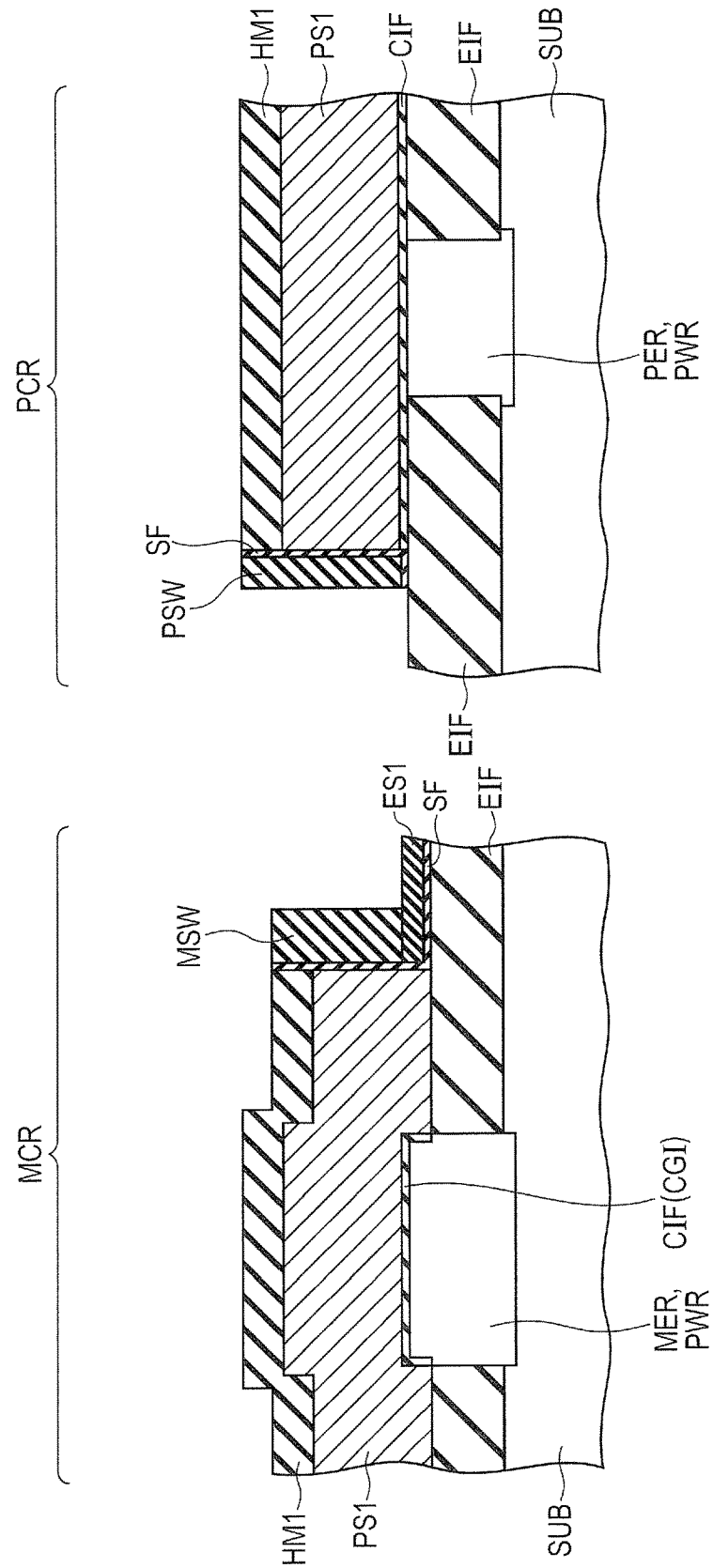
FIG. 91 is sectional views illustrating the step performed after the step illustrated in FIGS. 88 and 89 in the same embodiment, each taken along the section line corresponding to the section line IV-IV.

Next, the N+ diffusion layer MSD is formed in the memory active region MER through a step similar to that illustrated in FIGS. 42 and 43, as illustrated in FIGS. 90 and 91. In the peripheral active region PER, the N+ diffusion layer PSD is formed. The metal silicide layer MSF1 is formed over each of the surface of the N+ diffusion layer MSD, the surface of the N+ diffusion layer PSD, and the upper surface of the pattern of the conductive film PS2 to serve as the memory gate electrode.

Figure 92:
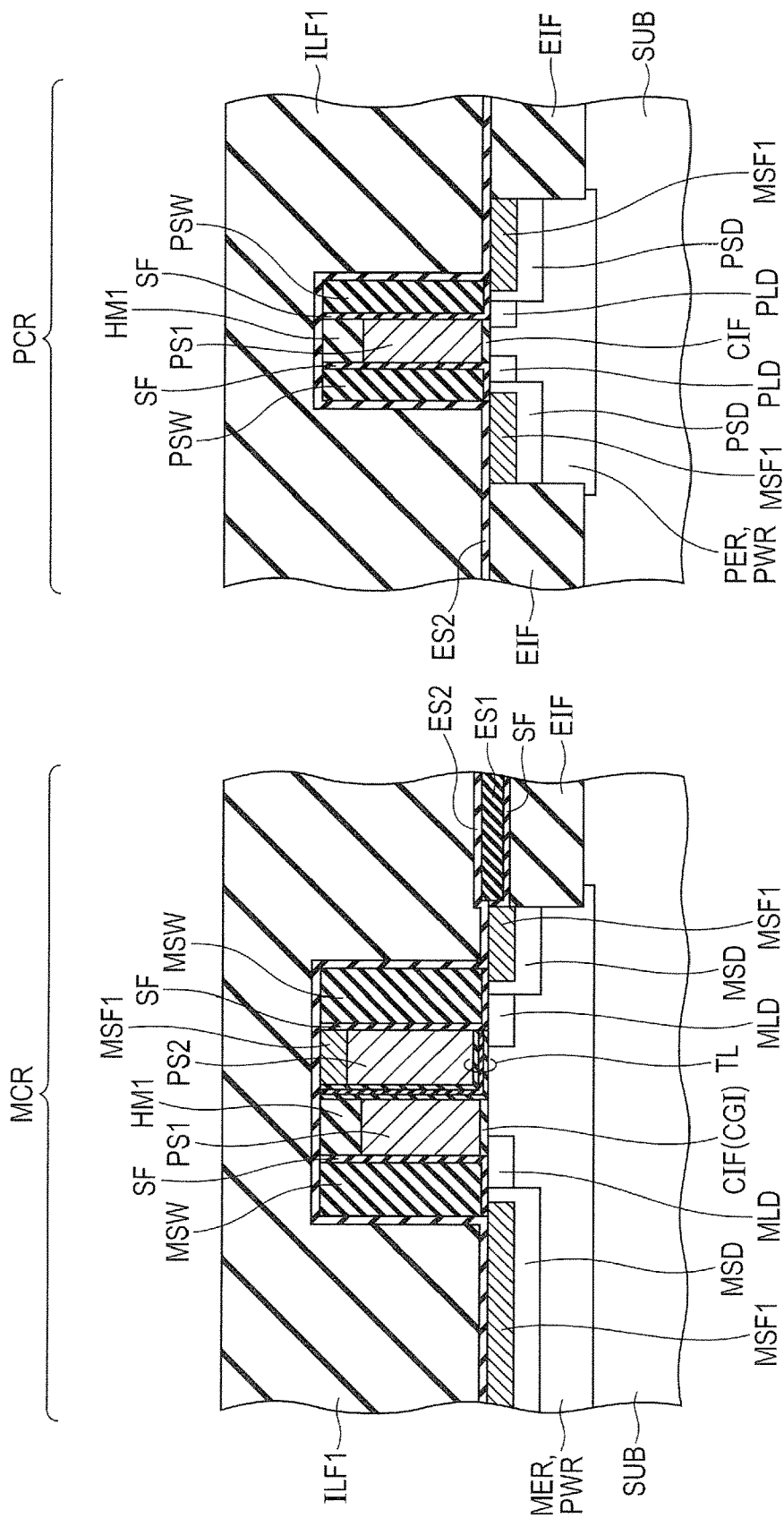
FIG. 92 is sectional views illustrating a step performed after the step illustrated in FIGS. 90 and 91 in the same embodiment, each taken along the section line corresponding to the section line III-III.
Figure 93:
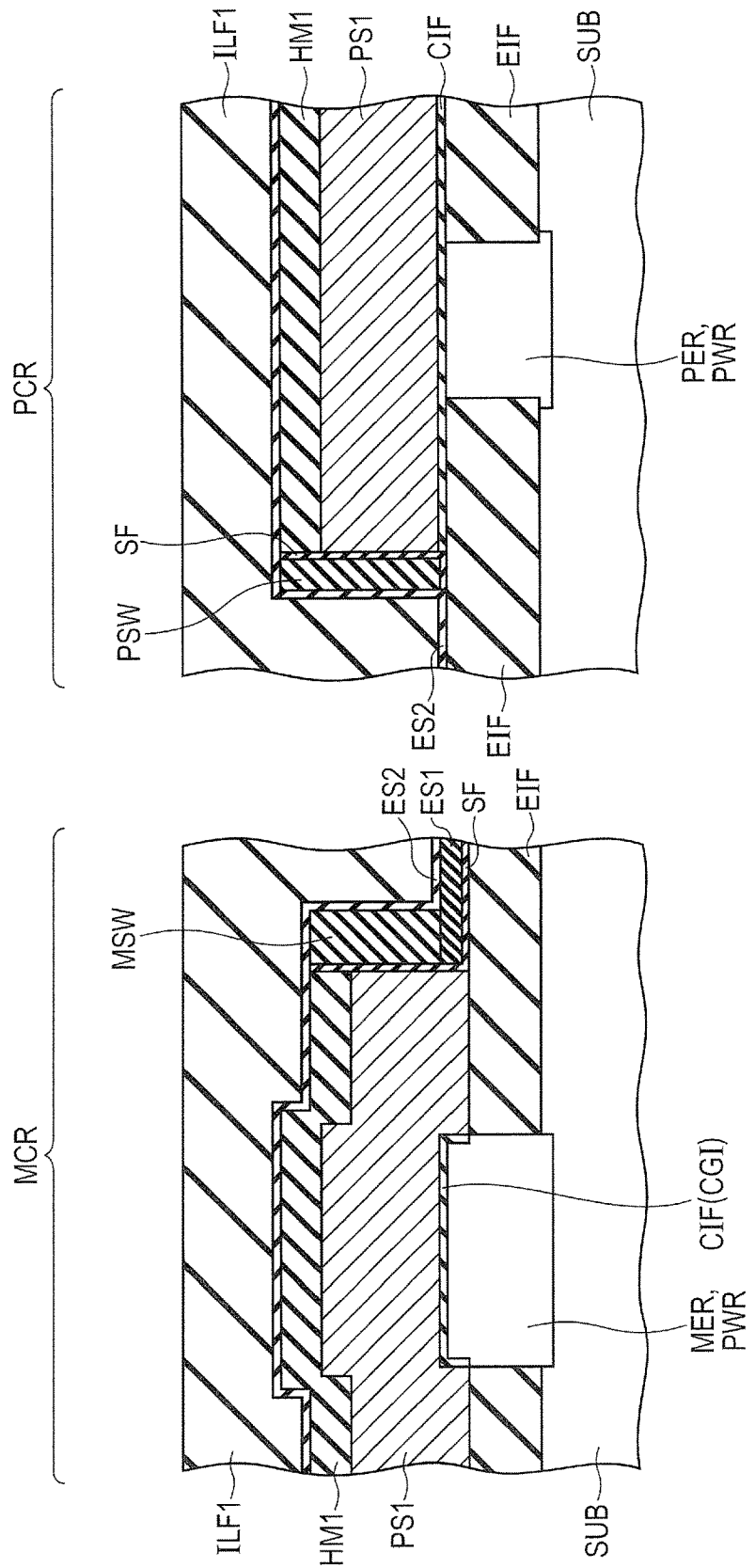
FIG. 93 is sectional views illustrating the step performed after the step illustrated in FIGS. 90 and 91 in the same embodiment, each taken along the section line corresponding to the section line IV-IV.
Figure 94:
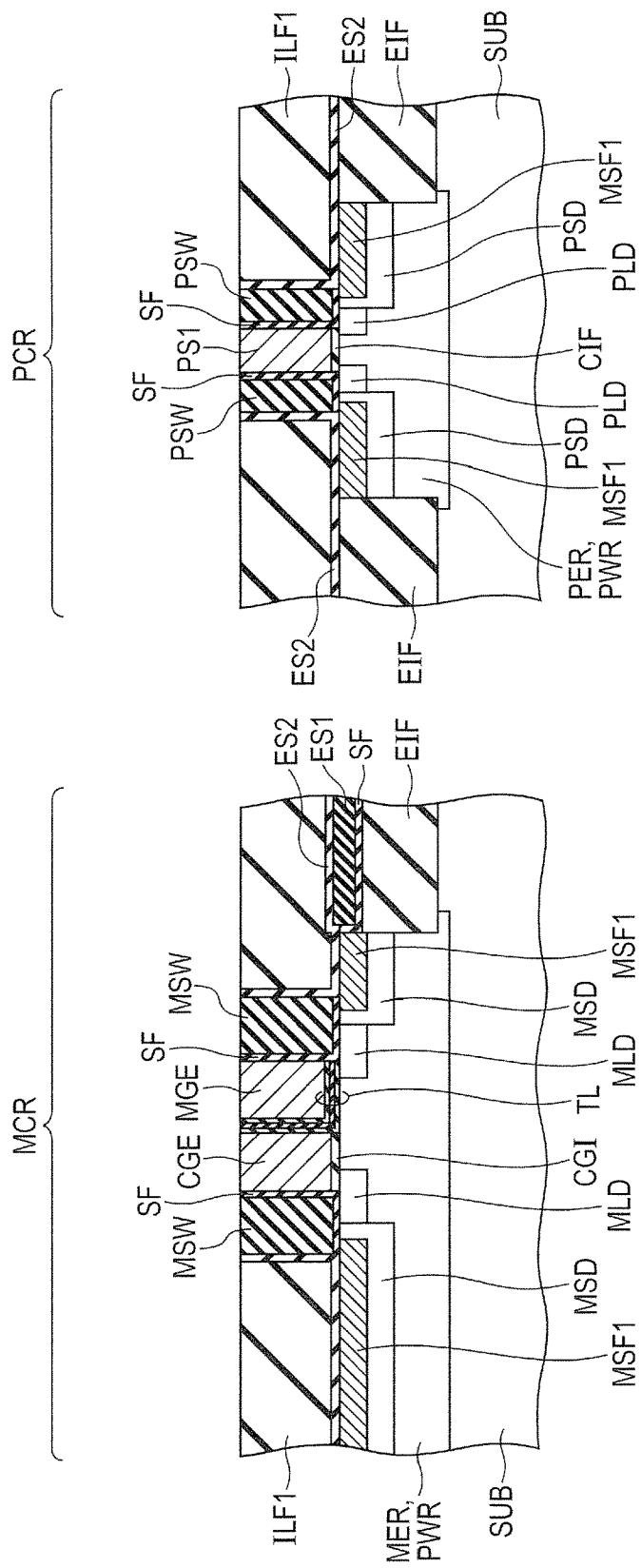
FIG. 94 is sectional views illustrating a step performed after the step illustrated in FIGS. 92 and 93 in the same embodiment, each taken along the section line corresponding to the section line III-III.
Figure 95:
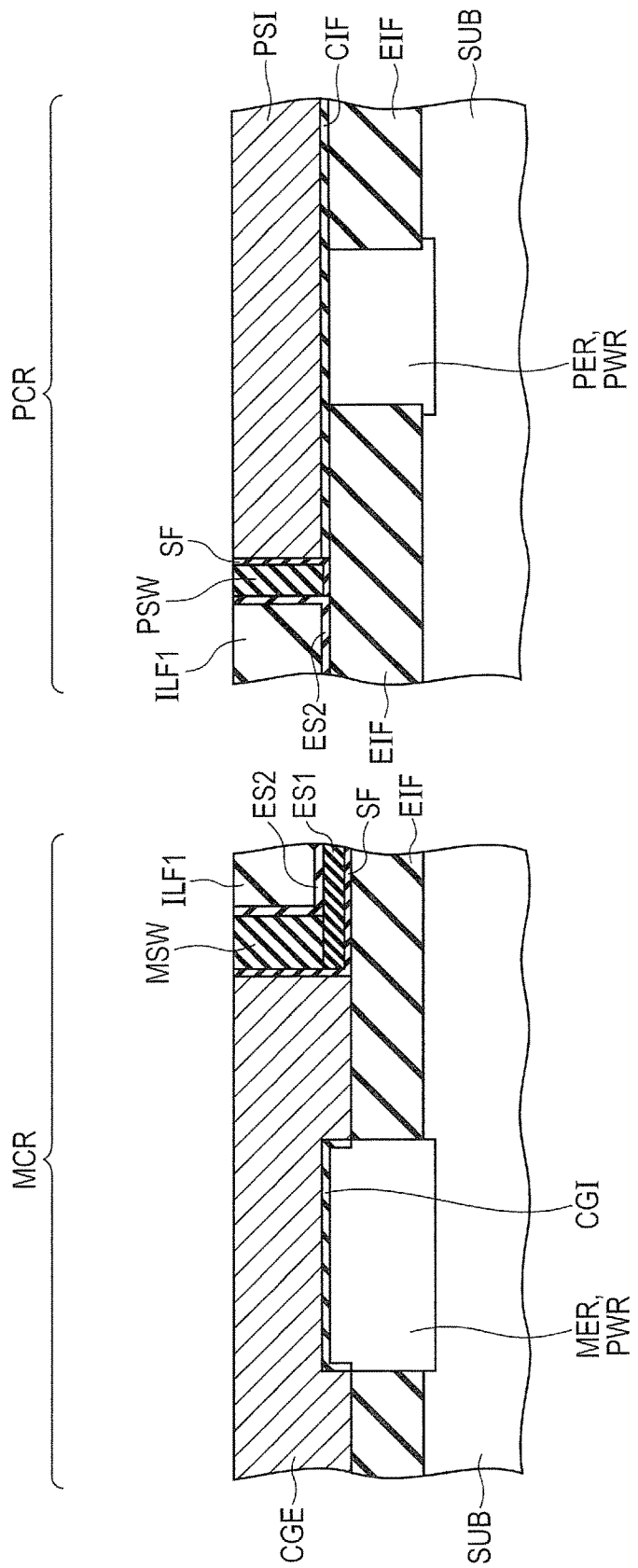
FIG. 95 is sectional views illustrating the step performed after the step illustrated in FIGS. 92 and 93 in the same embodiment, each taken along the section line corresponding to the section line IV-IV.

Next, the etching stopper film ES2 is formed to cover the semiconductor substrate SUB through a step similar to that illustrated in FIGS. 44 and 45, as illustrated in FIGS. 92 and 93. Next, the interlayer insulating film ILF1 is formed to cover the etching stopper film ES2. Next, after a step similar to that illustrated in FIGS. 46 and 47 is performed, the interlayer insulating film ILF1 is flattened by performing a chemical mechanical polishing process, as illustrated in FIGS. 94 and 95. Thereby, the control gate electrode CGE and the memory gate electrode MGE are formed in the memory cell region MCR. The control gate electrode CGE is formed over the surface of the well region PWR via the control gate insulating film CGI (CIF). In the peripheral circuit region PCR, the upper surface of the pattern of the dummy gate electrode including the conductive film PS1 is exposed.

Figure 96:
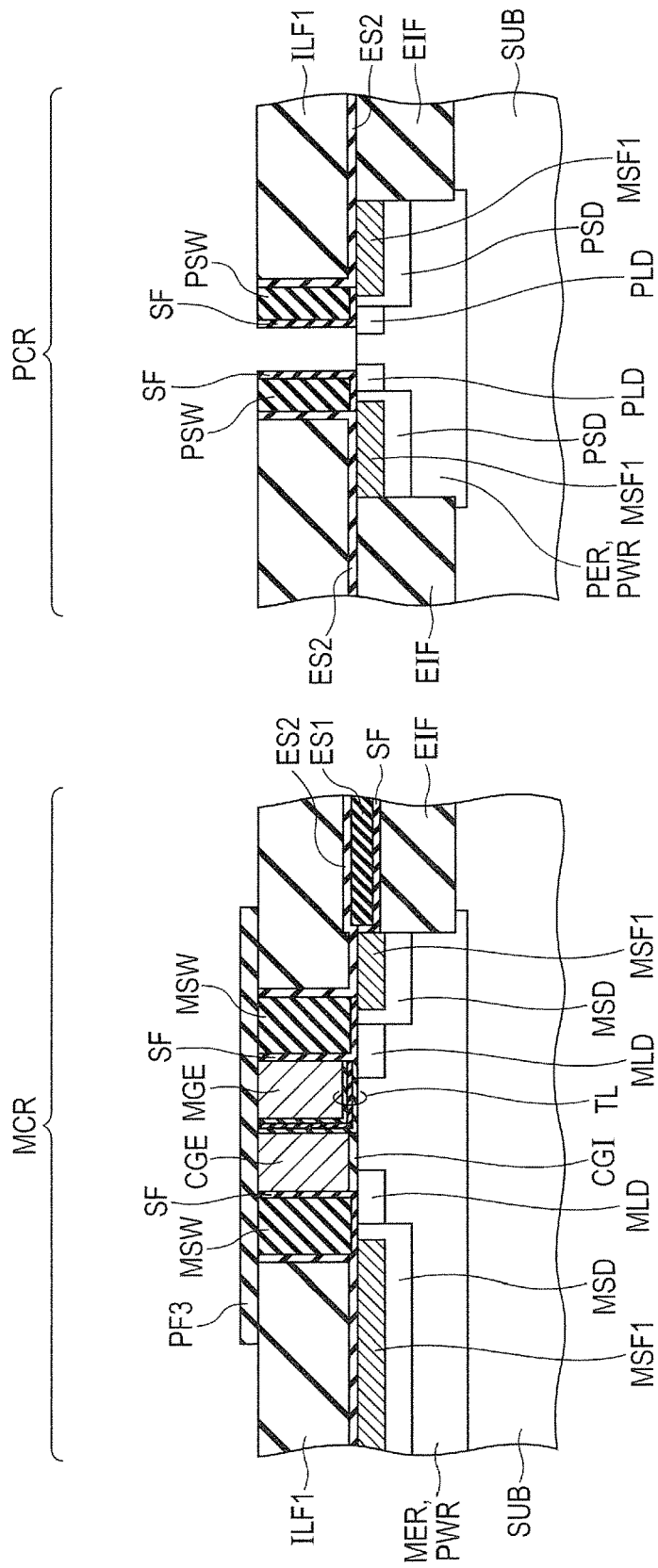
FIG. 96 is sectional views illustrating a step performed after the step illustrated in FIGS. 94 and 95 in the same embodiment, each taken along the section line corresponding to the section line III-III.
Figure 97:
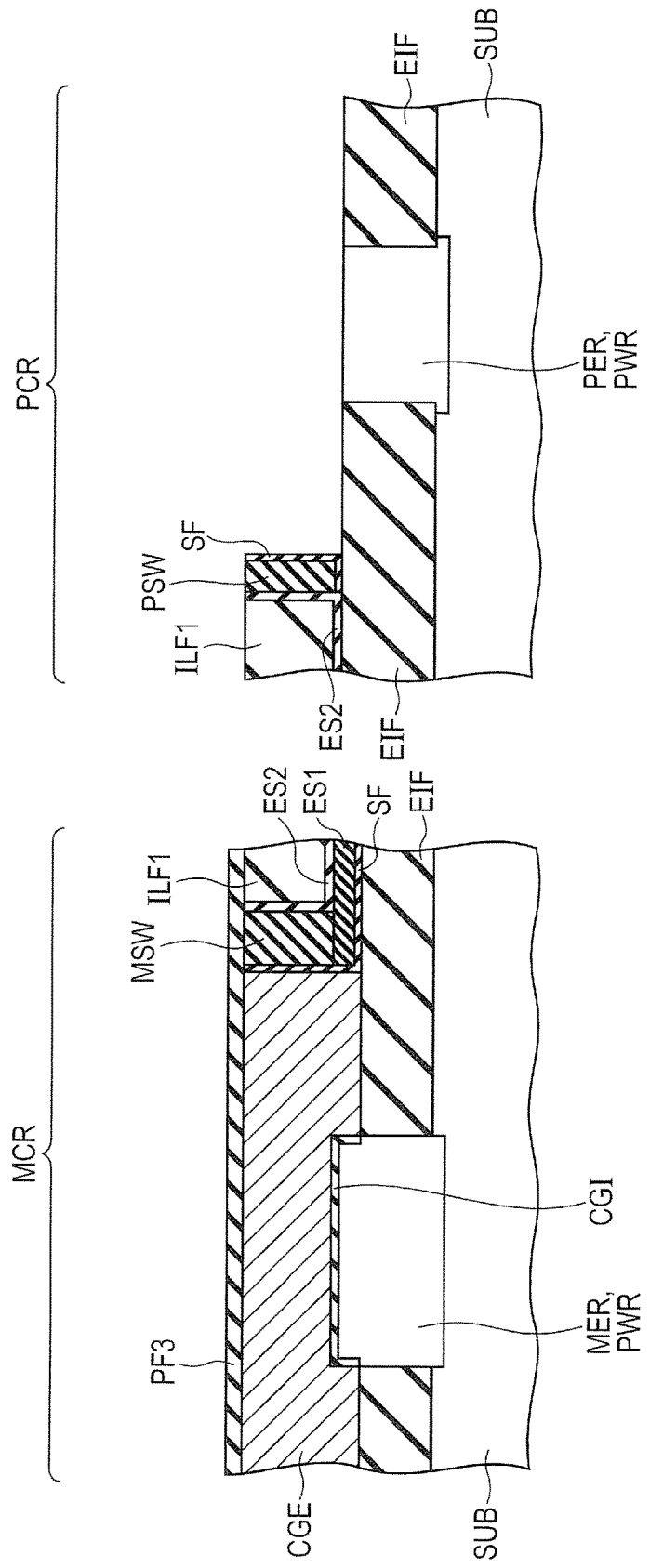
FIG. 97 is sectional views illustrating the step performed after the step illustrated in FIGS. 94 and 95 in the same embodiment, each taken along the section line corresponding to the section line IV-IV.

Next, the insulating film PF1, for covering the control gate electrode CGE, the memory gate electrode MGE, and the like in the memory cell region MCR, is formed as illustrated in FIGS. 96 and 97. Next, the pattern of the exposed dummy gate electrode including the conductive film PS1 is removed in the peripheral circuit region PCR by performing an etching process using, as etching masks, the insulating film PF1, the interlayer insulating film ILF1, and the like. Further, the exposed insulating film CIF is removed. The surface of the well region PWR (semiconductor substrate SUB) is exposed by removing the insulating film CIF.

Next, after a silicon oxide film (not illustrated) is formed, as an interface layer, over the surface of the exposed well region PWR, the high dielectric constant film HKF (see FIG. 98) is formed. Next, the titanium nitride film TNF (see FIG. 98) is formed, as a metal film, over the high dielectric constant film HKF. Next, a conductive film (not illustrated) to serve as the gate electrode of the peripheral MIS transistor is formed over the titanium nitride film TNF in a manner in which the portion (trench), from which the pattern of the dummy gate electrode including the conductive film PS1 and the like are removed, is filled.

Figure 98:
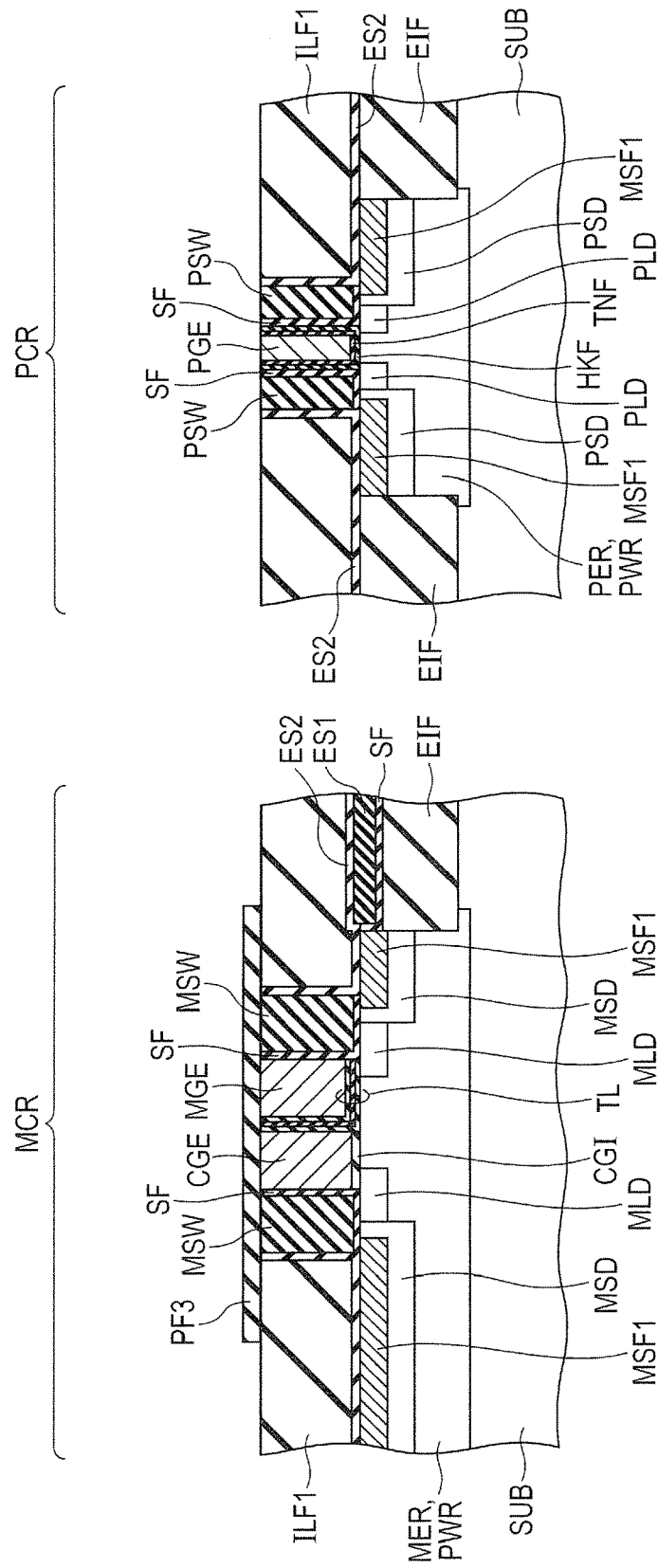
FIG. 98 is sectional views illustrating a step performed after the step illustrated in FIGS. 96 and 97 in the same embodiment, each taken along the section line corresponding to the section line III-III.
Figure 99:
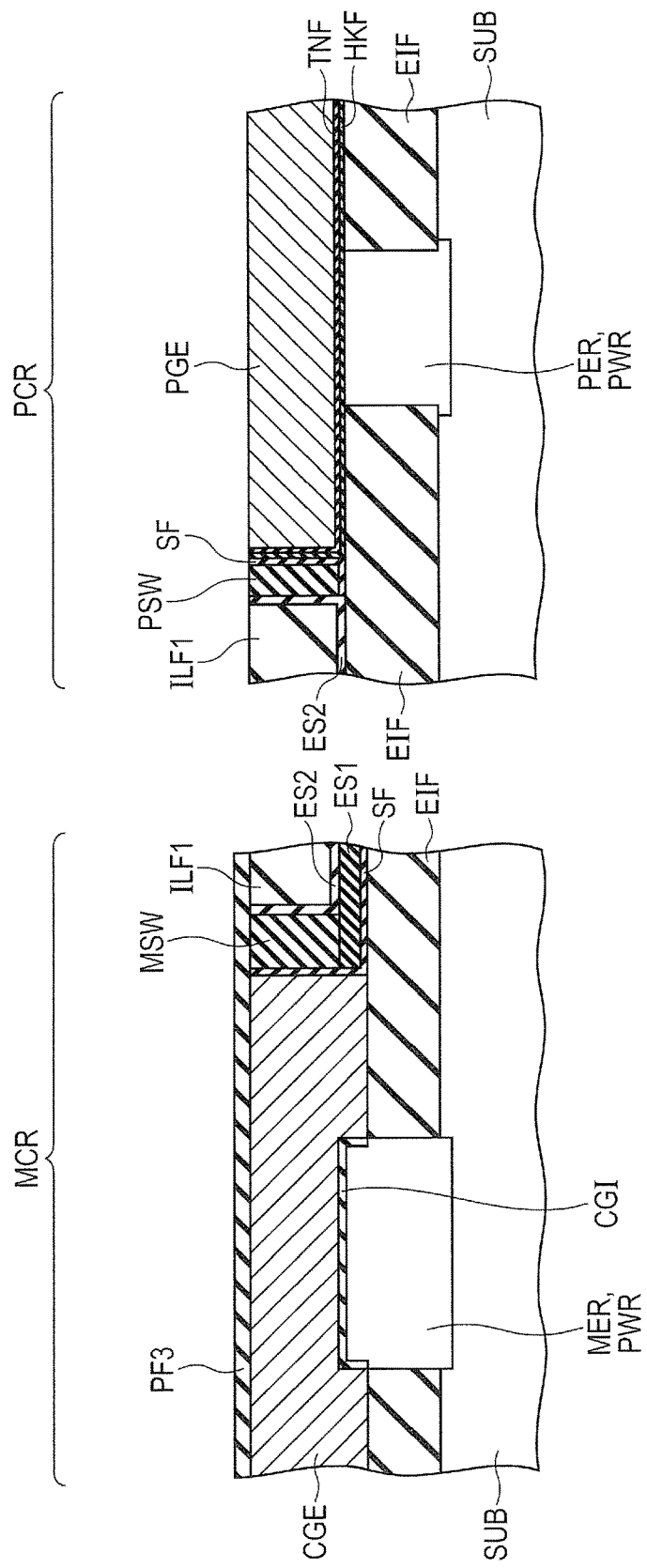
FIG. 99 is sectional views illustrating the step performed after the step illustrated in FIGS. 96 and 97 in the same embodiment, each taken along the section line corresponding to the section line IV-IV.

Next, the portion of the conductive film and the like located over the upper surface of the interlayer insulating film ILF1 are removed by performing a chemical mechanical polishing process, in which the portion of the conductive film, with which the portion from which the pattern of the dummy gate electrode including the conductive film PS1 and the like have been removed is filled, is left. Thereby, the gate electrode PGE of a low breakdown voltage MIS transistor as one of the peripheral MIS transistors PTR is formed in the peripheral circuit region PCR, as illustrated in FIGS. 98 and 99.

Figure 100:
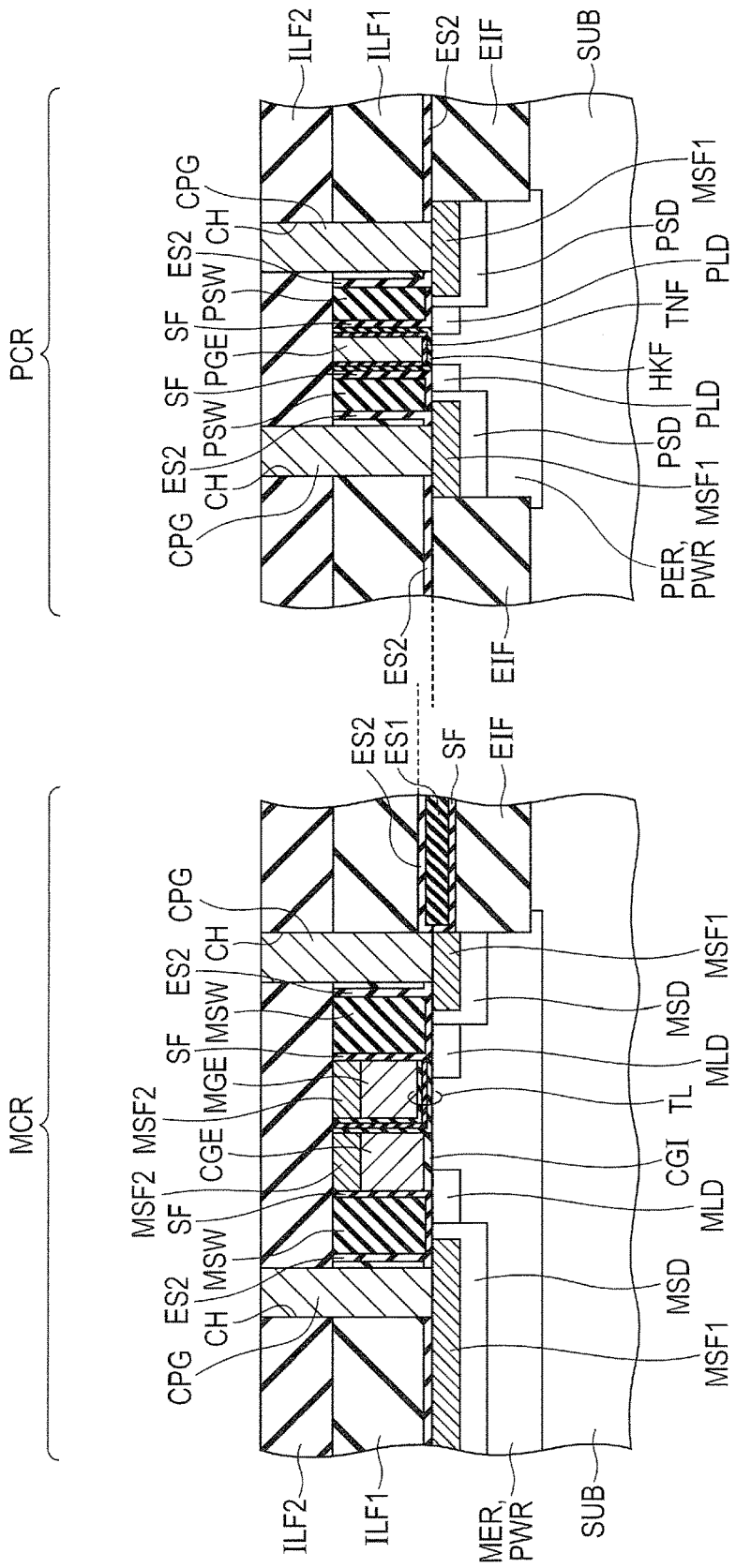
FIG. 100 is sectional views illustrating a step performed after the step illustrated in FIGS. 98 and 99 in the same embodiment, each taken along the section line corresponding to the section line III-III.
Figure 101:
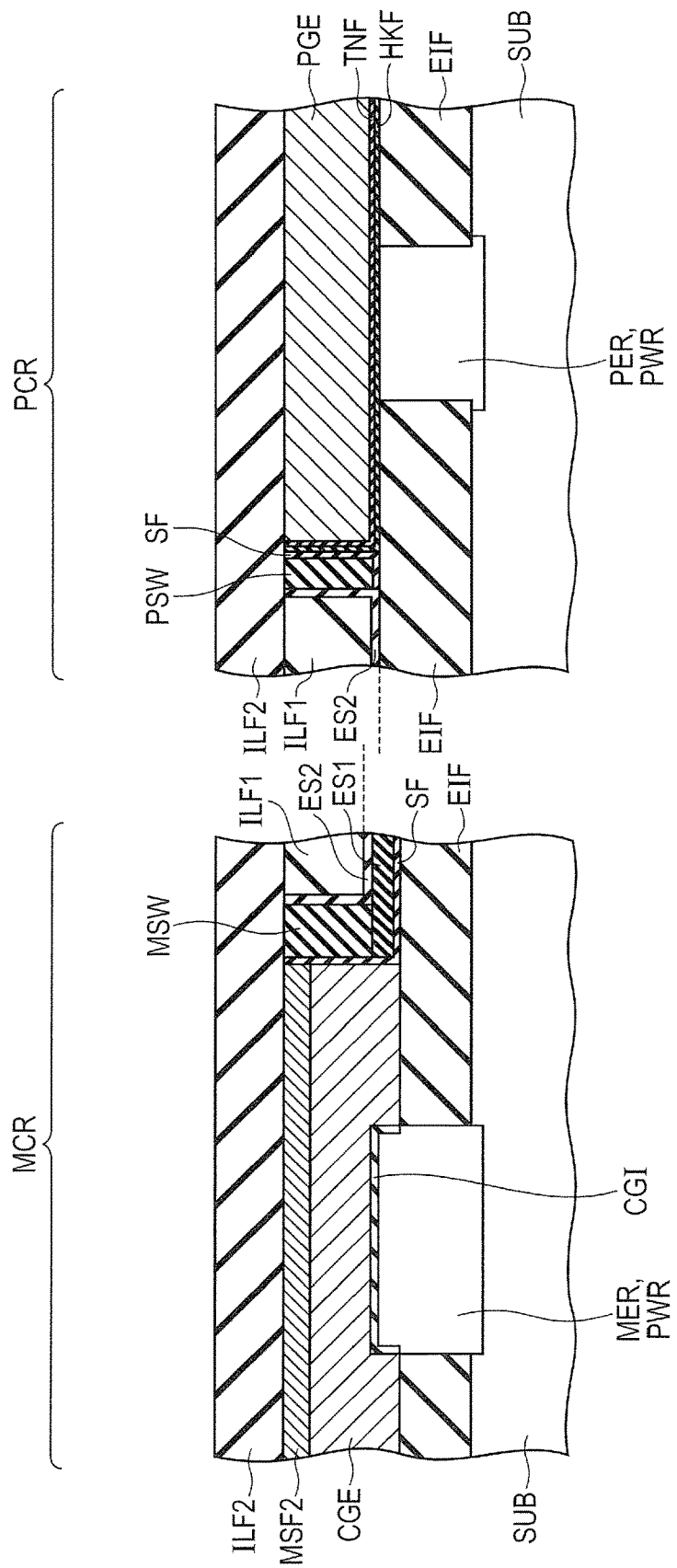
FIG. 101 is sectional views illustrating the step performed after the step illustrated in FIGS. 98 and 99 in the same embodiment, each taken along the section line corresponding to the section line IV-IV.

Next, through a step similar to that illustrated in FIGS. 52 and 53, the metal silicide layer MSF2 (see FIG. 100) is formed over each of the upper surface of the control gate electrode CGE and the upper surface of the memory gate electrode MGE. Next, the contact hole CH for exposing the N+ diffusion layer MSD is formed in the memory cell region MCR through a step similar to that illustrated in FIGS. 54 and 55. In the peripheral circuit region PCR, the contact hole CH for exposing the N+ diffusion layer PSD is formed (see FIG. 100). Next, the contact plug CPG is formed in the contact hole CH through steps similar to those illustrated in FIGS. 56 and 57, as illustrated in FIGS. 100 and 101. Next, the first layer wiring CIC is formed over the interlayer insulating film ILF2 through a step similar to that illustrated in FIGS. 57 and 58, whereby the main part of the semiconductor device illustrated in FIGS. 71 and 72 is completed.

In the above manufacturing method of a semiconductor device, the method of forming a dummy gate electrode, which is formed before the gate electrode PGE of the peripheral MIS transistor PTR arranged in the peripheral circuit region PCR is formed, is different from that in First Embodiment. On the other hand, the method of forming the memory cell transistor MCTR, including the method of forming the element isolation insulating film EIF defining the memory active region MER in the memory cell region MCR, is similar to that in the semiconductor device according to First Embodiment.

In the semiconductor device according to Second Embodiment, the buried silicon nitride film ES1 and the etching stopper film ES2 are formed over the element isolation insulating film EIF defining the memory active region MER, similarly to the above semiconductor device. The position of the upper surface of the etching stopper film ES2 is higher than that of the upper surface of the element isolation insulating film EIF defining the peripheral active region PER.

Thereby, when misalignment occurs in the photolithography process for forming the contact hole CH, etching of the portion where the element isolation insulating film EIF is located is suppressed by the etching stopper film ES2 and the buried silicon nitride film ES1, and hence the distance between the bottom of the contact hole CH and the well region PWR is secured (see FIGS. 68 and 69). Thereby, leakage of current flowing from the contact plug CPG formed in the contact hole CH to the well region PWR can be prevented (see FIG. 70).

In each of the above embodiments, a silicon oxide film is taken as an example of the interlayer insulating film (interlayer insulating films ILF1 and ILF2), and a silicon nitride film is taken as an example of the first (second) etching stopper film (buried silicon nitride film ES1, etching stopper film ES2). However, an insulating film formed of another material may be adopted, not being limited to a combination of a silicon oxide film and a silicon nitride film, as long as the another material has a selection ratio to the etching for forming a contact hole in the interlayer insulating film.

In addition, the case, where the memory cell transistor MCTR is formed as the first transistor in the memory cell region MCR taken as the first active region, has been described. The first transistor formed in the first active region should not be limited to the memory cell transistor MCTR, and a transistor requiring a gate width can also be adopted.

Various combinations of the semiconductor devices described in the respective embodiments can be made if necessary.

The invention made by the present inventors has been specifically described above based on preferred embodiments, but it is needless to say that the invention should not be limited to the preferred embodiments and various modifications may be made to the invention within a range not departing from the gist of the invention.

What is claimed is:

1. A semiconductor device comprising:
   a semiconductor substrate having a main surface;
   a first active region formed in the semiconductor substrate and defined by a first element isolation insulating film;

a second active region formed in the semiconductor substrate and defined by a second element isolation insulating film;
a first transistor formed in the first active region;
a second transistor formed in the second active region;
a first etching stopper film formed to cover the first element isolation insulating film;
a second etching stopper film formed to cover the second element isolation insulating film;
an interlayer insulating film formed to cover the first etching stopper film and the second etching stopper film;
a first plug formed to penetrate the interlayer insulating film to reach the first active region; and
a second plug formed to penetrate the interlayer insulating film to reach the second active region,
wherein the first element isolation insulating film has a first upper surface,
wherein the second element isolation insulating film has a second upper surface,
wherein the first etching stopper film has a third upper surface,
wherein the first upper surface is lower than the main surface,
wherein the second upper surface is higher than the first upper surface, and
wherein the third upper surface is higher than the second upper surface.

2. The semiconductor device according to claim 1,
wherein the first etching stopper film has:
a first film formed to cover the first upper surface of the first element isolation insulating film; and
a second film formed to cover the first film, and
wherein the second etching stopper film and the second film are formed of the same material and with the same thickness.

3. The semiconductor device according to claim 1,
wherein the first transistor includes a split gate type memory cell transistor.

4. The semiconductor device according to claim 3,
wherein the memory cell transistor includes a memory gate electrode formed, via a first silicon oxide film, a silicon nitride film, and a second silicon oxide film, over the first active region.

5. The semiconductor device according to claim 1,
wherein the first active region has:
a fourth upper surface corresponding to the main surface of the semiconductor substrate; and
a side surface extending from the fourth upper surface to the first upper surface of the first element isolation insulating film, and
wherein the first transistor includes a first gate electrode formed by interposing a first gate insulating film formed from the fourth upper surface to the side surface.

6. The semiconductor device according to claim 1,
wherein material of the first and second etching stopper films and material of the interlayer insulating film are different from each other.

7. The semiconductor device according to claim 6,
wherein each of the first and second etching stopper films includes a silicon nitride film, and
wherein the interlayer insulating film includes a silicon oxide film.

8. The semiconductor device according to claim 1,
wherein the second active region has a fifth upper surface corresponding to the main surface of the semiconductor substrate, and
wherein the second transistor includes a second gate electrode including a metal film formed by interposing, over the fifth upper surface, a second gate insulating film including a high dielectric constant insulating film.

9. A manufacturing method of a semiconductor device, comprising the steps of:
providing a semiconductor substrate having a main surface;
defining a first active region by forming, over the semiconductor substrate, a first element isolation insulating film having a first upper surface;
defining a second active region by forming, over the semiconductor substrate, a second element isolation insulating film having a second upper surface;
retracting the first upper surface of the first element isolation insulating film to a position lower than the main surface of the semiconductor substrate;
forming a first transistor in the first active region;
forming a second transistor in the second active region;
forming a first etching stopper film having a third upper surface, the position of which is higher than the second upper surface of the second element isolation insulating film, so as to cover the first element isolation insulating film;
forming a second etching stopper film so as to cover the second element isolation insulating film;
forming an interlayer insulating film so as to cover the first and second etching stopper films;
forming, in the interlayer insulating film, a first contact hole for exposing the first active region and a second contact hole for exposing the second active region; and
forming a first plug in the first contact hole and a second plug in the second contact hole.

10. The manufacturing method of a semiconductor device according to claim 9,
wherein the step of forming the first etching stopper film includes the steps of:
forming a first film so as to cover the first upper surface of the first element isolation insulating film; and
forming a second film so as to cover the first film, and
wherein the step of forming the second film and the step of forming the second etching stopper film are performed at the same time.

11. The manufacturing method of a semiconductor device according to claim 9,
wherein etching characteristics of each of the first and second etching stopper films and etching characteristics of the interlayer insulating film are different from each other when etching is performed under the same condition.

12. The manufacturing method of a semiconductor device according to claim 11,
wherein each of the step of forming the first etching stopper film and the step of forming the second etching stopper film includes the step of forming a silicon nitride film, and
wherein the step of forming the interlayer insulating film includes the step of forming a silicon oxide film.

* * * * *